United States Patent
Kakinuma

(10) Patent No.: US 12,009,019 B2
(45) Date of Patent: Jun. 11, 2024

(54) NON-VOLATILE ASSOCIATIVE MEMORY CELL, NON-VOLATILE ASSOCIATIVE MEMORY DEVICE, MONITORING METHOD, AND NON-VOLATILE MEMORY CELL

(71) Applicant: TDK CORPORATION, Tokyo (JP)

(72) Inventor: Yuji Kakinuma, Tokyo (JP)

(73) Assignee: TDK CORPORATION, Tokyo (JP)

( * ) Notice: Subject to any disclaimer, the term of this patent is extended or adjusted under 35 U.S.C. 154(b) by 539 days.

(21) Appl. No.: 17/358,872

(22) Filed: Jun. 25, 2021

(65) Prior Publication Data

US 2022/0037587 A1    Feb. 3, 2022

Related U.S. Application Data

(63) Continuation-in-part of application No. PCT/JP2019/011989, filed on Mar. 22, 2019.

(51) Int. Cl.
*G11C 11/16* (2006.01)
*G11C 15/04* (2006.01)

(52) U.S. Cl.
CPC ...... *G11C 11/1673* (2013.01); *G11C 11/1659* (2013.01); *G11C 11/1675* (2013.01); *G11C 15/046* (2013.01)

(58) Field of Classification Search
CPC ............ G11C 11/1673; G11C 11/1659; G11C 11/1675; G11C 15/046

(Continued)

(56) References Cited

U.S. PATENT DOCUMENTS 6,304,477 B1    10/2001 Naji
2008/0006890 A1*    1/2008 Haratani ................ H10N 50/10
                                                          257/E27.005

(Continued)

FOREIGN PATENT DOCUMENTS

JP    2004-525473 A    8/2004
JP    2012-089205 A    5/2012

(Continued)

OTHER PUBLICATIONS

May 21, 2010 International Search Report issued in International Patent Application No. PCT/JP2019/011989.

*Primary Examiner* — Connie C Yoha
(74) *Attorney, Agent, or Firm* — Oliff PLC

(57) ABSTRACT

A non-volatile associative memory cell includes: one magnetoresistance effect element including first and second ferromagnetic layers and a non-magnetic layer; first and second match lines connected to the magnetoresistance effect element in accordance with predetermined first and second search line voltages. The magnetoresistance effect element includes: first and second members. The first member includes first and second electrodes disposed at opposite ends. The first ferromagnetic layer is in the first or second member, the non-magnetic layer is stacked in the first direction, and the direction of internal magnetization of the first ferromagnetic layer changes in a case in which a current flows between the first and second electrodes. The non-magnetic and the second ferromagnetic layers are in the second member. A magnetoresistance effect element resistance value changes. An electric potential corresponding to an second ferromagnetic layer electric potential is applied to each of the first and second match lines.

10 Claims, 25 Drawing Sheets

(58) Field of Classification Search
USPC .......................................................... 365/158
See application file for complete search history.

(56) References Cited

U.S. PATENT DOCUMENTS

| | | |
|---|---|---|
| 2012/0250391 A1 | 10/2012 | Cambou |
| 2012/0290773 A1 | 11/2012 | Naccache |
| 2014/0071728 A1* | 3/2014 | Khalili Amiri ...... G11C 15/046 |
| | | 365/50 |
| 2017/0076769 A1 | 3/2017 | Shirotori et al. |
| 2019/0147929 A1 | 5/2019 | Sasaki et al. |

FOREIGN PATENT DOCUMENTS

| | | |
|---|---|---|
| JP | 2012-190530 A | 10/2012 |
| JP | 2012-209556 A | 10/2012 |
| JP | 2012-238312 A | 12/2012 |
| JP | 2013-200920 A | 10/2013 |
| JP | 2017-059594 A | 3/2017 |
| JP | 2018-067365 A | 4/2018 |
| WO | 2010/137573 A1 | 12/2010 |
| WO | 2017/208880 A1 | 12/2017 |

\* cited by examiner

FIG. 8

| CLK | | WBLB | STORAGE DATA | | SL | SLB | p_ML | n_ML |
|---|---|---|---|---|---|---|---|---|
| Digit | WAVEFORM | | Digit | RESISTANCE VALUE OF MAGNETORESISTANCE EFFECT ELEMENT | | | | |
| 0 | ⎍ | 0 | 0 | SECOND RESISTANCE VALUE | 1 | 0 | 0 | 0 |
| 0 | ⎍ | 0 | 1 | FIRST RESISTANCE VALUE | 1 | 0 | 1 | 0 |
| 0 | ⎍ | 0 | 0 | SECOND RESISTANCE VALUE | 0 | 1 | 1 | 0 |
| 0 | ⎍ | 0 | 1 | FIRST RESISTANCE VALUE | 0 | 1 | 1 | 1 |
| 1 | H/L | 0 | X | DON'T CARE | - | - | - | - |

FIG. 9

| WEN | | WBL | WBLB | STORAGE DATA | |
|---|---|---|---|---|---|
| Digit | WAVEFORM | | | Digit | RESISTANCE VALUE OF MAGNETORESISTANCE EFFECT ELEMENT |
| 1 | ⎍ | 1 | 0 | 0 | SECOND RESISTANCE VALUE |
| 1 | ⎍ | 0 | 1 | 1 | FIRST RESISTANCE VALUE |
| 1 | ⎍ | 0 | 0 | 0 | SECOND RESISTANCE VALUE |
| 1 | ⎍ | 1 | 1 | 1 | FIRST RESISTANCE VALUE |
| 0 | H/L | - | - | - | DON'T CARE |

FIG. 18

| RST | p-ML | | n-ML | | ML |
|---|---|---|---|---|---|
| | Digit | P-TYPE MATCH LINE VOLTAGE | Digit | N-TYPE MATCH LINE VOLTAGE | |
| 0 | 0 | LOW OUTPUT VOLTAGE | 0 | LOW OUTPUT VOLTAGE | 0 |
| 0 | 0 | LOW OUTPUT VOLTAGE | 1 | HIGH OUTPUT VOLTAGE | 0 |
| 0 | 1 | HIGH OUTPUT VOLTAGE | 0 | LOW OUTPUT VOLTAGE | 1 |
| 0 | 1 | HIGH OUTPUT VOLTAGE | 1 | HIGH OUTPUT VOLTAGE | 0 |
| 1 | 0 | LOW OUTPUT VOLTAGE | 0 | LOW OUTPUT VOLTAGE | 0 |
| 1 | 0 | LOW OUTPUT VOLTAGE | 1 | HIGH OUTPUT VOLTAGE | 0 |
| 1 | 1 | HIGH OUTPUT VOLTAGE | 0 | LOW OUTPUT VOLTAGE | 0 |
| 1 | 1 | HIGH OUTPUT VOLTAGE | 1 | HIGH OUTPUT VOLTAGE | 0 |

NON-VOLATILE ASSOCIATIVE MEMORY CELL, NON-VOLATILE ASSOCIATIVE MEMORY DEVICE, MONITORING METHOD, AND NON-VOLATILE MEMORY CELL

TECHNICAL FIELD

The present invention relates to a non-volatile associative memory cell, a non-volatile associative memory device, a monitoring method, and a non-volatile memory cell.

BACKGROUND ART

As non-volatile memories, associative memory devices including magnetoresistance effect elements (Content Addressable Memories (CAM)) have been researched and developed. In this specification, such associative memory device will be referred to as a non-volatile associative memory device in description. In addition, in this specification, electrical resistance will be simply referred to as resistance. In this specification, the magnitude of electrical resistance will be simply referred to as a resistance value in description.

Here, the magnetoresistance effect element has a resistance value that changes in accordance with a giant magnetoresistance effect, a tunnel magnetoresistance effect, or the like as a magnetoresistive resistance effect. More specifically, the magnetoresistance effect element includes two ferromagnetic layers stacked with a non-magnetic layer interposed therebetween. A resistance value of the magnetoresistance effect element changes in accordance with a change in a relative angle between the internal magnetization of the two ferromagnetic layers.

In a case in which a certain magnetoresistance effect element is included in an associative memory device as a non-volatile memory, the magnetoresistance effect element stores data representing a plurality of values in accordance with resistance values of the magnetoresistance effect element as storage data. For example, by associating a minimum value in a range in which the resistance value of the magnetoresistance effect element changes with data representing "0" and associating a maximum value in the range with data representing "1", the magnetoresistance effect element can store 1-bit data representing "0" or "1" as storage data.

In relation to such a non-volatile associative memory device, a non-volatile associative memory device including a spin transfer torque (STT) type magnetoresistance effect element using a spin transfer torque is known (see Patent Literatures 1 to 4).

CITATION LIST

Patent Literature

[Patent Literature 1]
Published Japanese Translation No. 2004-525473 of the PCT International Publication
[Patent Literature 2]
PCT International Publication No. WO2010/137573
[Patent Literature 3]
Japanese Unexamined Patent Application, First Publication No. 2012-190530
[Patent Literature 4]
Japanese Unexamined Patent Application, First Publication No. 2013-200920

SUMMARY OF INVENTION

Technical Problem

Here, in a spin transfer torque-type magnetoresistance effect element, every time when a resistance value of the magnetoresistance effect element is changed, it is necessary to cause a spin-polarized current to flow in a stacking direction in two ferromagnetic layers stacked with a non-magnetic layer interposed therebetween in the magnetoresistance effect element. In other words, in a non-volatile associative memory device including the magnetoresistance effect element, every time when 1-bit storage data stored in the magnetoresistance effect element is rewritten, it is necessary to cause a spin-polarized current to flow in the stacking direction in the two ferromagnetic layers. As a result, in the associative memory device, the life of the magnetoresistance effect element may be shortened. The stacking direction is a direction in which the two ferromagnetic layers are stacked.

Solution to Problem

According to one aspect of the present invention, there is provided a non-volatile associative memory cell including: one magnetoresistance effect element including a first ferromagnetic layer configured for a direction of internal magnetization to change, a second ferromagnetic layer configured for a direction of internal magnetization not to change, and a non-magnetic layer; a first match line electrically connected to the magnetoresistance effect element in accordance with a predetermined first search line voltage; and a second match line electrically connected to the magnetoresistance effect element in accordance with a predetermined second search line voltage, wherein the magnetoresistance effect element includes: a first member; and a second member of which at least a part is stacked in a first direction with respect to the first member, wherein the first member includes a first electrode disposed at one of two ends of the first member in a second direction that is orthogonal to the first direction and a second electrode disposed at an other of the two ends of the first member in the second direction, wherein the first ferromagnetic layer is provided in the first member or the second member, the non-magnetic layer is stacked in the first direction, and the direction of internal magnetization of the first ferromagnetic layer changes in a case in which a current flows between the first electrode and the second electrode in the first member, wherein the non-magnetic layer and the second ferromagnetic layer stacked in the first direction with respect to the non-magnetic layer are provided in the second member, wherein a resistance value of the magnetoresistance effect element changes in accordance with a change in a relative angle between the direction of internal magnetization of the first ferromagnetic layer and the direction of internal magnetization of the second ferromagnetic layer, and wherein an electric potential corresponding to an electric potential of the second ferromagnetic layer is applied to each of the first match line and the second match line.

Advantageous Effects of Invention

According to the present invention, the life of a magnetoresistance effect element can be inhibited from being shortened.

BRIEF DESCRIPTION OF DRAWINGS

FIG. 8 is a diagram illustrating an example of a truth table in the memory cell MS illustrated in FIG. 4.

FIG. 9 is a diagram illustrating another example of a truth table in the memory cell MS illustrated in FIG. 4.

FIG. 18 is a diagram illustrating an example of a truth table for an operation of comparing a first output voltage with a second output voltage in the circuit 110 and outputting a detection result signal.

DESCRIPTION OF EMBODIMENTS

Embodiment

Hereinafter, an embodiment of the present invention will be described with reference to the drawings. In this embodiment, a conductor transmitting an electrical signal will be referred to as a transmission line in description. For example, a transmission line may be a conductor printed on a substrate, a conducting wire such as a conductor formed in a linear shape, or the like. In this embodiment, a voltage represents an electric potential difference from a predetermined reference electric potential, and illustration and description of the reference electric potential will be omitted. Here, the reference electric potential may be any electric potential. Hereinafter, a case in which the reference electric potential is a ground electric potential will be described as an example.

<Configuration of Magnetoresistance Effect Element Used in Non-Volatile Associative Memory>

Figure 1:
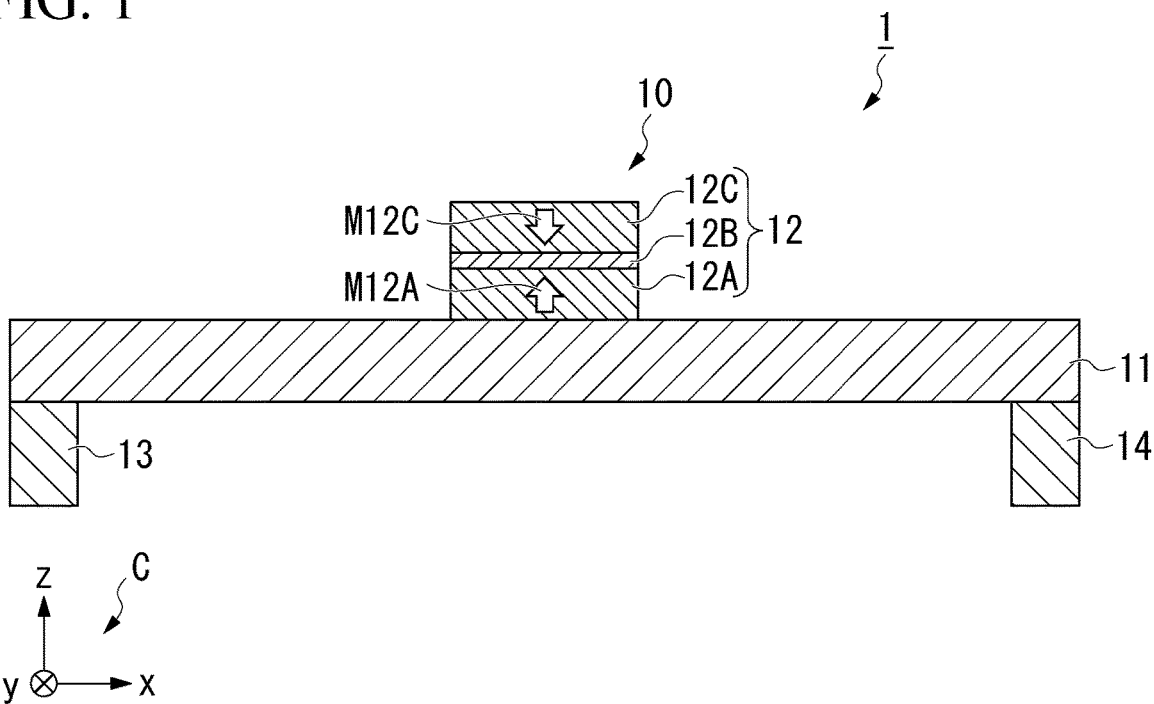
FIG. 1 is a diagram illustrating an example of the configuration of a magnetoresistance effect element 10.

First, the configuration of a magnetoresistance effect element 10 used in a non-volatile associative memory device 1 according to an embodiment will be described. FIG. 1 is a diagram illustrating an example of the configuration of the magnetoresistance effect element 10.

The magnetoresistance effect element 10 is an element of a three terminal type among elements of which a resistance value changes in accordance with a giant magnetoresistance effect, a tunnel magnetoresistance effect, or the like as a magnetoresistive resistance effect. In other words, for example, the magnetoresistance effect element 10 is a magnetoresistance effect element of a spin orbital torque type (SOT type) using a spin orbital torque (SOT), a magnetoresistance effect element of a magnetic domain wall movement type using movement of a magnetic domain wall inside a ferromagnetic layer, or the like. In this embodiment, a case in which the magnetoresistance effect element 10 is a magnetoresistance effect element of the spin orbital torque type will be described as an example.

The magnetoresistance effect element 10 includes a first member 11 and a second member 12 of which at least a part is stacked in a first direction with respect to the first member 11.

Here, the first direction may be any direction as long as it is a direction in which the second member 12 can be stacked with respect to the first member 11. Hereinafter, a case in which the first direction coincides with a positive direction of a Z axis in a three-dimensional orthogonal coordinate system C illustrated in FIG. 1 will be described as an example.

A current flows through the first member 11. The first member 11 extends in a second direction. The second direction is a direction that is orthogonal to the first direction. Hereinafter, a case in which the second direction coincides with a positive direction of an X axis in the three-dimensional orthogonal coordinate system C illustrated in FIG. 1 will be described as an example. Hereinafter, for the convenience of description, the X axis in the three-dimensional orthogonal coordinate system C will be simply referred to as the X axis in description. In addition, hereinafter, for the convenience of description, a Y axis in the three-dimensional orthogonal coordinate system C will be simply referred to as a Y axis in description. Hereinafter, for the convenience of description, a Z axis in the three-dimensional orthogonal coordinate system C will be simply referred to as a Z axis in description.

The first member 11 includes a first electrode 13 and a second electrode 14.

The first electrode 13 is disposed at a first end of the first member 11 in the second direction. The first end is one end among two ends of the first member 11 in the second direction. In the example illustrated in FIG. 1, the first end is an end on the negative-direction side of the X axis among the two ends. The first electrode 13 may be configured to be directly disposed at the first end or may be configured to be disposed at the first end with another material such as an insulator therebetween.

The second electrode 14 is disposed at a second end of the first member 11 in the second direction. The second end is the other end among two ends of the second member 12 in the second direction. In the example illustrated in FIG. 1, the second end is an end on the positive-direction side of the X axis among the two ends. The second electrode 14 may be configured to be directly disposed at the second end or may be configured to be disposed at the second end through another material such as an insulator.

The first member 11 contains a material generating a spin current in accordance with a spin Hall effect in a case in which a current flows between the first electrode 13 and the second electrode 14. The material may be any material as long as it is a material generating a spin current in the first member 11 in that case. A mechanism in which a spin current is generated in accordance with the spin Hall effect is a known mechanism, and thus description thereof will be omitted. In addition, the first member 11 may be configured to contain a material not generating a spin current in the first member 11 in the case in addition to a material generating a spin current in the first member 11 in that case.

Figure 2:
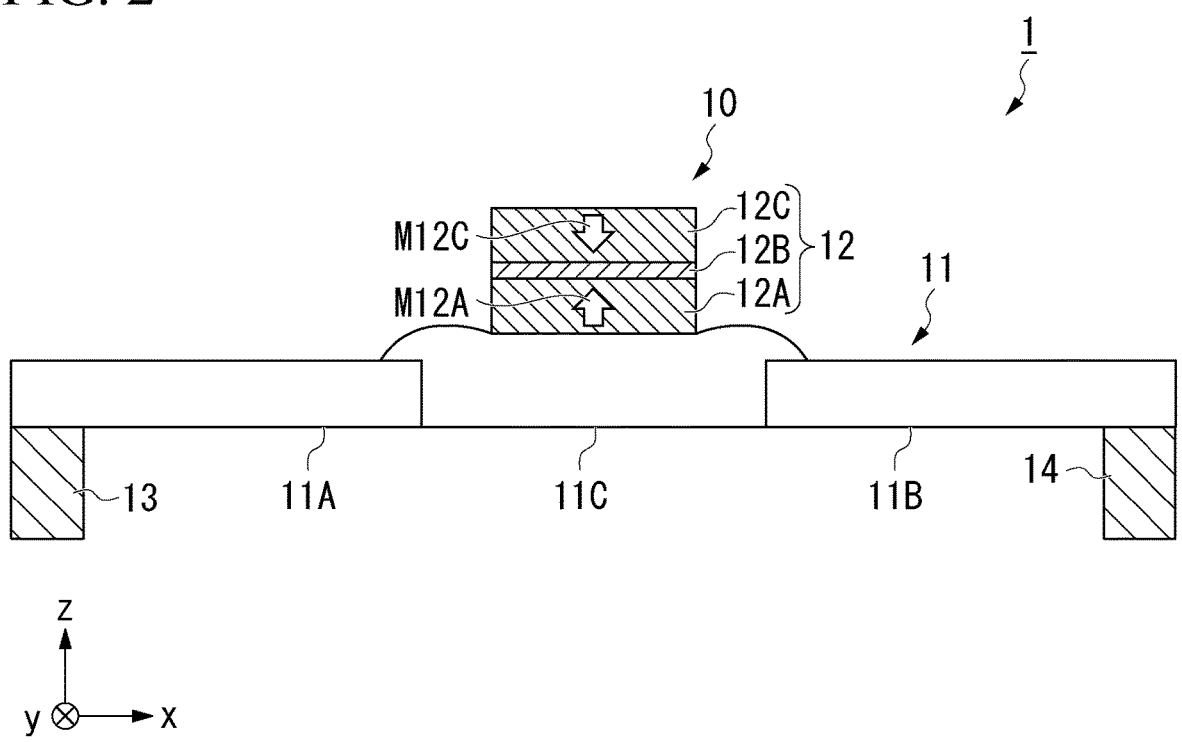
FIG. 2 is a diagram illustrating an example of the configuration of a first member 11 that is illustrated in more detail than that of the first member 11 illustrated in FIG. 1.

Here, FIG. 2 is a diagram illustrating an example of the configuration of the first member 11 that is illustrated in more detail than that of the first member 11 illustrated in FIG. 1.

In the example illustrated in FIG. 2, the first member 11 includes a first light metal layer 11A, a second light metal layer 11B, and a heavy metal layer 11C. In the example, in the first member 11, at least a part of the heavy metal layer 11C, the first light metal layer 11A, and the second light metal layer 11B are stacked in the second direction in order of the first light metal layer 11A, at least a part of the heavy metal layer 11C, and the second light metal layer 11B.

The first light metal layer 11A contains a material classified as a light metal among materials for which a spin current is generated in accordance with the spin Hall effect in a case in which a current flows between the first electrode 13 and the second electrode 14. For example, the material may be aluminum, copper, or the like. The first electrode 13 is disposed at an end on the negative-direction side of the X axis among ends of the first light metal layer 11A.

The second light metal layer 11B contains the same material as the material contained in the first light metal layer 11A. The second electrode 14 is disposed at an end of the positive-direction side of the X axis among ends of the second light metal layer 11B.

The heavy metal layer 11C contains a material classified as a heavy metal among materials generating a spin current in accordance with the spin Hall effect in a case in which a current flows between the first electrode 13 and the second electrode 14. For example, the material is tungsten or the like. In addition, the heavy metal layer 11C is disposed at an end on a side in a direction opposite to the first direction among ends of the second member 12. It is preferable that a resistance value of the heavy metal layer 11C be equal to or lower than 200 ohms. In accordance with this, compared to a case in which the resistance value of the heavy metal layer 11C is higher than 200 ohms, the magnetoresistance effect element 10 can cause electric charge collected in a parasitic capacitance to quickly flow to SINK or the ground in various circuits (for example, the non-volatile associative memory device 1, a memory cell MS to be described below, and the like) including the magnetoresistance effect element 10.

Description will be continued with reference back to FIG. 1. The second member 12 includes a first ferromagnetic layer 12A, a non-magnetic layer 12B, and a second ferromagnetic layer 12C. More specifically, in the second member 12, the first ferromagnetic layer 12A, the non-magnetic layer 12B, and the second ferromagnetic layer 12C are stacked in the first direction in order of the first ferromagnetic layer 12A, the non-magnetic layer 12B, and the second ferromagnetic layer 12C. In other words, in the second member 12, the second ferromagnetic layer 12C is stacked in the first direction with respect to the non-magnetic layer 12B. In addition, in the second member 12, the non-magnetic layer 12B is stacked in the first direction with respect to the first ferromagnetic layer 12A. In the second member 12, the first ferromagnetic layer 12A is stacked in the first direction with respect to the first member 11. In other words, in the second member 12, the first member 11 (more specifically, the heavy metal layer 11C) is disposed at an end on a side in a direction opposite to the first direction (in this embodiment, a negative direction of the Z axis) among ends of the first ferromagnetic layer 12A.

Here, a resistance value of the magnetoresistance effect element 10 changes in accordance with a change in a relative angle between a direction of internal magnetization M12A of the first ferromagnetic layer 12A and a direction of internal magnetization M12C of the second ferromagnetic layer 12C. In this embodiment, the resistance value of the magnetoresistance effect element 10 is a magnitude of the electrical resistance between the second ferromagnetic layer 12C and the second electrode 14.

In the magnetoresistance effect element 10, the direction of the magnetization M12C is fixed to a predetermined direction. In other words, the direction of the magnetization M12C does not change. For this reason, the second ferromagnetic layer 12C may be referred to as a fixed layer, a reference layer, and the like. For example, the second ferromagnetic layer 12C is a perpendicular magnetization film of which an axis of easy magnetization of the magnetization M12C may be aligned in a positive direction or a negative direction of the Z axis. Hereinafter, a case in which the direction of the magnetization M12C coincides with the negative direction will be described as an example. In addition, the second ferromagnetic layer 12C may be an in-plane magnetization film of which an axis of easy magnetization of the magnetization M12C is aligned in an XY in-plane direction in which the X axis and the Y axis extend. In addition, the direction of the magnetization M12C may be configured to be fixed in accordance with a retention force of the second ferromagnetic layer 12C being stronger than a retention force of the first ferromagnetic layer 12A, may be configured to be fixed in accordance with exchange coupling with an antiferromagnetic layer, or may be configured to be fixed using another method. The direction of the magnetization M12C may be configured to coincide with a direction other than the negative direction.

On the other hand, the direction of the magnetization M12A relatively changes with respect to the direction of the magnetization M12C. For this reason, the first ferromagnetic layer 12A may be referred to as a free layer, a recording layer, and the like. For example, the first ferromagnetic layer 12A is a perpendicular magnetization film of which an axis of easy magnetization of the magnetization M12A is aligned in the positive direction or the negative direction of the Z axis. FIG. 1 illustrates an appearance in which the direction of the magnetization M12A coincides with the positive direction of the Z axis as one example. The first ferromagnetic layer 1A may be an in-plane magnetization film of which an axis of easy magnetization of the magnetization M12A is aligned in an XY in-plane direction in which the X axis and the Y axis extend.

The configuration of the stacking structure of the second member 12 may be the configuration of a stacking structure of a known magnetoresistance effect element or may be the configuration of a stacking structure of a magnetoresistance effect element developed in the future. For example, each of the layers of the second member 12 (in other words, each of the first ferromagnetic layer 12A, the non-magnetic layer 12B, and the second ferromagnetic layer 12C) may be configured to be formed from a plurality of layers or may be configured to include another layer such as an antiferromagnetic layer used for fixing the direction of the magnetization M12C.

The first ferromagnetic layer 12A contains a ferromagnetic material. For example, as the ferromagnetic material contained in the first ferromagnetic layer 1A, a metal selected from a group including Cr, Mn, Co, Fe, Ni, and the like, an alloy containing one or more types of these metals, an alloy containing the metal and at least one or more types of elements such as B, C, and N, and the like may be used. More specifically, the ferromagnetic material is, for example, Co—Fe, Co—Fe—B, Ni—Fe, or the like. In a case in which the first ferromagnetic layer 12A is an in-plane magnetization film, for example, it is preferable that the ferromagnetic material be a Co—Ho alloy (CoHo2), an Sm—Fe alloy (SmFe12), or the like.

The ferromagnetic material contained in the first ferromagnetic layer 1A may be a Heusler alloy such as Co2FeSi. In such a case, a magnetoresistance effect is strongly exhibited in the second member 12. The Heusler alloy contains an intermetallic compound having a chemical composition of X2YZ. Here, "X" is a transition metal element from the Co, Fe, Ni, or Cu group or a noble metal in a periodic table. "Y" is a transition metal from the Mn, V, Cr, or Ti group or an element of type X. "Z" is a typical element from Groups III to V. For example, the Heusler alloy is Co2FeSi, Co2FeGe, Co2FeGa, Co2MnSi, Co2Mn1-aFeaAlbSi1-b, Co2FeGe1-cGac, or the like.

The second ferromagnetic layer 12C contains a ferromagnetic material. For example, as the ferromagnetic material contained in the second ferromagnetic layer 12C, a metal selected from a group including Cr, Mn, Co, Fe, Ni, and the like, an alloy containing one or more types of these metals, an alloy containing the metal and at least one or more types of elements such as B, C, and N, and the like may be used. More specifically, the ferromagnetic material is, for example, Co—Fe, Co—Fe—B, Ni—Fe, or the like. In a case in which the second ferromagnetic layer 12C is an in-plane magnetization film, for example, it is preferable that the ferromagnetic material be a Co—Ho alloy (CoHo2), an Sm—Fe alloy (SmFe12), or the like.

The ferromagnetic material contained in the second ferromagnetic layer 1C may be a Heusler alloy such as Co2FeSi. In such a case, a magnetoresistance effect is strongly exhibited in the second member 12. The Heusler alloy contains an intermetallic compound having a chemical composition of X2YZ. Here, "X" is a transition metal element of a Co, Fe, Ni, or Cu group or a noble metal in a periodic table. "Y" is a transition metal of a Mn, V, Cr, or Ti group or an element type of X. "Z" is a typical element of a III group to a V group. For example, the Heusler alloy is Co2FeSi, Co2FeGe, Co2FeGa, Co2MnSi, Co2Mn1-aFeaAlbSi1-b, Co2FeGe1-cGac, or the like.

The second ferromagnetic layer 12C may have a configuration in which a layer formed from an antiferromagnetic material such as IrMn or PtMn is stacked. By configuring the structure of the second ferromagnetic layer 12C to be a synthetic ferromagnetic coupling structure, the influence of a leakage magnetic field of the second ferromagnetic layer 12C on the first ferromagnetic layer 12A can be reduced.

A known material may be used for the non-magnetic layer 12B. For example, in a case in which the non-magnetic layer 12B is composed of an insulator (for example, the non-magnetic layer 12B is a tunnel barrier layer), Al2O3, SiO2, MgO, MgAl2O4, and the like may be used as the material of the non-magnetic layer 12B. As the material, a material acquired by substituting a part of Al, Si, or Mg included therein with Zn, Be, or the like can be used. MgO and MgAl2O4 are materials that can realize a coherent tunnel, and thus a spin can be efficiently injected therewith. In a case in which the non-magnetic layer 12B contains a metal, Cu, Au, Ag, or the like can be used as the material of the metal. In a case in which the non-magnetic layer 12B contains a semiconductor, Si, Ge, CuInSe2, CuGaSe2, Cu(In,Ga)Se2, or the like can be used as the material of the semiconductor.

In addition, the second member 12 may be configured to include another layer in addition to the three layers including the first ferromagnetic layer 12A, the non-magnetic layer 12B, and the second ferromagnetic layer 12C. For example, the second member 12 may be configured to include a base layer on a side opposite to the non-magnetic layer 12B among sides of the first ferromagnetic layer 12A in addition to the three layers. In such a case, it is preferable that the base layer, in other words, a layer disposed between the first member 11 and the first ferromagnetic layer 12A be a layer that does not scatter a spin propagated from the first member 11. For example, in a case in which the layer is composed of silver, copper, magnesium, aluminum, or the like, a spin spread length is equal to or longer than 100 nm, which is long, and it is difficult for a spin propagating from the first member 11 to be scattered. For this reason, it is preferable to use silver, copper, magnesium, aluminum, or the like for the base layer. In addition, it is preferable that a thickness of the base layer be equal to or smaller than a spin spread length of a substance composing the base layer. When the thickness of the base layer is equal to or smaller than the spin spread length, a spin propagating from the first member 11 is sufficiently transmitted to the first ferromagnetic layer 12A.

Figure 3:
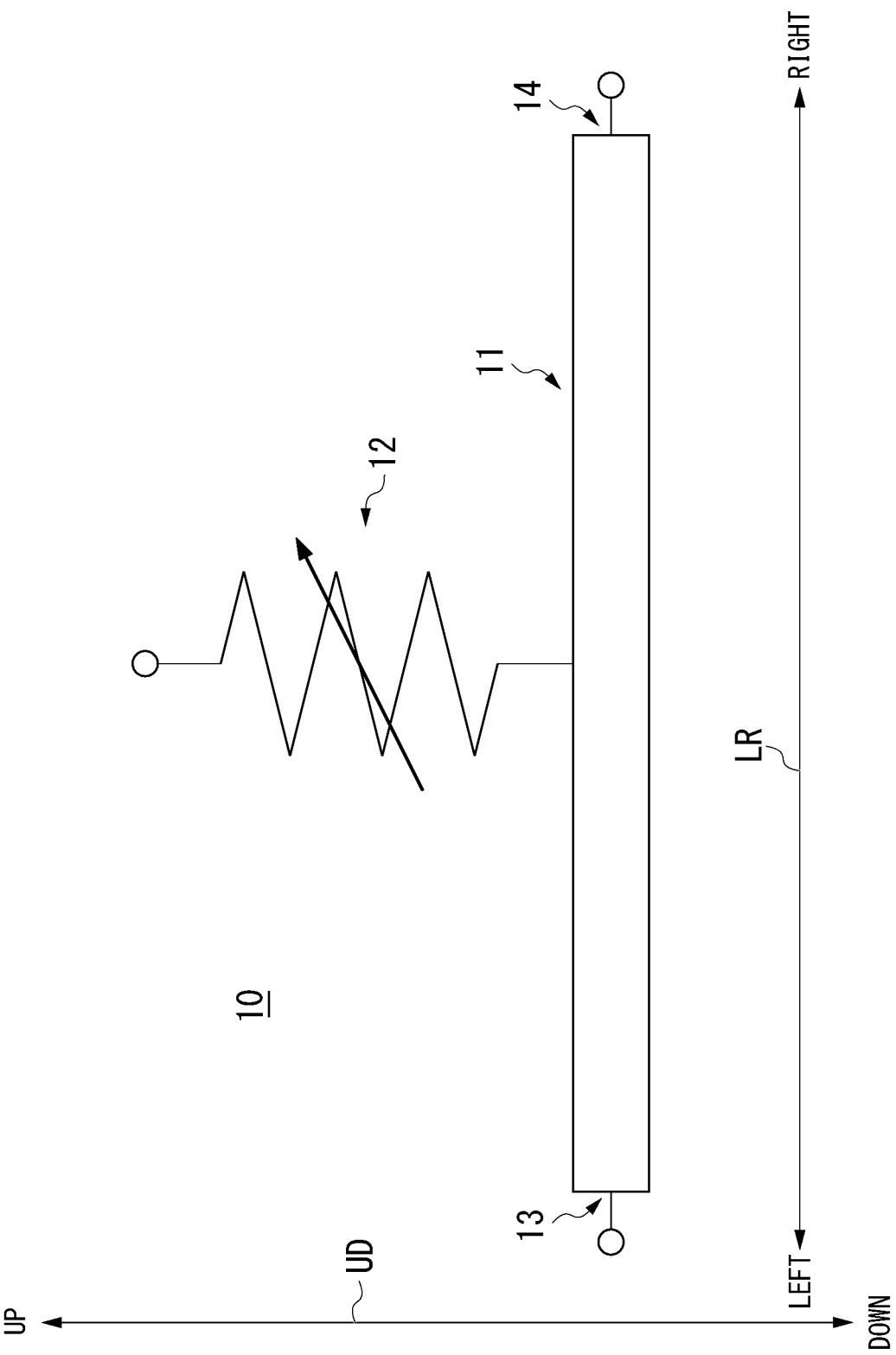
FIG. 3 is a diagram illustrating an example of a circuit notation of the magnetoresistance effect element 10.

Here, FIG. 3 is a diagram illustrating an example of a circuit notation of the magnetoresistance effect element 10. Arrows UD illustrated in FIG. 3 represent upward/downward directions in FIG. 3. In addition, arrows LR illustrated in FIG. 3 represent leftward/rightward directions in FIG. 3.

In the circuit notation represented in FIG. 3, in the magnetoresistance effect element 10, an upper side of a second member 12 is a second ferromagnetic layer 12C, and a lower side of the second member 12 is a first ferromagnetic layer 12A. In addition, in the circuit notation, in the magnetoresistance effect element 10, a left side of a first member 11 is a first electrode 13 included in the first member 11, and a right side of the first member 11 is a second electrode 14 included in the first member 11. In a case in which a current flows between the first electrode 13 and the second electrode 14, the direction of the magnetization M12A described above changes, and a relative angle between the direction of the magnetization M12C and the direction of the magnetization M12A changes. As a result, in that case, a resistance value of the magnetoresistance effect element 10 changes.

<Configuration of Memory Cell Included in Non-Volatile Associative Memory>

The magnetoresistance effect element 10 described above is included in a memory cell MS described below. By including such a memory cell MS, the non-volatile associative memory device 1 includes the magnetoresistance effect element 10. Thus, hereinafter, the configuration of the memory cell MS included in the non-volatile associative memory device 1 according to an embodiment will be described.

The memory cell MS includes one magnetoresistance effect element 10 as a non-volatile memory. In other words, the memory cell MS is a non-volatile associative memory cell. The memory cell MS stores one-bit data indicating "0" or "1" in accordance with the resistance value of the magnetoresistance effect element 10 as storage data. More specifically, for example, a memory cell MS that stores storage data indicating "1" is a memory cell MS in a case in which the resistance value is a predetermined first resistance value. In addition, for example, a memory cell MS that stores storage data indicating "0" is a memory cell MS in a case in which the resistance value is a predetermined second resistance value. The first resistance value and the second resistance value may be any resistance values as long as they are different resistance values. In this embodiment, a case in which the first resistance value is a resistance value higher than the second resistance value will be described as an example.

The memory cell MS compares a search data input to the memory cell MS from the outside (for example, another circuit such as a certain decoder or the like) with one-bit storage data stored in the memory cell MS. Here, the search data is one-bit data indicating "0" or "1". In accordance with this comparison, the memory cell MS outputs a voltage indicating whether or not the search data and the storage data coincide with each other as an output voltage.

In addition, the memory cell MS outputs such an output voltage as a combination of two voltages including a first output voltage and a second output voltage. The memory cell MS outputs the first output voltage from an output end of a first match line p-ML to be described below. In addition, the memory cell MS outputs the second output voltage from an output end of a second match line n-ML to be described below.

Here, each of the first output voltage and the second output voltage is an analog voltage that is equal to or lower than a predetermined first H voltage and is equal to or higher than a predetermined first L voltage. Here, each of the first output voltage and the second output voltage is one of a high output voltage that is equal to or higher than a certain threshold and is equal to or lower than the first H voltage and a low output voltage that is a voltage lower than the threshold and is equal to or higher than the first L voltage. A specific value of each of the first output voltage and the second output voltage is determined in accordance with the circuit configuration of the memory cell MS. For this reason, here, representing each of the first output voltage and the second output voltage with specific values will be avoided. As will be described below, the first H voltage is a voltage that is applied to an input end of the first match line p-ML. For this reason, for example, the first H voltage is a voltage that is almost the same as the first output voltage or a voltage that is slightly higher than the first output voltage. The first L voltage is a voltage that is applied to an input end of the second match line n-ML. For this reason, for example, the first L voltage is a voltage that is almost the same as the second output voltage or a voltage that is slightly lower than the second output voltage. For example, the first H voltage and the first L voltage are adjusted to appropriate levels in accordance with the circuit configuration of the memory cell MS through trial-and-error according to experiments, a simulation, or the like. The threshold is a value determined by a designer of the memory cell MS and may be any value as long as it can cause an appropriate operation of the memory cell MS described below.

A predetermined voltage is input to the memory cell MS from a first search line to be described below as the search data described above. For example, a predetermined second L voltage is input to the memory cell MS from the first search line as search data indicating "0". On the other hand, for example, a predetermined second H voltage is input to the memory cell MS from the first search line as search data indicating "1". The second H voltage is a voltage higher than the second L voltage and, for example, is 3.3 volts. The second H voltage may be a voltage that is lower than 3.3 volts by about 0.5 volts. The second L voltage is a voltage lower than the second H voltage and, for example, is 0 volts. The second L voltage may be a voltage that is higher than 0 volts by about 0.5 volts.

Figure 4:
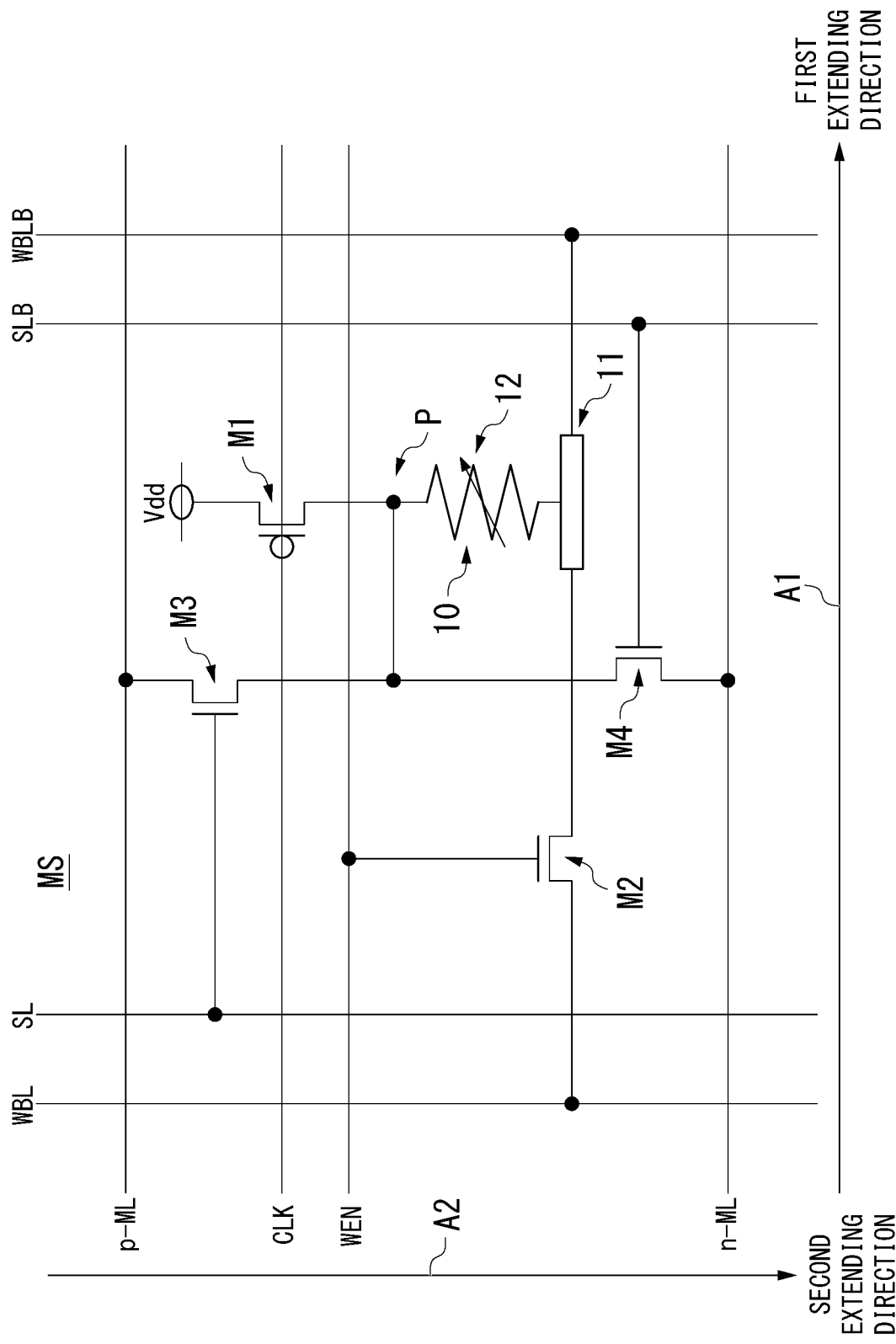
FIG. 4 is a diagram illustrating an example of the circuit configuration of a memory cell MS.

FIG. 4 is a diagram illustrating an example of the circuit configuration of such a memory cell MS. An arrow A1 illustrated in FIG. 4 represents a predetermined first extending direction among directions in FIG. 4. An arrow A2 illustrated in FIG. 4 represents a predetermined second extending direction among the directions in FIG. 4. The first extending direction and the second extending direction may be any directions as long as they are directions that are orthogonal to each other.

The memory cell MS includes a first match line p-ML, a second match line n-ML, a write enable line WEN, and a clock line CLK as four transmission lines extending in the first extending direction.

The first match line p-ML is a transmission line that extends in the first extending direction. A first H voltage is applied to an input end of the first match line p-ML from the outside. In other words, the first match line p-ML is pre-charged with the first H voltage from the outside. Hereinafter, a case in which the first H voltage is 3.3 volts will be described. The first H voltage may be either a voltage lower than 3.3 volts or a voltage higher than 3.3 volts as long as it is a voltage higher than the first L voltage. Here, in FIG. 4, the input end of the first match line p-ML is represented by an end on a side in a direction opposite to the first extending direction among two ends of the first match line p-ML illustrated in FIG. 4. In addition, in FIG. 4, the output end of the first match line p-ML is represented by an end on a side in the first extending direction among the two ends of the first match line p-ML.

The second match line n-ML is a transmission line that extends in the first extending direction. A first L voltage is applied to an input end of the second match line n-ML from the outside. In other words, the second match line n-ML is pre-charged with the first L voltage from the outside. Hereinafter, a case in which the first L voltage is 0 volts will be described. The first L voltage may be a voltage higher than 0 volts as long as it is a voltage lower than the first H voltage. Here, in FIG. 4, the input end of the second match line n-ML is represented by an end on a side in a direction opposite to the first extending direction among two ends of the second match line n-ML illustrated in FIG. 4. In addition, in FIG. 4, the output end of the second match line n-ML is represented by an end on a side in the first extending direction among the two ends of the second match line n-ML.

The write enable line WEN is s transmission line that extends in the first extending direction. A write signal is input to the write enable line WEN. More specifically, a predetermined third L voltage is applied to the write enable line WEN from the outside until a write signal is input from the outside. In other words, the write enable line WEN is pre-charged with the third L voltage from the outside until a write signal is input from the outside. Then, a pulse signal of a predetermined third H voltage is input to the write enable line WEN from the outside as a write signal in accordance with a timing at which storage data is written into the magnetoresistance effect element 10. Here, a write signal is a signal that causes the memory cell MS to write storage data into the magnetoresistance effect element 10. After the write signal is input, the predetermined third L voltage is applied again to the write enable line WEN from the outside until a next write signal is input. The third H voltage is a voltage higher than the third L voltage and is, for example, 3.3 volts. The third H voltage may be a voltage lower than 3.3 volts by about 0.5 volts. The third L voltage is a voltage lower than the third H voltage and is, for example, 0 volts. The third L voltage may be a voltage higher than 0 volts by about 0.5 volts.

The clock line CLK is a transmission line that extends in the first extending direction. A clock signal is input to the clock line CLK. More specifically, a predetermined fourth H voltage is applied to the clock line CLK from the outside until the clock signal is input from the outside. In other words, the clock line CLK is pre-charged with the fourth H voltage from the outside until the clock signal is input from the outside. Then, a pulse signal of a predetermined fourth L voltage is input to the clock line CLK from the outside as the clock signal in accordance with a timing at which storage data is read into the magnetoresistance effect element 10. After the clock signal is input, the predetermined fourth H voltage is applied again to the clock line CLK from the outside until a next clock signal is input. The fourth H voltage is a voltage higher than the fourth L voltage and is, for example, is 3.3 volts. The fourth H voltage may be a voltage that is lower than 3.3 volts by about 0.5 volts. The fourth L voltage is a voltage that is lower than the fourth H voltage and is, for example, 0 volts. The fourth L voltage may be a voltage that is higher than 0 volts by about 0.5 volts.

In addition, the memory cell MS includes a first write bit line WBL, a second write bit line WBLB, a first search line SL, and a second search line SLB as four transmission lines extending in the second extending direction.

The first write bit line WBL is a transmission line that extends in the second extending direction. In a case in which a state of the memory cell MS is a writing state and in a case in which storage data indicating "1" is written into the magnetoresistance effect element 10, a predetermined fifth H voltage is applied to the first write bit line WBL from the outside. On the other hand, in a case in which the state of the memory cell MS is a writing state and in a case in which storage data indicating "0" is written into the magnetoresistance effect element 10, a predetermined fifth L voltage is applied to the first write bit line WBL from the outside. The fifth H voltage is a voltage higher than the fifth L voltage and is, for example, 3.3 volts. The fifth H voltage may be a voltage that is lower than 3.3 by about 0.5 volts. The fifth L voltage is a voltage lower than the fifth H voltage and is, for example, 0 volts. The fifth L voltage may be a voltage that is higher than 0 volts by about 0.5 volts.

Here, the writing state is a state in which an operation of changing storage data stored in the magnetoresistance effect element 10 from "0" to "1" or "1" to "0" is performed by changing the resistance value of the magnetoresistance effect element 10 among states of the memory cell MS. In other words, the memory cell MS performs the operation within a period in which the state of the memory cell MS is the writing state in response to a request from the outside. Hereinafter, for the convenience of description, the operation will be referred to as a write operation in description.

The second write bit line WBLB is a transmission line that extends in the second extending direction. In a case in which the state of the memory cell MS is the writing state, a voltage among the fifth H voltage and the fifth L voltage that is not applied to the first write bit line WBL is applied to the second write bit line WBLB from the outside. In other words, in a case in which the state of the memory cell MS is the writing state and in a case in which the fifth H voltage is applied to the first write bit line WBL, the fifth L voltage is applied to the second write bit line WBLB from the outside. On the other hand, in a case in which the state of the memory cell MS is the writing state and in a case in which the fifth L voltage is applied to the first write bit line WBL, the fifth H voltage is applied to the second write bit line WBLB from the outside.

The first search line SL is a transmission line that extends in the second extending direction. In a case in which the state of the memory cell MS is a comparison calculation state, a predetermined sixth L voltage or a predetermined sixth H voltage is applied to the first search line SL from the outside. More specifically, in a case in which the state of the memory cell MS is the comparison calculation state and in a case in which search data indicating "1" is input to the memory cell MS, the sixth H voltage is applied to the first search line SL from the outside. On the other hand, in a case in which the state of the memory cell MS is the comparison calculation state and in a case in which search data indicating "0" is input to the memory cell MS, the sixth L voltage is applied to the first search line SL from the outside. The sixth H voltage is a voltage higher than the sixth L voltage and is, for example, 3.3 volts. The sixth H voltage may be a voltage that is lower than 3.3 volts by about 0.5 volts. The sixth L voltage is a voltage lower than the sixth H voltage and is, for example, 0 volts. The sixth L voltage may be a voltage that is higher than 0 volts by about 0.5 volts. The sixth H voltage is an example of a first search line voltage. In addition, the sixth L voltage is an example of a second search line voltage.

Here, the comparison calculation state is a state in which an operation of comparing search data input to the first search line SL with storage data stored in the magnetoresistance effect element 10 and outputting an output voltage indicating a result of the comparison to the outside is performed among states of the memory cell MS. The memory cell MS performs the operation within a period in which the state of the memory cell MS is the comparison calculation state in response to a request from the outside. Hereinafter, for the convenience of description, the operation will be referred to as a comparison calculation operation in description.

The second search line SLB is a transmission line that extends in the second extending direction. In a case in which the state of the memory cell MS is the comparison calculation state, a voltage among the sixth H voltage and the sixth L voltage that is not applied to the first search line SL is applied to the second search line SLB from the outside. In other words, in a case in which the state of the memory cell MS is the comparison calculation state and in a case in which the sixth H voltage is applied to the first search line SL, the sixth L voltage is applied to the second search line SLB from the outside. On the other hand, in a case in which the state of the memory cell MS is the comparison calculation state and in a case in which the sixth L voltage is applied to the first search line SL, the sixth H voltage is applied to the second search line SLB from the outside.

The memory cell MS includes four field effect transistors including a first field effect transistor M1 to a fourth field effect transistor M4.

The first field effect transistor M1 is a P-MOS (Metal Oxide Semiconductor) field effect transistor. The first field effect transistor M1 performs switching between the second ferromagnetic layer 12C of the magnetoresistance effect element 10 and a power supply that applies a predetermined power supply voltage Vdd to the second ferromagnetic layer 12C. A gate terminal of the first field effect transistor M1 is connected to the clock line CLK through a transmission line. A drain terminal of the first field effect transistor M1 is connected to the power supply through a transmission line. A source terminal of the first field effect transistor M1 is connected to the second ferromagnetic layer 12C through a transmission line. Here, for example, the power supply voltage is 3.3 volts. The power supply voltage may be either a voltage lower than 3.3 volts or a voltage higher than 3.3 volts. In addition, the memory cell MS may be configured to include another switching element such as a transistor of another type in place of the first field effect transistor M1.

The second field effect transistor M2 is an N-MOS field effect transistor. The second field effect transistor M2 performs switching between the first electrode 13 of the magnetoresistance effect element 10 and the first write bit line WBL. A gate terminal of the second field effect transistor M2 is connected to the write enable line WEN through a transmission line. A drain terminal of the second field effect transistor M2 is connected to the first write bit line WBL through a transmission line. In FIG. 4, a connection point between a transmission line connecting the drain terminal and the first write bit line WBL and the first write bit line WBL is denoted by a connection point P. A source terminal of the second field effect transistor M2 is connected to the first electrode 13 through a transmission line. The second electrode 14 of the magnetoresistance effect element 10 is connected to the second write bit line WBLB through a transmission line. In addition, the memory cell MS may be configured to include another switching element such as a transistor of another type in place of the second field effect transistor M2.

The third field effect transistor M3 is an N-MOS field effect transistor. The third field effect transistor M3 performs switching between the second ferromagnetic layer 12C of the magnetoresistance effect element 10 and the first match line p-ML. A gate terminal of the third field effect transistor M3 is connected to the first search line SL through a transmission line. A drain terminal of the third field effect transistor M3 is connected to the first match line p-ML through a transmission line. A source terminal of the third field effect transistor M3 is connected to the second ferromagnetic layer 12C through a transmission line. In addition, the memory cell MS may be configured to include another switching element such as a transistor of another type in place of the third field effect transistor M3.

The fourth field effect transistor M4 is an N-MOS field effect transistor. The fourth field effect transistor M4 performs switching between the second ferromagnetic layer 12C of the magnetoresistance effect element 10 and the second match line n-ML. A gate terminal of the fourth field effect transistor M4 is connected to the second search line SLB through a transmission line. A drain terminal of the fourth field effect transistor M4 is connected to the second match line n-ML through a transmission line. A source terminal of the fourth field effect transistor M4 is connected to the second ferromagnetic layer 12C through a transmission line. In addition, the memory cell MS may be configured to include another switching element such as a transistor of another type in place of the fourth field effect transistor M4.

In the example illustrated in FIG. 4, the source terminal of the third field effect transistor M3 and the source terminal of the fourth field effect transistor M4 are connected through a transmission line. In addition, in the example, the transmission line connecting these two source terminals is connected to a transmission line connecting the source terminal of the first field effect transistor M1 and the second ferromagnetic layer 12C through another transmission line. In FIG. 4, a connection point between the transmission line and the other transmission line is denoted by a connection point P.

Hereinafter, for the convenience of description, a state in which a current flows between a source terminal of a certain field effect transistor and a drain terminal of the field effect transistor will be referred to as an on state of the field effect transistor in description. In addition, hereinafter, for the convenience of description, a state in which a current does not flow between the source terminal of the field effect transistor and the drain terminal of the field effect transistor will be referred to as an off state of the field effect transistor in description.

As described above, in this embodiment, the first H voltage to the sixth H voltage are the same voltages. Thus, hereinafter, for the convenience of description, each of the first H voltage to the sixth H voltage will be collectively referred to as an H voltage. In addition, in this embodiment, the first L voltage to the sixth L voltage are the same voltages. Thus, hereinafter, for the convenience of description, each of the first L voltage to the sixth L voltage will be collectively referred to as an L voltage.

Here, three circuits including a write circuit WC, a read circuit RC, and a comparison calculation circuit CC are configured in the memory cell MS having the circuit configuration illustrated in FIG. 4. In other words, the three circuits are included in the memory cell MS.

Figure 5:
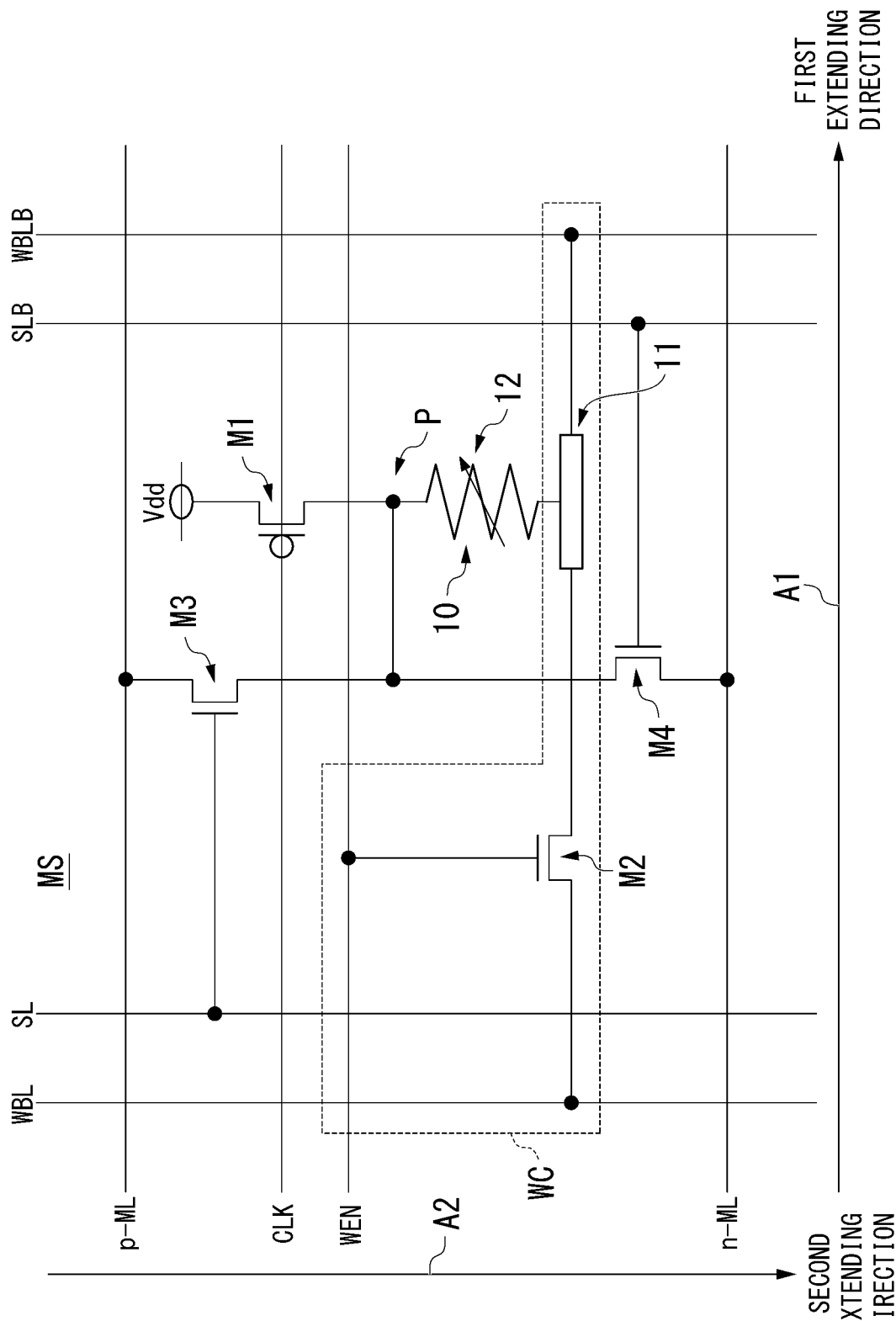
FIG. 5 is a diagram illustrating an example of a write circuit WC disposed inside the memory cell MS illustrated in FIG. 4.

FIG. 5 is a diagram illustrating an example of the write circuit WC disposed inside the memory cell MS illustrated in FIG. 4. The write circuit WC is composed of the first write bit line WBL, the second field effect transistor M2, the first member 11 of the magnetoresistance effect element 10, and the second write bit line WBLB. In the write circuit WC disposed inside the memory cell MS, the first write bit line WBL, the second field effect transistor M2, the first member 11 of the magnetoresistance effect element 10, and the second write bit line WBLB are connected in series.

Here, an operation of the write circuit WC will be described. In a case in which one-bit storage data indicating "0" or "1" is written into the magnetoresistance effect element 10, the state of the memory cell MS needs to be changed to the writing state. In the memory cell MS that is in the writing state, an H voltage is applied to the clock line CLK from the outside, and the state of the first field effect transistor M1 comes into the off state. In addition, in the memory cell MS, a write signal is input to the write enable line WEN from the outside, and the state of the second field effect transistor M2 comes into the on state.

For this reason, in the memory cell MS that is in the writing state, a current corresponding to a voltage difference between the first write bit line WBL and the second write bit line WBLB flows between the first electrode 13 and the second electrode 14 of the first member 11 of the magnetoresistance effect element 10. For example, in the memory cell MS, in a case in which the H voltage is applied to the first write bit line WBL, the L voltage is applied to the second write bit line WBLB, and a current flows from the first electrode 13 to the second electrode 14 in the first member 11. On the other hand, for example, in the memory cell MS, in a case in which the L voltage is applied to the first write bit line WBL, the H voltage is applied to the second write bit line WBLB, and a current flows from the second electrode 14 to the first electrode 13 in the first member 11. In a case in which a current flows between the first electrode 13 and the second electrode 14, as described above, the resistance value of the second member 12 of the magnetoresistance effect element 10 changes in accordance with the flowing current. In other words, in the memory cell MS, the resistance value of the magnetoresistance effect element 10 (in other words, storage data stored in the memory cell MS) is rewritten in accordance with voltages applied to the first write bit line WBL and the second write bit line WBLB.

In accordance with the operation as above, the write circuit WC rewrites storage data stored in the memory cell MS that is in the writing state in response to a request from the outside.

Figure 6:
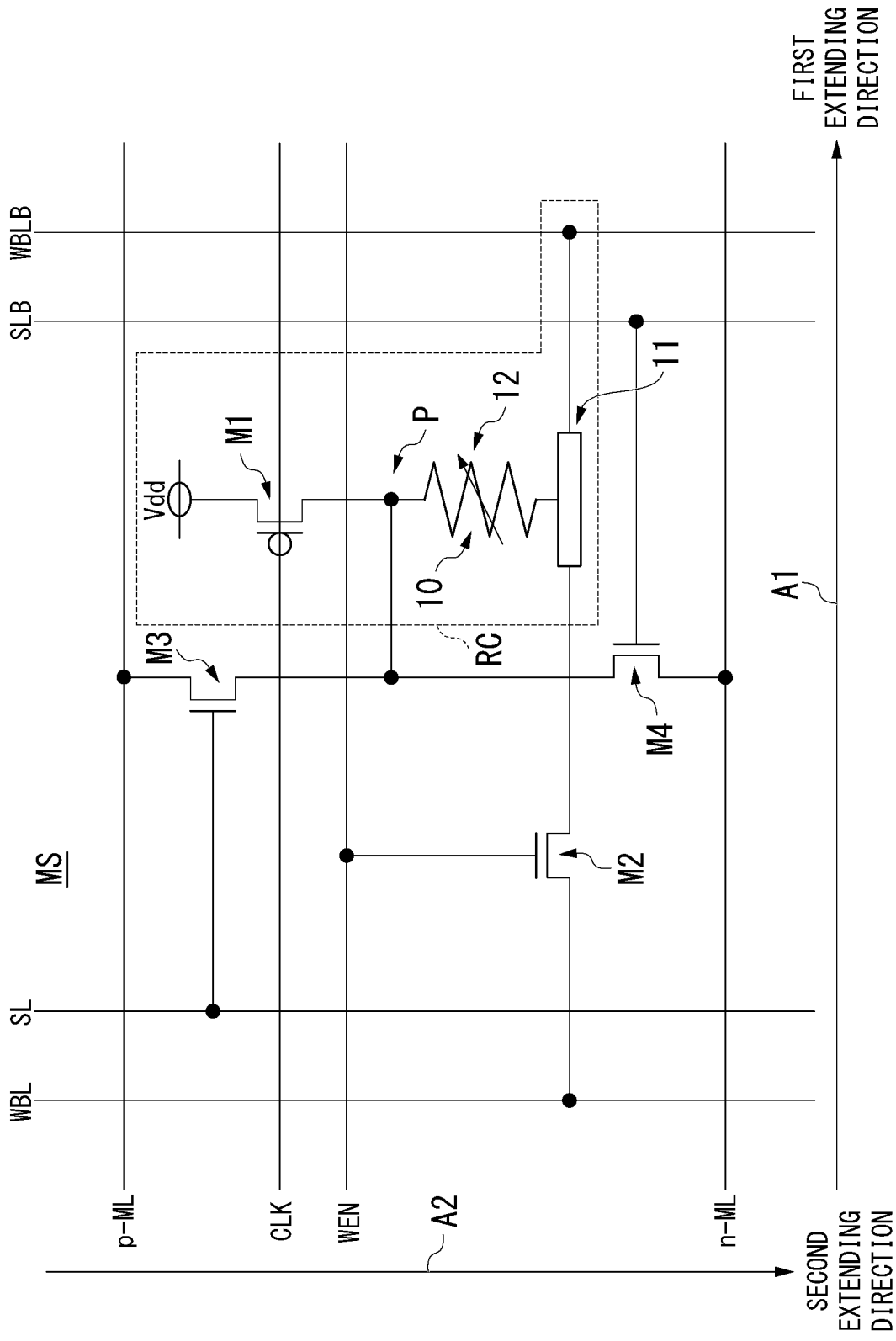
FIG. 6 is a diagram illustrating an example of a read circuit RC disposed inside the memory cell MS illustrated in FIG. 4.

FIG. 6 is a diagram illustrating an example of a read circuit RC disposed inside the memory cell MS illustrated in FIG. 4. The read circuit RC is composed of the power supply that applies the power supply voltage Vdd, the first field effect transistor M1, the magnetoresistance effect element 10, and the second write bit line WBLB. In the read circuit RC disposed inside the memory cell MS, the power supply, the first field effect transistor M1, the magnetoresistance effect element 10, and the second write bit line WBLB are connected in series.

Here, an operation of the read circuit RC will be described. In a case in which one-bit storage data indicating "0" or "1" is read from the magnetoresistance effect element 10, the state of the memory cell MS needs to be changed to a reading state. In the memory cell MS that is in the reading state, a voltage Vsink close to a ground voltage is applied to the second write bit line WBLB from the outside. Then, in the memory cell MS, the second write bit line WBLB leads a current as a leading terminal (in other words, SINK) that leads a read current read from the read circuit RC. In addition, in the memory cell MS, the L voltage is applied to the write enable line WEN from the outside, and the state of the second field effect transistor M2 comes into the off state.

Furthermore, in the memory cell MS that is in the reading state, the clock signal described above is input to the clock line CLK from the outside in accordance with a timing at which storage data stored in the magnetoresistance effect element 10 is read. In accordance with this, the state of the first field effect transistor M1 comes into the on state. As a result, in the memory cell MS, a current flows from the second ferromagnetic layer 12C of the magnetoresistance effect element 10 to the second write bit line WBLB through the second electrode 14. In other words, in the memory cell MS, the current flowing from the second ferromagnetic layer 12C to the second electrode 14 as above is led to the second write bit line WBLB as a read current. Thereafter, the read current led to the second write bit line WBLB is output to the outside.

The reading state is a state in which an operation of outputting storage data stored in the magnetoresistance effect element 10 to the outside is performed among states of the memory cell MS. In other words, the memory cell MS performs the operation within a period in which the state of the memory cell MS is the reading state in response to a request from the outside. Hereinafter, for the convenience of description, the operation will be referred to as a reading operation in description.

In accordance with the operation as described above, the read circuit RC reads storage data stored in the memory cell MS. Then, the read circuit RC outputs the read current led to the second write bit line WBLB to the outside in accordance with the read storage data.

In addition, in the read circuit RC in a case in which the state of the memory cell MS is the reading state, the first field effect transistor M1 has on resistance and thus also achieves the role of load resistance. For this reason, a voltage at the connection point P becomes a voltage Vr corresponding to a result of voltage division according to the power supply voltage Vdd and the voltage Vsink in accordance with a resistance value of the on resistance of the first field effect transistor M1 and a resistance value of the magnetoresistance effect element 10 as load resistance. For this reason, the voltage Vr changes in accordance with the resistance value of the magnetoresistance effect element 10. In other words, the voltage Vr differs in accordance with whether the value of one bit indicated by storage data stored in the magnetoresistance effect element 10 is "0" or "1".

Here, in a case in which the state of the memory cell MS is the reading state and in a case in which storage data indicating "1" is stored in the magnetoresistance effect element 10, the power supply voltage Vdd may be adjusted such that the voltage Vr and the H voltage coincide with each other, or the power supply voltage Vdd may be adjusted such that the voltage Vr and the H voltage do not coincide with each other. Hereinafter, a case in which the power supply voltage Vdd is adjusted such that the voltage Vr and the H voltage coincide with each other in a case in which the state of the memory cell MS is the reading state and in a case in which storage data indicating "1" is stored in the magnetoresistance effect element 10 will be described as an example.

Figure 7:
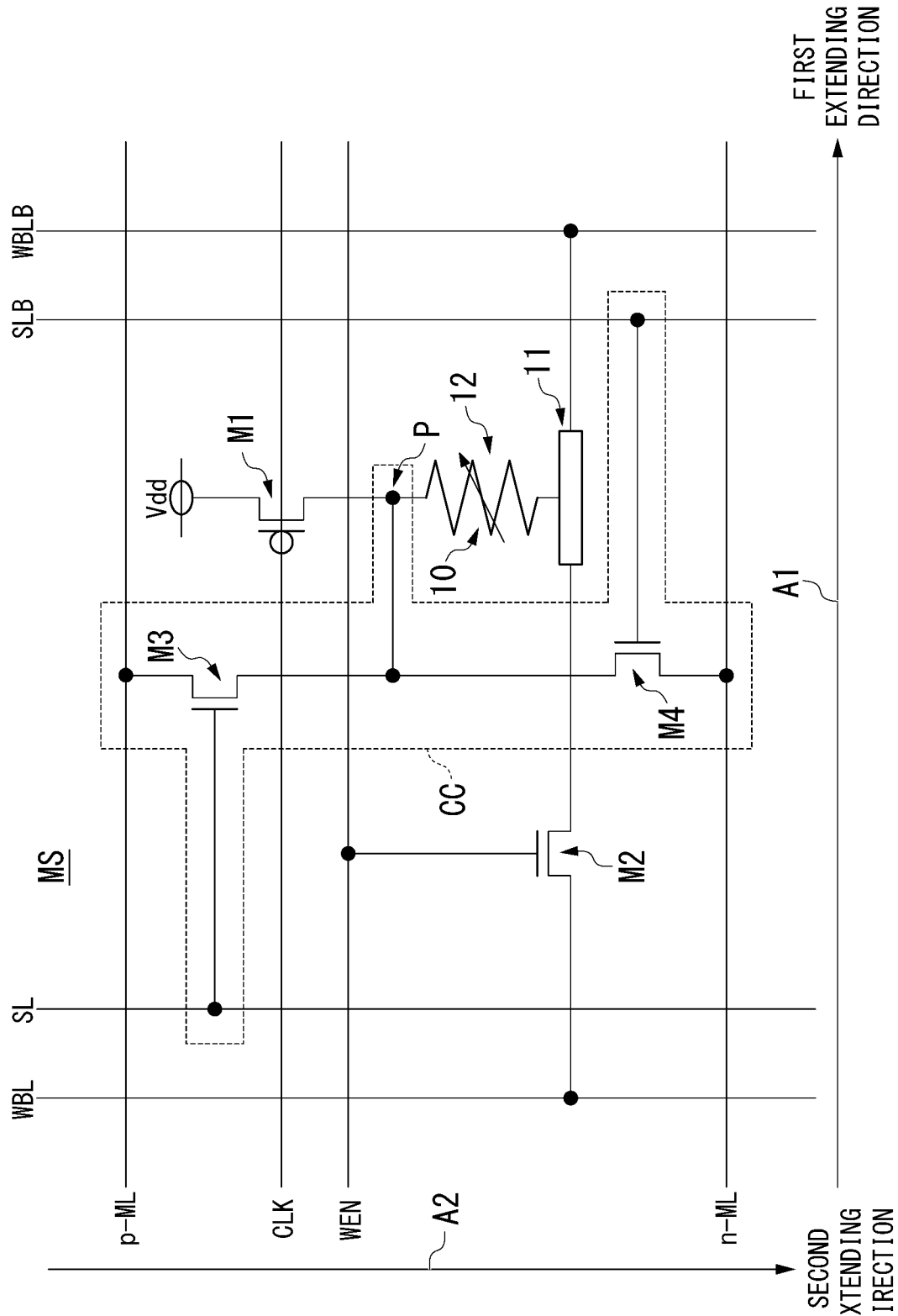
FIG. 7 is a diagram illustrating an example of a comparison calculation circuit CC disposed inside the memory cell MS illustrated in FIG. 4.

FIG. 7 is a diagram illustrating an example of the comparison calculation circuit CC disposed inside the memory cell MS illustrated in FIG. 4. The comparison calculation circuit CC is composed of the first search line SL, the second search line SLB, the third field effect transistor M3 of which the source terminal is connected to the connection point P, the fourth field effect transistor M4 of which the source terminal is connected to the connection point P, the first match line p-ML, and the second match line n-ML. In addition, in the comparison calculation circuit CC disposed inside the memory cell MS, a first part circuit not denoted by a reference sign and a second part circuit not denoted by a reference sign are connected in parallel. Here, the first part circuit is a part in which the connection point P, the third field effect transistor M3, and the first match line p-ML are connected in series in a part of the comparison calculation circuit CC. In addition, the second part circuit is a part in which the connection point P, the fourth field effect transistor M4, and the second match line n-ML are connected in series in a part of the comparison calculation circuit CC.

Here, an operation of the comparison calculation circuit CC will be described. In a case in which search data represented by a voltage applied to the first search line SL is compared with storage data stored in the magnetoresistance effect element 10, the state of the memory cell MS needs to be changed to the comparison calculation state. In a case in which the state of the memory cell MS is the comparison calculation state, the state of the memory cell MS is the reading state as well. The reason for this is that the read circuit RC also needs to be operated in a case in which the comparison calculation circuit CC is operated.

In the memory cell MS that is in the comparison calculation state, the L voltage is applied to the write enable line WEN from the outside, and the state of the second field effect transistor M2 comes into the off state. In addition, in the memory cell MS, the voltage Vsink described above is applied to the second write bit line WBLB. Furthermore, in the memory cell MS, the L voltage is applied to the clock line CLK, and the state of the first field effect transistor M1 comes into the on state. As a result, the voltage at the connection point P becomes the voltage Vr.

Here, in this embodiment, as described above, in a case in which storage data stored in the magnetoresistance effect element 10 indicates "1", the voltage Vr coincides with the H voltage. In this embodiment, the voltage Vsink is approximately a ground electric potential. In this embodiment, the ground electric potential is a reference electric potential. For this reason, in a case in which storage data stored in the magnetoresistance effect element 10 indicates "0", the voltage Vr approximately coincides with the L voltage.

In addition, in the memory cell MS that is in the comparison calculation state, one of the H voltage and the L voltage is applied to the first search line SL from the outside.

In the memory cell MS that is in the comparison calculation state, in a case in which search data to be compared with the storage data stored in the magnetoresistance effect element 10 indicates "1", the H voltage is applied to the first search line SL from the outside. As a result, the state of the third field effect transistor M3 comes into the on state. In other words, in accordance with the voltage applied to the first search line SL, the first match line p-ML is electrically connected to the magnetoresistance effect element 10. In addition, in the memory cell MS, the L voltage is applied to the second search line SLB from the outside in this case. As a result, the state of the fourth field effect transistor M4 comes into the off state.

Here, in the memory cell MS that is in the comparison calculation state, in a case in which the search data indicates "1", and storage data stored in the magnetoresistance effect element 10 indicates "1", a voltage output from the output end of the first match line p-ML becomes the high output voltage described above. The reason for this is that, in this embodiment, the voltage Vr and the H voltage coincide with each other in this case. On the other hand, in the memory cell MS, in a case in which the search data indicates "1", and the storage data indicates "0", the voltage output from the output end is lowered to the low output voltage described above. The reason for this is that, in this embodiment, the voltage Vr is approximately the L voltage in this case. In other words, the voltage output from the output end becomes the high output voltage in a case in which the search data indicating "1" and the storage data coincide with each other and becomes the low output voltage in a case in which the search data and the storage data do not coincide with each other.

In addition, in the memory cell MS that is in the comparison calculation state, in a case in which the search data indicates "1", and the storage data stored in the magnetoresistance effect element 10 indicates "1", the voltage output from the output end of the second match line n-ML becomes the low output voltage. The reason for this is that, in this embodiment, as described above, the state of the fourth field effect transistor M4 is the off state in this case. On the other hand, in the memory cell MS, also in a case in which the search data indicates "1", and the storage data indicates "0", the voltage output from the output end becomes the low output voltage. Also the reason for this is that, in this embodiment, the state of the fourth field effect transistor M4 is the off state in this case. In other words, the voltage output from the output end becomes the low output voltage in both cases including a case in which the search data indicating "1" and the storage data coincide with each other and a case in which the search data and the storage data do not coincide with each other.

In addition, in the memory cell MS that is in the comparison calculation state, in a case in which search data to be compared with the storage data stored in the magnetoresistance effect element 10 indicates "0", the L voltage is applied to the first search line SL. As a result, the state of the third field effect transistor M3 comes into the off state. In addition, in the memory cell MS, the H voltage is applied to the second search line SLB in this case. As a result, the state of the fourth field effect transistor M4 comes into the on state. In other words, in accordance with the voltage applied to the second search line SLB, the second match line n-ML is electrically connected to the magnetoresistance effect element 10.

Here, in the memory cell MS that is in the comparison calculation state, in a case in which the search data indicates "0", and the storage data stored in the magnetoresistance effect element 10 indicates "1", the voltage output from the output end of the first match line p-ML becomes the high output voltage. The reason for this is that, in this embodiment, as described above, the state of the third field effect transistor M3 is the off state in this case. On the other hand, in the memory cell MS, also in a case in which the search data indicates "0", and the storage data indicates "0", the voltage output from the output end becomes the high output voltage. The reason also for this is that, in this embodiment, the state of the third field effect transistor M3 is the off state in this case. In other words, the voltage output from the output end becomes the high output voltage in both cases including a case in which search data indicating "0" and the storage data coincide with each other and a case in which the search data and the storage data do not coincide with each other.

In addition, in the memory cell MS that is in the comparison calculation state, in a case in which the search data indicates "0", and the storage data stored in the magnetoresistance effect element 10 indicates "1", the voltage output from the output end of the second match line n-ML becomes the high output voltage. The reason for this is that, in this embodiment, the voltage Vr and the H voltage coincide with each other in this case. On the other hand, in the memory cell MS, in a case in which the search data indicates "0", and the storage data indicates "0", the voltage output from the output end becomes the low output voltage. The reason for this is that, in this embodiment, the voltage Vr is approximately the L voltage in this case. In other words, the voltage output from the output end becomes the low output voltage in a case in which the search data indicating "0" and the storage data coincide with each other and becomes the high output voltage in a case in which the search data and the storage data do not coincide with each other.

Here, when the first match line p-ML and the second match line n-ML are simply summarized, an electric potential corresponding to the electric potential of the second ferromagnetic layer 12C is applied to each of the first match line p-ML and the second match line n-ML.

<Operation of Memory Cell in Each of Comparison Calculation State and Writing State>

Hereinafter, an operation of the memory cell MS in each of the comparison calculation state and the writing state will be described based on truth tables illustrated in FIGS. 8 and 9.

FIG. 8 is a diagram illustrating an example of a truth table in the memory cell MS illustrated in FIG. 4. The truth table illustrated in FIG. 8 illustrates an example of logical values of the clock line CLK, the second write bit line WBLB, the storage data, the first search line SL, the second search line SLB, the first match line p-ML, and the second match line n-ML in a case in which the memory cell MS that is in the comparison calculation state performs a comparison calculation operation.

In the example illustrated in FIG. 8, logical value "1" of the clock line CLK indicates that the H voltage is applied to the clock line CLK from the outside. In addition, in this example, logical value "0" of the clock line CLK indicates that a pulse signal of the L voltage is input to the clock line CLK from the outside as a clock signal. A waveform of the clock line CLK represents a waveform of a clock signal input to the clock line CLK from the outside.

In the example illustrated in FIG. 8, logical value "0" of the second write bit line WBLB indicates that the voltage Vsink is applied to the second write bit line WBLB from the outside.

In the example illustrated in FIG. 8, logical value "1" of the first search line SL indicates that the H voltage is applied to the first search line SL from the outside. In addition, in this example, logical value "0" of the first search line SL indicates that the L voltage is applied to the first search line SL from the outside.

In the example illustrated in FIG. 8, logical value "1" of the storage data indicates that the resistance value of the magnetoresistance effect element 10 is a first resistance value. In other words, in this example, logical value "1" of the storage data indicates that the storage data indicating "1" is stored in the magnetoresistance effect element 10. In addition, in this example, logical value "0" of the storage data indicates that the resistance value of the magnetoresistance effect element 10 is a second resistance value. In other words, in this example, logical value "0" of the storage data indicates that the storage data indicating "0" is stored in the magnetoresistance effect element 10.

In the example illustrated in FIG. 8, logical value "1" of the second search line SLB indicates that the H voltage is applied to the second search line SLB from the outside. In addition, in this example, logical value "0" of the second search line SLB indicates that the L voltage is applied to the second search line SLB from the outside.

In the example illustrated in FIG. 8, logical value "1" of the first match line p-ML indicates that the high output voltage is output from the output end of the first match line p-ML. In addition, in this example, logical value "0" of the first match line p-ML indicates that the low output voltage is output from the output end of the first match line p-ML.

In the example illustrated in FIG. 8, logical value "1" of the second match line n-ML indicates that the high output voltage is output from the output end of the second match line n-ML. In addition, in this example, logical value "0" of the second match line n-ML indicates that the low output voltage is output from the output end of the second match line n-ML.

In FIG. 8, although not illustrated, in the memory cell MS that is in the comparison calculation state, the L voltage is applied to the write enable line WEN from the outside. For this reason, in the memory cell MS that is in the comparison calculation state, the voltage Vr at the connection point P described above does not increase or decrease in accordance with the voltage applied to the first write bit line WBL.

As illustrated in FIG. 8, in the memory cell MS that is in the comparison calculation state, the L voltage is applied to the clock line CLK and the second write bit line WBLB from the outside.

Then, in the memory cell MS that is in the comparison calculation state, in a case in which the storage data indicates "0" and in a case in which the search data indicates "1" (in other words, in a case in which the logical value of the first search line SL is "1"), when a clock signal is input to the clock line CLK from the outside, the low output voltage is output from the output end of each of the first match line p-ML and the second match line n-ML.

In the memory cell MS that is in the comparison calculation state, in a case in which the storage data indicates "1" and in a case in which the search data indicates "1" (in other words, in a case in which the logical value of the first search line SL is "1"), when a clock signal is input to the clock line CLK from the outside, the high output voltage is output from the output end of the first match line p-ML. In addition, in the memory cell MS that is in the comparison calculation state, in a case in which the storage data indicates "1" and in a case in which the search data indicates "1" (in other words, in a case in which the logical value of the first search line SL is "1"), when a clock signal is input to the clock line CLK from the outside, the low output voltage is output from the output end of the second match line n-ML.

In the memory cell MS that is in the comparison calculation state, in a case in which the storage data indicates "0" and in a case in which the search data indicates "0" (in other words, in a case in which the logical value of the first search line SL is "0"), when a clock signal is input to the clock line CLK from the outside, the high output voltage is output from the output end of the first match line p-ML. In the memory cell MS that is in the comparison calculation state, in a case in which the storage data indicates "0" and in a case in which the search data indicates "0" (in other words, in a case in which the logical value of the first search line SL is "0"), the low output voltage is output from the output end of the second match line n-ML.

In addition, in the memory cell MS that is in the comparison calculation state, in a case in which the storage data indicates "1" and in a case in which the search data indicates "0" (in other words, in a case in which the logical value of the first search line SL is "0"), when a clock signal is input to the clock line CLK from the outside, the high output voltage is output from the output end of each of the first match line p-ML and the second match line n-ML.

In this way, in the memory cell MS, by inputting a clock signal to the clock line CLK from the outside after the state of the memory cell MS is caused to coincide with the comparison calculation state, an output voltage indicating a result of comparison between the search data and the storage data (in other words, a combination of the first output voltage and the second output voltage described above) is output from each of the first match line p-ML and the second match line n-ML. In other words, even when a magnetoresistance effect element included as a non-volatile memory is the magnetoresistance effect element 10 that is an element of the spin orbital torque type, the memory cell MS can have a function of a memory cell included in a non-volatile associative memory device.

FIG. 9 is a diagram illustrating another example of a truth table in the memory cell MS illustrated in FIG. 4. The truth table illustrated in FIG. 9 illustrates an example of logical values of the write enable line WEN, the first write bit line WBL, the second write bit line WBLB, and storage data written into the magnetoresistance effect element 10 in a case in which the memory cell MS that is in the writing state performs a writing operation.

In the example illustrated in FIG. 9, logical value "1" of the write enable line WEN indicates that a write signal is input to the write enable line WEN. In addition, in the example, logical value "0" of the write enable line WEN indicates that the L voltage is applied to the write enable line WEN. A waveform of the write enable line WEN represents a waveform of a write signal input to the write enable line WEN from the outside.

In the example illustrated in FIG. 9, logical value "0" of the first write bit line WBL indicates that the L voltage is applied to the first write bit line WBL. In addition, in the example, logical value "1" of the first write bit line WBL indicates that the H voltage is applied to the first write bit line WBL.

In the example illustrated in FIG. 9, logical value "0" of the second write bit line WBLB indicates that the L voltage is applied to the second write bit line WBLB. In addition, in the example, logical value "1" of the second write bit line WBLB indicates that the H voltage is applied to the second write bit line WBLB.

In the example illustrated in FIG. 9, logical value "1" of the storage data indicates that the resistance value of the magnetoresistance effect element 10 is the first resistance value. In other words, in this example, logical value "1" of the storage data indicates that storage data indicating "1" is stored in the magnetoresistance effect element 10. In addition, in this example, logical value "0" of the storage data indicates that the resistance value of the magnetoresistance effect element 10 is the second resistance value. In other words, in this example, logical value "0" of the storage data indicates that the storage data indicating "0" is stored in the magnetoresistance effect element 10.

As illustrated in FIG. 9, in the memory cell MS that is in the writing state, one voltage among the L voltage and the H voltage is applied to the first write bit line WBL. In the memory cell MS, a voltage among the L voltage and the H voltage that is not applied to the first write bit line WBL is applied to the second write bit line WBLB.

In the memory cell MS that is in the writing state, when a signal is input to the write enable line WEN from the outside, the resistance value of the magnetoresistance effect element 10 changes to a resistance value according to voltages applied to the first write bit line WBL and the second write bit line WBLB.

In other words, in the memory cell MS that is in the writing state, in a case in which the logical value of the first write bit line WBL is "1" and in a case in which the logical value of the second write bit line WBLB is "0", when a write signal is input to the write enable line WEN from the outside, storage data indicating "0" is written into the magnetoresistance effect element 10.

In addition, in the memory cell MS that is in the writing state, in a case in which the logical value of the first write bit line WBL is "0" and in a case in which the logical value of the second write bit line WBLB is "1", when a write signal is input to the write enable line WEN from the outside, storage data indicating "1" is written into the magnetoresistance effect element 10.

Furthermore, in the memory cell MS that is in the writing state, in a case in which the logical value of the first write bit line WBL is "0", even in a case in which the logical value of the second write bit line WBLB is "0", when a write signal is input to the write enable line WEN from the outside, storage data indicating "0" is written into the magnetoresistance effect element 10.

In addition, in the memory cell MS that is in the writing state, in a case in which the logical value of the first write bit line WBL is "1", even in a case in which the logical value of the second write bit line WBLB is "1", when a write signal is input to the write enable line WEN from the outside, storage data indicating "1" is written into the magnetoresistance effect element 10.

In this way, in the memory cell MS that is in the writing state, unless a write signal is input to the write enable line WEN from the outside, the storage data stored in the magnetoresistance effect element 10 does not change.

As above, the memory cell MS includes a magnetoresistance effect element of the spin orbital torque type as the magnetoresistance effect element 10, and thus a current does not need to be caused to flow through the second member 12 every time when storage data is written into the magnetoresistance effect element 10. As a result, the memory cell MS can inhibit the life of the magnetoresistance effect element 10 included as a non-volatile memory in the memory cell MS from being shortened.

In addition, the circuit configuration of the memory cell MS is the circuit configuration illustrated in FIG. 4, and thus the memory cell MS can suppress the number of field effect transistors included in the memory cell MS to four. In accordance with this, the memory cell MS can realize reduction of the calorific value of the memory cell MS and can reduce noise generated in accordance with operations of field effect transistors included in the memory cell MS. Furthermore, the memory cell MS can decrease the occupancy area.

In addition, in the circuit configuration of the memory cell MS, as long as the features of the memory cell MS described above are maintained, other circuit elements, other circuits, other devices, and the like may be configured to be added. However, there is concern that an increase in the noise, an increase in the calorific value, and the like may occur, and thus it is preferable that the memory cell MS have a configuration in which no additional field effect transistor is added.

Modified Example 1 of Circuit Configuration of Memory Cell

Figure 10:
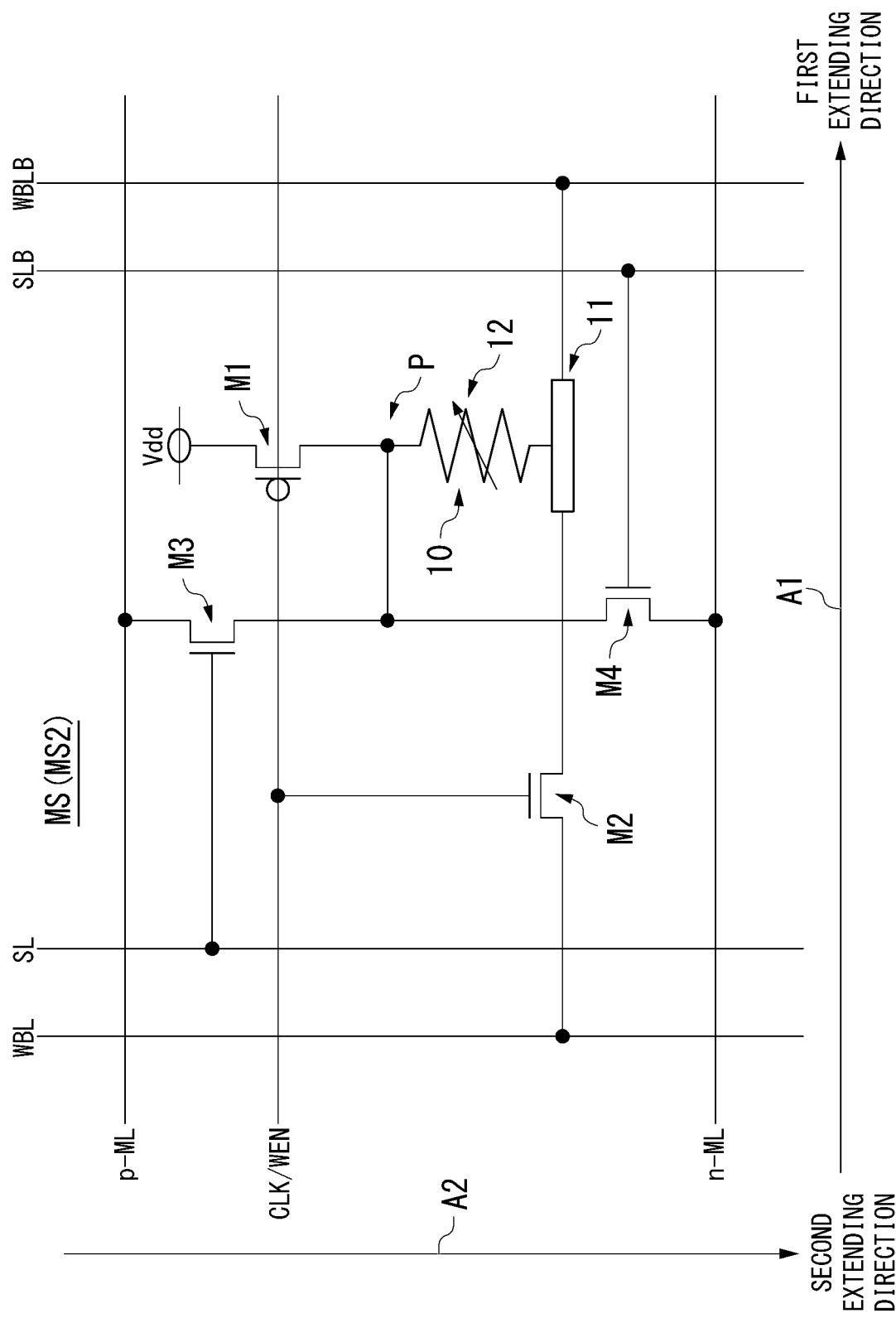
FIG. 10 is a diagram illustrating a first another example of the configuration of the memory cell MS.

For example, the circuit configuration of the memory cell MS may be a circuit configuration illustrated in FIG. 10 instead of the circuit configuration illustrated in FIG. 4. FIG. 10 is a diagram illustrating a first another example of the configuration of the memory cell MS. Hereinafter, for the convenience of description, the memory cell MS illustrated in FIG. 10 will be referred to as a memory cell MS2 in description.

In the example illustrated in FIG. 10, a clock line CLK and a write enable line WEN included in the memory cell MS2 are configured to be common as one signal line CLK/WEN. In the memory cell MS2, the signal line CLK/WEN is connected to the gate terminal of the first field effect transistor M1 and is connected to the gate terminal of the second field effect transistor M2.

In addition, a pulse signal of the H voltage is input to the signal line CLK/WEN as a clock/write signal in place of a clock signal and a write signal.

Here, the non-volatile associative memory device 1 has a function of switching the operation mode to a low power consumption mode such as a standby mode and the like in many cases. In a case in which the operation mode is switched to the low power consumption mode such as the standby mode, the non-volatile associative memory device 1 stops leading of a read current from the second write bit line WBLB.

For this reason, in a case in which the non-volatile associative memory device 1 includes the memory cell MS2, even in a case in which a clock/write signal is input to the signal line CLK/WEN from the outside, the state of the memory cell MS needs to be not the writing state for the memory cell MS2. For this reason, the memory cell MS performs control such as control of causing a voltage difference between the first write bit line WBL and the second write bit line WBLB to be 0 volts or about 0 volts, control of causing one of the first write bit line WBL and the second write bit line WBLB to be in a High-Z state, and the like.

In accordance with such control, even in a case in which the operation mode is switched to the lower power consumption mode, the non-volatile associative memory device 1 including the memory cell MS2 can inhibit a current from flowing from the second ferromagnetic layer 12C of the magnetoresistance effect element 10 to the second write bit line WBLB through the second electrode 14. As a result, the non-volatile associative memory device 1 can enable the memory cell MS2 to have the same function as the memory cell MS illustrated in FIG. 4.

Modified Example 2 of Circuit Configuration of Memory Cell

Figure 11:
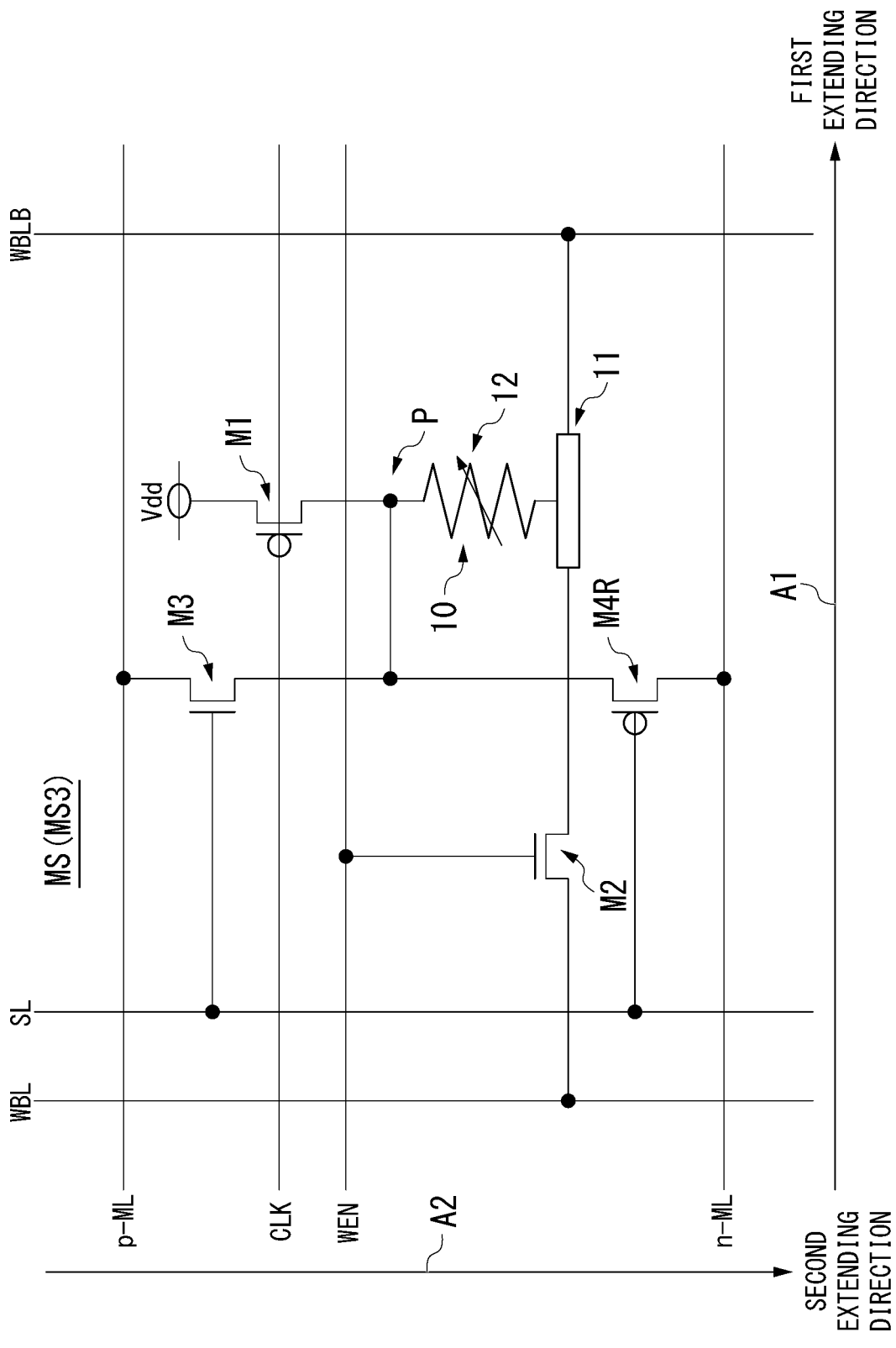
FIG. 11 is a diagram illustrating a second another example of the configuration of the memory cell MS.

For example, the circuit configuration of the memory cell MS may be a circuit configuration illustrated in FIG. 11 instead of the circuit configuration illustrated in FIG. 4. FIG. 11 is a diagram illustrating a second another example of the configuration of the memory cell MS. Hereinafter, for the convenience of description, the memory cell MS illustrated in FIG. 11 will be referred to as a memory cell MS3 in description.

The memory cell MS3 includes a fourth field effect transistor M4R in place of the fourth field effect transistor M4.

The fourth field effect transistor M4R is a P-MOS field effect transistor. A gate terminal of the fourth field effect transistor M4R is connected to a first search line SL. For this reason, the memory cell MS3 does not include the second search line SLB. In other words, in the memory cell MS3, two search lines including the first search line SL and the second search line SLB are configured to be common as one first search line SL.

Here, in the memory cell MS illustrated in FIG. 4, in a case in which the comparison calculation operation described above is performed, when the H voltage is applied to the gate terminal of the third field effect transistor M3, the L voltage is applied to the gate terminal of the fourth field effect transistor M4. In addition, in the memory cell MS, in the case, when the L voltage is applied to the gate terminal of the third field effect transistor M3, the H voltage is applied to the gate terminal of the fourth field effect transistor M4. In other words, in the memory cell MS, gate-to-source switching control voltages of the third field effect transistor M3 and the fourth field effect transistor M4 are different. For this reason, in the memory cell MS, the on resistance of the third field effect transistor M3 and the on resistance of the fourth field effect transistor M4 are different from each other, and a switching speed of the third field effect transistor M3 and the switching speed of the fourth field effect transistor M4 are different from each other. Such a difference between on-resistances and a difference between the switching speeds may cause a problem in designing the non-volatile associative memory device 1 including the memory cell MS.

On the other hand, in the memory cell MS3, the third field effect transistor M3 and the fourth field effect transistor M4R are field effect transistors having mutually-different polarities. For this reason, in the memory cell MS3, gate-to-source switching control voltages of the third field effect transistor M3 and the fourth field effect transistor M4R are the same. As a result, in the memory cell MS3, the on-resistance of the third field effect transistor M3 and the on-resistance of the fourth field effect transistor M4R can be configured to be the same, and the switching speed of the third field effect transistor M3 and the switching speed of the fourth field effect transistor M4 can be configured to be the same. In addition, in the memory cell MS3, switching control of the two field effect transistors is performed using the first search line SL, and thus timings at which voltages are applied to the first search line SL and the second search line SLB do not need to be aligned. From this, the memory cell MS3 can improve the performance of the non-volatile associative memory device 1 including the memory cell MS3.

In addition, the memory cell MS3 may be configured to include a P-MOS field effect transistor in place of the third field effect transistor M3 and include an N-MOS field effect transistor in place of the fourth field effect transistor M4R.

Modified Example 3 of Circuit Configuration of Memory Cell

Figure 12:
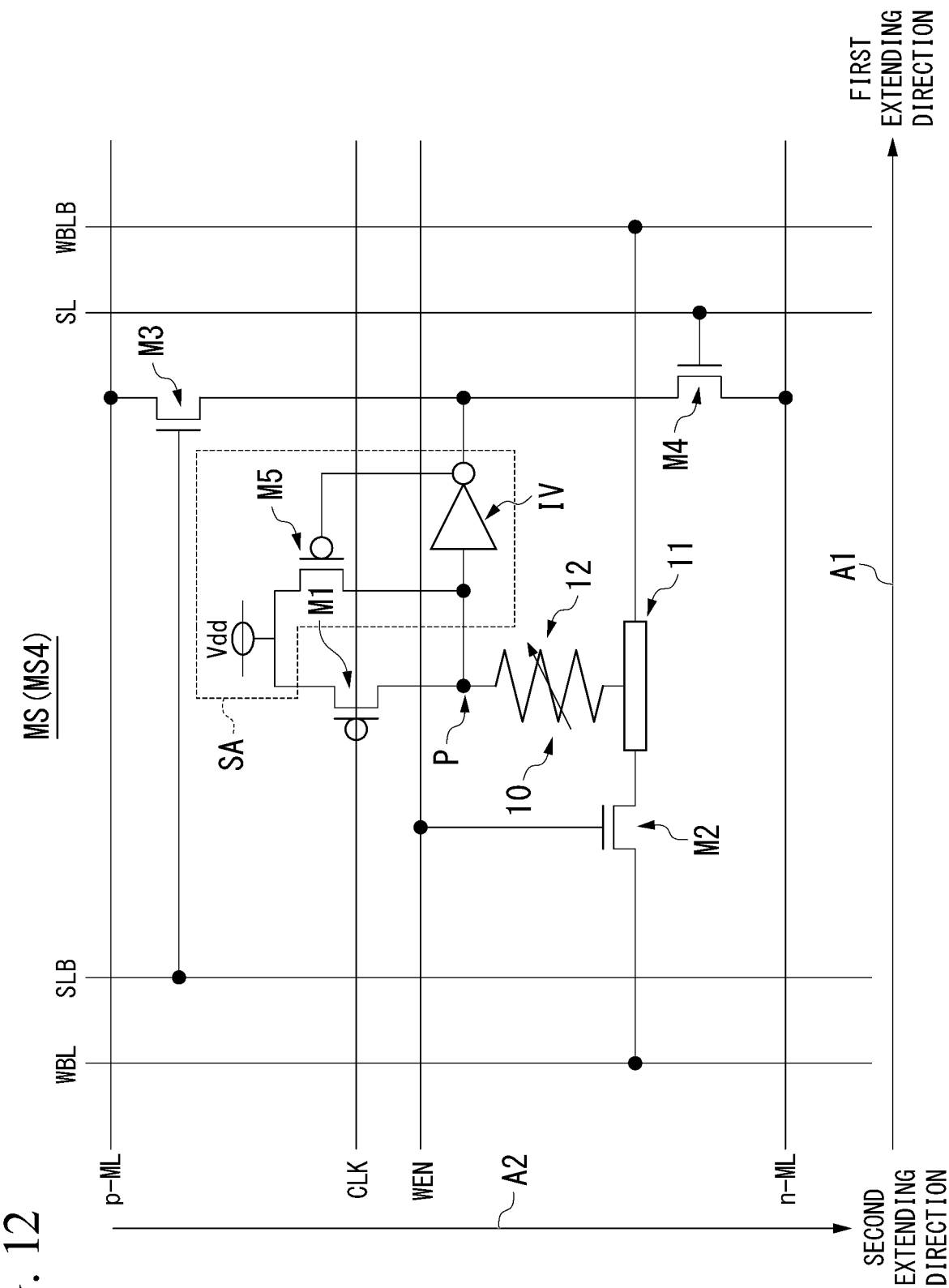
FIG. 12 is a diagram illustrating a third another example of the configuration of the memory cell MS.

For example, the circuit configuration of the memory cell MS may be a circuit configuration illustrated in FIG. 12 instead of the circuit configuration illustrated in FIG. 4. FIG. 12 is a diagram illustrating a third another example of the configuration of the memory cell MS. Hereinafter, for the convenience of description, the memory cell MS illustrated in FIG. 12 will be referred to as a memory cell MS4 in description.

The memory cell MS4 includes a single-end type sense amplifier SA. In accordance with this, the memory cell MS4 can output a voltage difference (in other words, a change in the voltage Vr) between the voltage Vr at the connection point P in a case in which the resistance value of the magnetoresistance effect element 10 is a first resistance value and the voltage Vr at the connection point P in a case in which the resistance value is a second resistance value as a signal voltage of a full amplitude. As a result, the memory cell MS4 can improve a detection margin of coincidence/non-coincidence between the storage data and the search data. Here, in this embodiment, the detection margin represents a difference between two voltages (in other words, a difference between a high output voltage and a low output voltage) output as first output voltages and a difference between two voltages (in other words, a difference between a high output voltage and a low output voltage) output as second output voltages.

The single-end type sense amplifier SA is composed of an inverter circuit IV and a fifth field effect transistor M5.

In the example illustrated in FIG. 12, the inverter circuit IV is connected between a transmission line connecting the source terminal of the first field effect transistor M1 and the second ferromagnetic layer 12C of the magnetoresistance effect element 10 and a transmission line connecting the source terminal of the third field effect transistor M3 and the source terminal of the fourth field effect transistor M4 through a transmission line. Here, an input terminal of the inverter circuit IV is connected to the transmission line connecting the source terminal of the first field effect transistor M1 and the second ferromagnetic layer 12C of the magnetoresistance effect element 10 through a transmission line. In addition, an output terminal of the inverter circuit IV is connected to the transmission line connecting the source terminal of the third field effect transistor M3 and the source terminal of the fourth field effect transistor M4. Furthermore, the output terminal is connected to a gate terminal of the fifth field effect transistor M5. In addition, a drain terminal of the fifth field effect transistor M5 is connected to a power supply that applies a power supply voltage Vdd through a transmission line. A source terminal of the fifth field effect transistor M5 is connected to a transmission line connecting the connection point P and the input terminal through a transmission line. In other words, the fifth field effect transistor M5 is connected to the first field effect transistor M1 in parallel with respect to the power supply. The fifth field effect transistor M5 is a P-MOS field effect transistor.

The single-end type sense amplifier SA is composed of the inverter circuit IV and the fifth field effect transistor M5 and thus have an occupancy area smaller than other types of amplifiers. However, the single-end type sense amplifier SA outputs data acquired by inverting input data input to the input terminal of the inverter circuit IV. For this reason, the memory cell MS4 needs to recover inversion of the input data according to the single-end type sense amplifier SA. In order to recover such inversion, in the memory cell MS4, the first search line SL is connected to the gate terminal of the fourth field effect transistor M4 instead of the gate terminal of the third field effect transistor M3. In addition, in the memory cell MS, the second search line SLB is connected to the gate terminal of the third field effect transistor M3 instead of the gate terminal of the fourth field effect transistor M4.

In the memory cell MS4, in a case in which storage data stored in the magnetoresistance effect element 10 indicates "1", the voltage Vr at the connection point P is the H voltage. In this case, the single-end type sense amplifier SA outputs a voltage that is close to the ground voltage. On the other hand, in the memory cell MS4, in a case in which storage data stored in the magnetoresistance effect element 10 indicates "0", the voltage Vr at the connection point P is the L voltage. In this case, the single-end type sense amplifier SA outputs a voltage that is close to the power supply voltage Vdd described above.

For this reason, in a case in which the single-end type sense amplifier SA outputs a voltage that is close to the ground voltage, and the state of the third field effect transistor M3 comes into the on state, a voltage output from the output end of the first match line p-ML becomes a voltage acquired after the high output voltage being lowered in accordance with the voltage close to the ground voltage. On the other hand, in a case in which the single-end type sense amplifier SA outputs a voltage that is close to the power supply voltage Vdd, and the state of the third field effect transistor M3 comes into the on state, a voltage output from the output end of the first match line p-ML becomes a voltage acquired after the high output voltage being raised in accordance with the voltage close to the power supply voltage Vdd.

In addition, in a case in which the single-end type sense amplifier SA outputs a voltage that is close to the ground voltage, and the state of the fourth field effect transistor M4 comes into the on state, a voltage output from the output end of the second match line n-ML becomes a voltage acquired after the low output voltage being lowered in accordance with the voltage close to the ground voltage. On the other hand, in a case in which the single-end type sense amplifier SA outputs a voltage that is close to the power supply voltage Vdd, and the state of the fourth field effect transistor M4 comes into the on state, a voltage output from the output end of the second match line n-ML becomes a voltage acquired after the low output voltage being raised in accordance with the voltage close to the power supply voltage Vdd.

In this way, the memory cell MS4 can improve a detection margin of coincidence/non-coincidence between the storage data and the search data.

Modified Example 4 of Circuit Configuration of Memory Cell

Figure 13:
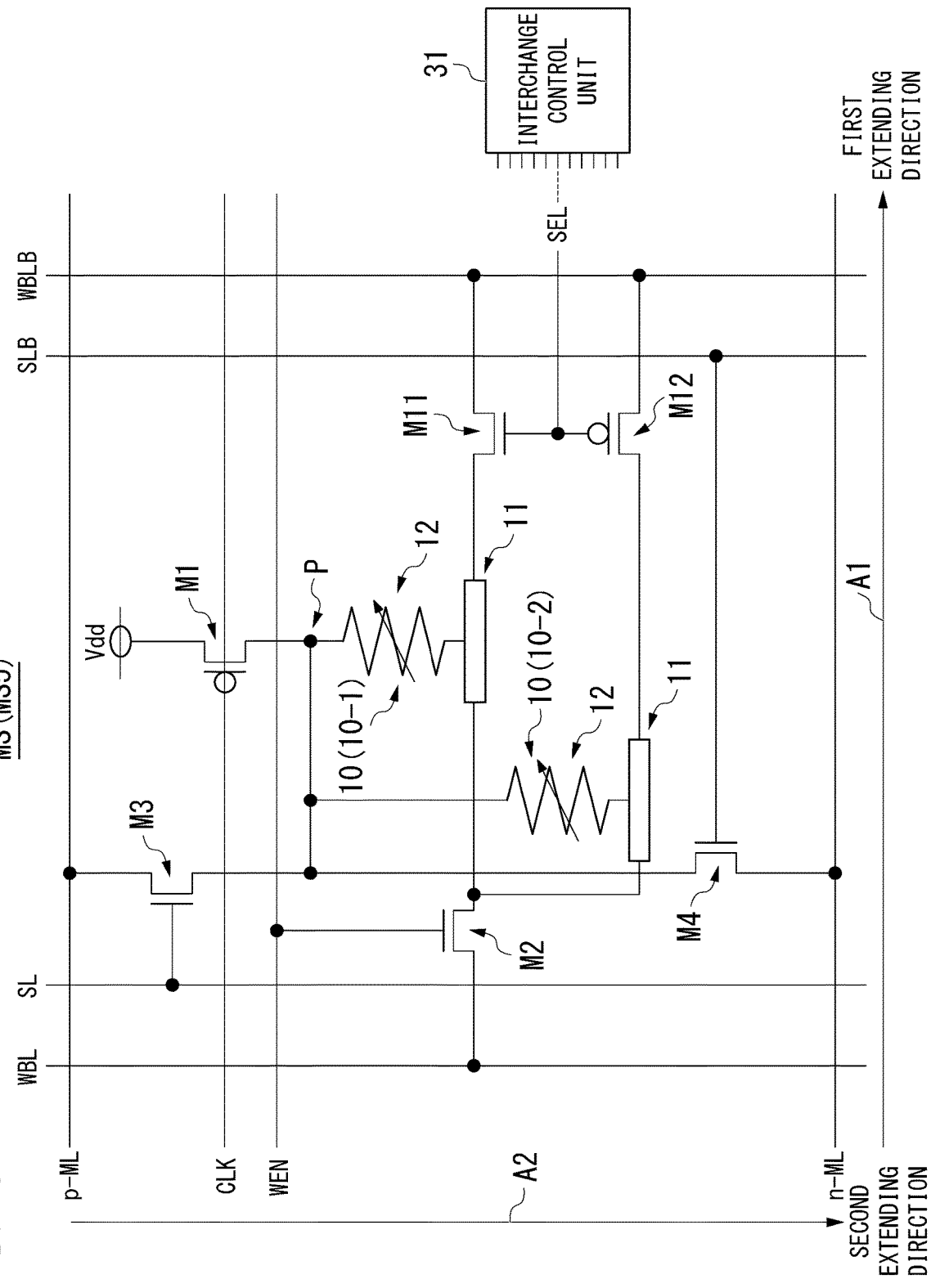
FIG. 13 is a diagram illustrating a fourth another example of the configuration of the memory cell MS.

For example, the circuit configuration of the memory cell MS may be a circuit configuration illustrated in FIG. 13 instead of the circuit configuration illustrated in FIG. 4. FIG. 13 is a diagram illustrating a fourth another example of the configuration of the memory cell MS. Hereinafter, for the convenience of description, the memory cell MS illustrated in FIG. 13 will be referred to as a memory cell MS5 in description.

The memory cell MS5 includes two magnetoresistance effect elements 10. One of these two magnetoresistance effect elements 10 is a magnetoresistance effect element that is used as a non-volatile memory at a normal time. On the other hand, the other of the two magnetoresistance effect elements 10 is a spare magnetoresistance effect element that is used in a case in which a malfunction or the like occurs in the magnetoresistance effect element 10 used at the normal time. In other words, the other of the two magnetoresistance effect elements 10 is a magnetoresistance effect element used for spare replacement. Hereinafter, for the convenience of description, the magnetoresistance effect element 10 among the two magnetoresistance effect elements 10 that is used at the normal time will be referred to as a magnetoresistance effect element 10-1 in description. In addition, hereinafter, for the convenience of description, the magnetoresistance effect element 10 among the two magnetoresistance effect elements 10 that is used for spare replacement will be referred to as a magnetoresistance effect element 10-2 in description.

In the memory cell MS5, as illustrated in FIG. 13, the magnetoresistance effect element 10-2 is connected to the magnetoresistance effect element 10-1 in parallel.

In addition, when one of the magnetoresistance effect element 10-1 and the magnetoresistance effect element 10-2 is used, the memory cell MS5 performs switching control of electrically disabling writing and reading of storage data for one of the magnetoresistance effect element 10-1 and the magnetoresistance effect element 10-2 and electrically enabling writing and reading of storage data for the other of the magnetoresistance effect element 10-1 and the magnetoresistance effect element 10-2. For this reason, the memory cell MS5 further includes two field effect transistors including a field effect transistor M11 and a field effect transistor M12.

In the example illustrated in FIG. 13, the field effect transistor M11 is an N-MOS field effect transistor. A drain terminal of the field effect transistor M11 is connected to the second write bit line WBLB through a transmission line. In addition, a source terminal of the field effect transistor M11 is connected to a second electrode 14 of the magnetoresistance effect element 10-1 through a transmission line. The field effect transistor M11 may be a P-MOS field effect transistor in a case in which the field effect transistor M12 is an N-MOS field effect transistor. Here, hereinafter, for the convenience of description, the state of the field effect transistor M11 being the on state will be referred to as the magnetoresistance effect element 10-1 being in a usable state in description. In addition, hereinafter, for the convenience of description, the state of the field effect transistor M11 being the off state will be referred to as the magnetoresistance effect element 10-1 being in an unusable state in description.

In the example illustrated in FIG. 13, the field effect transistor M12 is a P-MOS field effect transistor. A drain terminal of the field effect transistor M12 is connected to the second write bit line WBLB through a transmission line. A source terminal of the field effect transistor M12 is connected to the second electrode 14 of the magnetoresistance effect element 10-2 through a transmission line. The field effect transistor M12 may be an N-MOS field effect transistor in a case in which the field effect transistor M11 is a P-MOS field effect transistor. Here, hereinafter, for the convenience of description, the state of the field effect transistor M12 being the on state will be referred to as the magnetoresistance effect element 10-2 being in a usable state in description. In addition, hereinafter, for the convenience of description, the state of the field effect transistor M12 being the off state will be referred to as the magnetoresistance effect element 10-2 being in an unusable state in description.

A gate terminal of each of the field effect transistor M11 and the field effect transistor M12 is connected to a signal line SEL to which a signal indicating an interchange request is input by an interchange control unit 31. The interchange control unit 31 controls interchange between the magnetoresistance effect element 10-1 and the magnetoresistance effect element 10-2 from the outside. The interchange between the magnetoresistance effect element 10-1 and the magnetoresistance effect element 10-2 represents changing the magnetoresistance effect element 10 that is in the usable state among the magnetoresistance effect element 10-1 and the magnetoresistance effect element 10-2 to be in the unusable state and changing the magnetoresistance effect element 10 that is in the unusable state among the magnetoresistance effect element 10-1 and the magnetoresistance effect element 10-2 to be in the usable state. In addition, the interchange request is a request for causing the memory cell MS5 to perform interchange between the magnetoresistance effect element 10-1 and the magnetoresistance effect element 10-2.

The interchange control unit 31 inputs a signal representing an interchange request to the signal line SEL, for example, based on information used for administering interchange control such as a lookup table or the like administering interchange control, changes the state of each of the field effect transistor M11 and the field effect transistor M12 to one of the on state and the off state, and changes one of the magnetoresistance effect element 10-1 and the magnetoresistance effect element 10-2 to be in the usable state.

For example, in a case in which the H voltage is input to the signal line SEL as a signal indicating an interchange request, the state of the field effect transistor M11 comes into the on state. For this reason, in this case, the magnetoresistance effect element 10-1 is changed to be in the usable state. On the other hand, in this case, the state of the field effect transistor M12 comes into the off state. For this reason, in this case, the magnetoresistance effect element 10-2 is changed into the unusable state.

For example, in a case in which the L voltage is input to the signal line SEL as a signal indicating an interchange request, the state of the field effect transistor M11 comes into the off state. For this reason, in this case, the magnetoresistance effect element 10-1 is changed to be in the unusable state. On the other hand, in this case, the state of the field effect transistor M12 comes into the on state. For this reason, in this case, the magnetoresistance effect element 10-2 is changed into the usable state.

For example, in a case in which one of the magnetoresistance effect element 10-1 and the magnetoresistance effect element 10-2 is determined as being defective in inspection after manufacturing of the memory cell MS5, the memory cell MS5 can cause the magnetoresistance effect element 10 that is not defective to be in the usable state and cause the magnetoresistance effect element 10 that is determined as being defective to be in the unusable state by using the interchange control unit 31.

Figure 14:
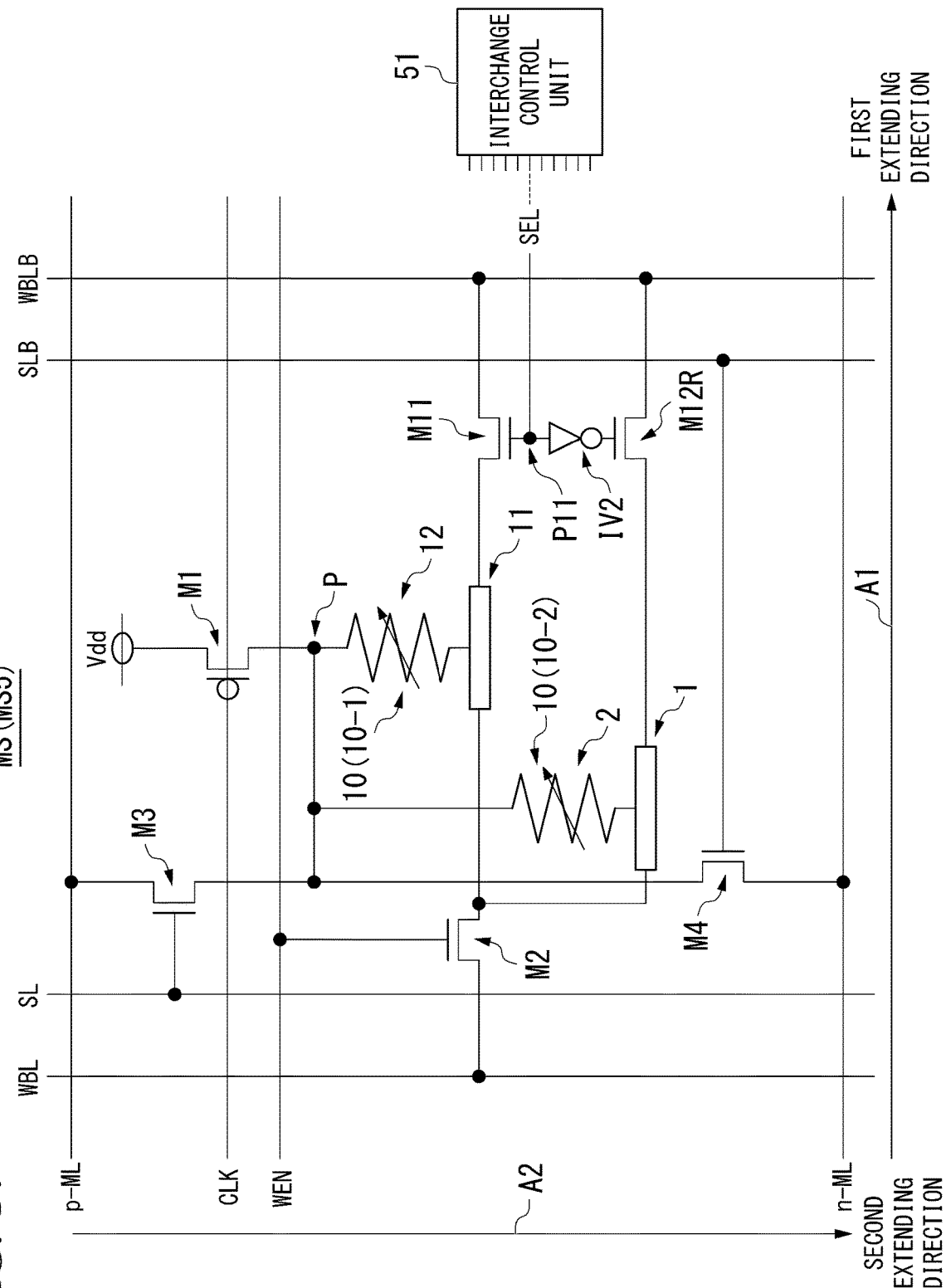
FIG. 14 is a diagram illustrating a fifth another example of the configuration of the memory cell MS.

In addition, as illustrated in FIG. 14, the memory cell MS5 may be configured to include a field effect transistor M12R that is an N-MOS field effect transistor in place of the field effect transistor M12 that is a P-MOS field effect transistor. In such a case, the memory cell MS5 further includes an inverter circuit IV2. FIG. 14 is a diagram illustrating a fifth another example of the configuration of the memory cell MS.

In the memory cell MS5 illustrated in FIG. 14, a connection point between a transmission line connecting the gate terminal of the field effect transistor M11 and the gate terminal of the field effect transistor M12R, and a signal line SEL are illustrated using a connection point P11. In the memory cell MS5, an input terminal of the inverter circuit IV2 is connected to the connection point P11 through a transmission line. In the memory cell MS5, an output terminal of the inverter circuit IV2 is connected to a gate terminal of the field effect transistor M12R through a transmission line. In accordance with this, although the field effect transistor M12R is not an N-MOS field effect transistor, the memory cell MS5 can have a function similar to that of the memory cell MS5 illustrated in FIG. 13.

In the memory cell MS5 illustrated in FIG. 14, both the field effect transistor M11 and the field effect transistor M12R are N-MOS field effect transistors, and thus the field effect transistors having the same configuration can be used as the field effect transistor M11 and the field effect transistor M12R. In accordance with this, in the memory cell MS5, the on resistance of the field effect transistor M11 and the on resistance of the field effect transistor M12R can be configured to be the same or almost the same. As a result, the memory cell MS5 can inhibit a detection margin of coincidence/non-coincidence between storage data and search data according to the magnetoresistance effect element 10-1 or the magnetoresistance effect element 10-2 from being impaired.

<Modified example 5 of circuit configuration of memory cell>

Figure 15:
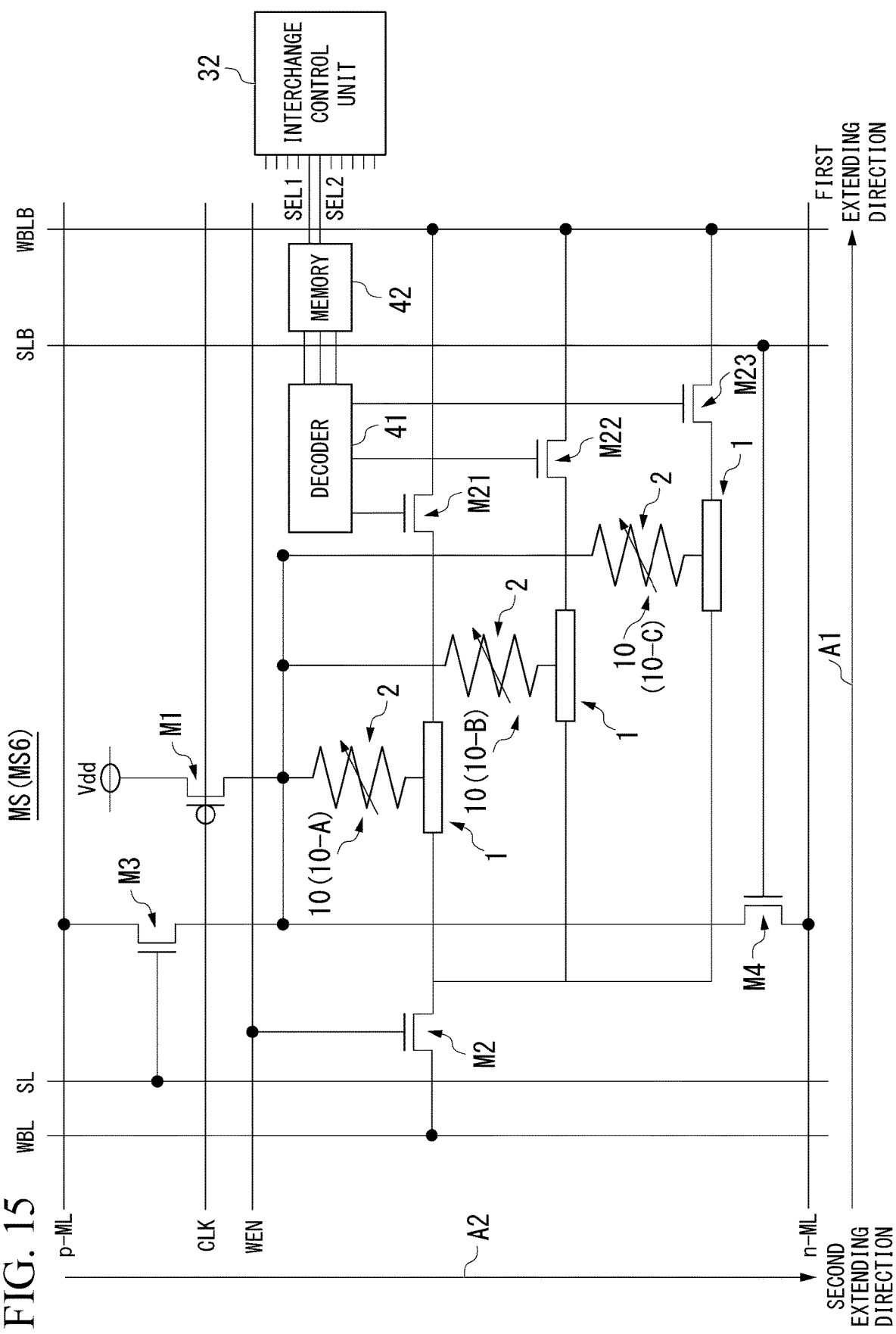
FIG. 15 is a diagram illustrating a sixth another example of the configuration of the memory cell MS.

For example, the circuit configuration of the memory cell MS may be a circuit configuration illustrated in FIG. 15 instead of the circuit configuration illustrated in FIG. 4. FIG. 15 is a diagram illustrating a sixth another example of the configuration of the memory cell MS. Hereinafter, for the convenience of description, the memory cell MS illustrated in FIG. 15 will be referred to as a memory cell MS6 in description.

The memory cell MS6 includes a plurality of magnetoresistance effect elements 10 for spare replacement in addition to the magnetoresistance effect element 10 used at the normal time described above. In the example illustrated in FIG. 15, a case in which the memory cell MS6 includes two magnetoresistance effect elements 10 as the plurality of magnetoresistance effect elements 10 used for spare replacement together with the magnetoresistance effect element 10 used at the normal time will be described as an example. Hereinafter, for the convenience of description, the magnetoresistance effect element 10 used at the normal time will be referred to as a magnetoresistance effect element 10-A, one among the two magnetoresistance effect elements 10 will be referred to as a magnetoresistance effect element 10-B, and the other among the two magnetoresistance effect elements 10 will be referred to as a magnetoresistance effect element 10-C in description.

In the memory cell MS6, as illustrated in FIG. 15, the magnetoresistance effect element 10-A to the magnetoresistance effect element 10-C are connected in parallel.

In addition, when one of the magnetoresistance effect element 10-A to the magnetoresistance effect element 10-C is used, the memory cell MS6 performs switching control of changing two magnetoresistance effect elements 10 among the magnetoresistance effect element 10-A to the magnetoresistance effect element 10-C to be in the unusable state and causing one magnetoresistance effect element 10 among the magnetoresistance effect element 10-A to the magnetoresistance effect element 10-C to be in the usable state. For this reason, the memory cell MS6 further includes three field effect transistors including a field effect transistor M21 to a field effect transistor M23.

In the example illustrated in FIG. 15, each of the field effect transistor M21 to the field effect transistor M23 is an N-NOS field effect transistor.

A drain terminal of the field effect transistor M21 is connected to the second write bit line WBLB through a transmission line. In addition, a source terminal of the field effect transistor M21 is connected to a second electrode 14 of the magnetoresistance effect element 10-A through a transmission line.

Hereinafter, for the convenience of description, the state of the field effect transistor M21 being the on state will be referred as the magnetoresistance effect element 10-A being in the usable state in description. In addition, hereinafter, for the convenience of description, the state of the field effect transistor M21 being the off state will be referred to as the magnetoresistance effect element 10-A being in the unusable state in description.

A drain terminal of the field effect transistor M22 is connected to the second write bit line WBLB through a transmission line. In addition, a source terminal of the field effect transistor M22 is connected to a second electrode 14 of the magnetoresistance effect element 10-B through a transmission line.

Hereinafter, for the convenience of description, the state of the field effect transistor M22 being the on state will be referred as the magnetoresistance effect element 10-B being in the usable state in description. In addition, hereinafter, for the convenience of description, the state of the field effect transistor M22 being the off state will be referred to as the magnetoresistance effect element 10-B being in the unusable state in description.

A drain terminal of the field effect transistor M23 is connected to the second write bit line WBLB through a transmission line. In addition, a source terminal of the field effect transistor M23 is connected to a second electrode 14 of the magnetoresistance effect element 10-C through a transmission line.

Hereinafter, for the convenience of description, the state of the field effect transistor M23 being the on state will be referred as the magnetoresistance effect element 10-C being in the usable state in description. In addition, hereinafter, for the convenience of description, the state of the field effect transistor M23 being the off state will be referred to as the magnetoresistance effect element 10-C being in the unusable state in description.

Gate terminals of the field effect transistor M21 to the field effect transistor M23 are connected to a decoder 41 that applies a voltage to each of the gate terminals in response to a second interchange request from the interchange control unit 32 through a transmission line. The interchange control unit 32 controls interchange of the magnetoresistance effect element 10-A to the magnetoresistance effect element 10-C from the outside. The interchange of the magnetoresistance effect element 10-A to the magnetoresistance effect element 10-C represents changing the magnetoresistance effect element 10, which is in the usable state, among the magnetoresistance effect element 10-A to the magnetoresistance effect element 10-C into the unusable state and changing any one of the magnetoresistance effect elements 10, which are in the unusable state, among the magnetoresistance effect element 10-1 and the magnetoresistance effect element 10-2 to be in the usable state. The second interchange request is a request for requesting the memory cell MS6 to perform interchange of the magnetoresistance effect element 10-A to the magnetoresistance effect element 10-C.

The decoder 41 is connected to a memory 42 through a transmission line. The memory 42 is connected to the interchange control unit 52 disposed outside through a transmission line. In the example illustrated in in FIG. 15, the memory 42 is connected to the interchange control unit 52 through a signal line SEL2 and a signal line SEL3 to which a selection signal for selecting the magnetoresistance effect element 10 desired to be used is input from the interchange control unit 52 and a rewrite line Strobe to which a rewrite signal for rewriting data stored in the memory 42 is input from the interchange control unit 52.

The interchange control unit 52, using a selection signal and a rewrite signal, temporarily stores data used for selecting the magnetoresistance effect element 10 desired to be used in the memory 42 and switches the state of each of the field effect transistor M21 to the field effect transistor M23 to one of the on state and the off state using the decoder 41 based on the data. For example, the data is a lookup table or the like that administers interchange of the magnetoresistance effect element 10-A to the magnetoresistance effect element 10-C. In this way, the interchange control unit 52 can change the magnetoresistance effect element 10 desired to be used to be in the usable state and change two magnetoresistance effect elements 10 other than the magnetoresistance effect element 10 to be in the unusable state.

In the memory cell MS6, for example, the memory 42 is a register. The memory cell MS6 may be configured to include a fuse in place of the memory 42.

<Configuration of Non-Volatile Associative Memory Device>

Figure 16:
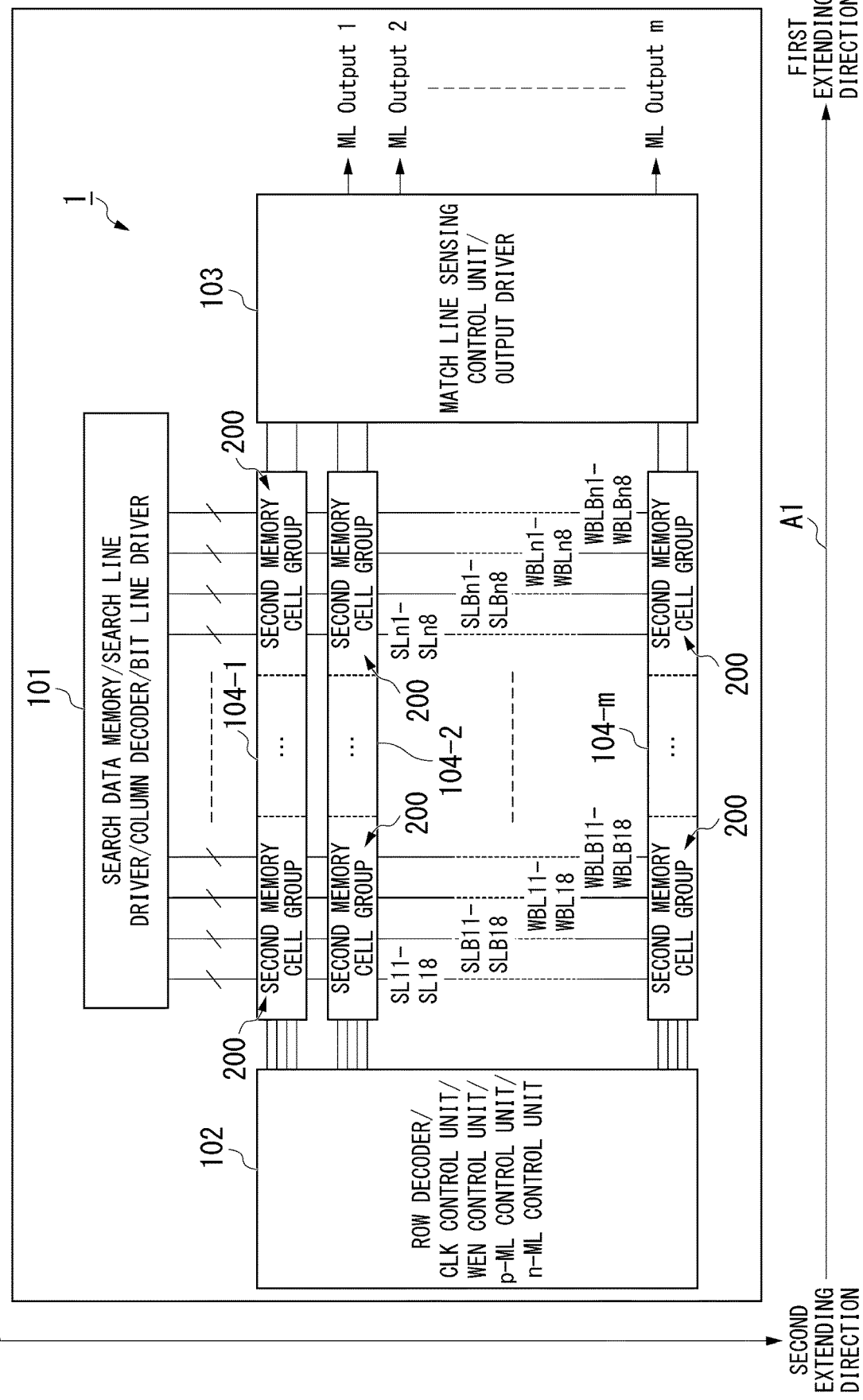
FIG. 16 is a diagram illustrating an example of the configuration of a non-volatile associative memory device 1.

Hereinafter, the configuration of the non-volatile associative memory device 1 including the memory cell MS illustrated in FIG. 4 will be described with reference to FIG. 16. FIG. 16 is a diagram illustrating an example of the configuration of the non-volatile associative memory device 1. In addition, the non-volatile associative memory device 1 may be configured to include some or all of the memory cell MS2 to the memory cell MS6 described above in place of the memory cell MS or in addition to the memory cell MS.

The non-volatile associative memory device 1 includes one or more first memory cell groups 104, a first control unit 101, a second control unit 102, and a third control unit 103. Hereinafter, a case in which the non-volatile associative memory device 1 includes m first memory cell groups 104 will be described as an example. For this reason, in FIG. 16, the m first memory cell groups 104 are respectively represented as a first memory cell group 104-1, a first memory cell group 104-2, . . . , a first memory cell group 104-$m$. Here, m may be any number as long as it is an integer equal to or greater than 1.

In the example illustrated in FIG. 16, m first memory cell groups 104 are arranged to be aligned in the second extending direction. Each of the m first memory cell groups 104 includes n second memory cell groups 200 not illustrated in FIG. 16. Here, n may be any number as long as it is an integer equal to or greater than 1. In each of the n second memory cell groups 200, a plurality of memory cells MS are arranged to be aligned in the first extending direction. In other words, in the non-volatile associative memory device 1, a plurality of memory cells MS are aligned in a lattice pattern.

The number of memory cells MS included in each of the n second memory cell groups 200 is, for example, 8. As described above, one-bit storage data is stored in one memory cell MS. In other words, in a case in which the number is 8, storage data corresponding to one byte is stored in one second memory cell group 200. In the non-volatile associative memory device 1 according to this embodiment, the first memory cell groups 104, the second memory cell groups 200, and the memory cells MS are respectively aligned in this way, and thus (8×n) rows each having m memory cells MS aligned therein in the second extending direction are aligned in the first extending direction. Hereinafter, for the convenience of description, each of these (8×n) rows of memory cells MS will be referred to as a memory cell row in description. The number of memory cells MS included in each of the n second memory cell groups 200 may be either smaller than 8 or larger than 8 as long as it is equal to or greater than 1.

A first search line SL, a second search line SLB, a first write bit line WBL, and a second write bit line WBLB included in each memory cell MS of the non-volatile associative memory device 1 are connected to the first control unit 101. In addition, m memory cells MS included in each memory cell row described above share one first search line SL, one second search line SLB, one first write bit line WBL, and one second write bit line WBLB.

Here, "SL11" illustrated in FIG. 16 represents the first search line SL that is shared by m memory cells MS included in a first memory cell row among (8×n) memory cell rows aligned in the first extending direction. In addition, "SL18" illustrated in FIG. 16 represents the first search line SL that is shared by m memory cells MS included in an eighth memory cell row among (8×n) memory cell rows aligned in the first extending direction. "SLn1" illustrated in FIG. 16 represents the first search line SL that is shared by m memory cells MS included in a (8×(n−1)+1)-th memory cell row among (8×n) memory cell rows aligned in the first extending direction. In addition, "SLn8" illustrated in FIG. 16 represents the first search line SL that is shared by m memory cells MS included in a (8×n)-th memory cell row among (8×n) memory cell rows aligned in the first extending direction.

"SLB11" illustrated in FIG. 16 represents the second search line SLB that is shared by m memory cells MS included in a first memory cell row among (8×n) memory cell rows aligned in the first extending direction. In addition, "SLB18" illustrated in FIG. 16 represents the second search line SLB that is shared by m memory cells MS included in an eighth memory cell row among (8×n) memory cell rows aligned in the first extending direction. "SLBn1" illustrated in FIG. 16 represents the second search line SLB that is shared by m memory cells MS included in a (8×(n−1)+1)-th memory cell row among (8×n) memory cell rows aligned in the first extending direction. In addition, "SLBn8" illustrated in FIG. 16 represents the second search line SLB that is shared by m memory cells MS included in an (8×n)-th memory cell row among (8×n) memory cell rows aligned in the first extending direction.

"WBL11" illustrated in FIG. 16 represents the first write bit line WBL that is shared by m memory cells MS included in a first memory cell row among (8×n) memory cell rows aligned in the first extending direction. In addition, "WBL18" illustrated in FIG. 16 represents the first write bit line WBL that is shared by m memory cells MS included in an eighth memory cell row among (8×n) memory cell rows aligned in the first extending direction. "WBLn1" illustrated in FIG. 16 represents the first write bit line WBL that is shared by m memory cells MS included in a (8×(n−1)+1)-th memory cell row among (8×n) memory cell rows aligned in the first extending direction. In addition, "WBLn8" illustrated in FIG. 16 represents the first write bit line WBL that is shared by m memory cells MS included in an (8×n)-th memory cell row among (8×n) memory cell rows aligned in the first extending direction.

"WBLB11" illustrated in FIG. 16 represents the second write bit line WBLB that is shared by m memory cells MS included in a first memory cell row among (8×n) memory cell rows aligned in the first extending direction. In addition, "WBLB18" illustrated in FIG. 16 represents the second write bit line WBLB that is shared by m memory cells MS included in an eighth memory cell row among (8×n) memory cell rows aligned in the first extending direction. "WBLBn1" illustrated in FIG. 16 represents the second write bit line WBLB that is shared by m memory cells MS included in a (8×(n−1)+1)-th memory cell row among (8×n) memory cell rows aligned in the first extending direction. In addition, "WBLBn8" illustrated in FIG. 16 represents the second write bit line WBLB that is shared by m memory cells MS included in an (8×n)-th memory cell row among (8×n) memory cell rows aligned in the first extending direction.

Here, the first search line SL, the second search line SLB, the first write bit line WBL, and the second write bit line WBLB included in each memory cell MS of the non-volatile associative memory device 1 are connected to the first control unit 101.

The first control unit 101 includes a search data memory that stores search data, a search line driver that applies one of the H voltage and the L voltage to each first search line SL and each second search line SLB in accordance with search data stored by the search data memory, a column decoder of an address, and a write bit line decoder that applies one of the H voltage and the L voltage to each first write bit line WBL and each second write bit line WBLB in accordance with storage data stored in each memory cell MS. Such functional units included in the first control unit 101 may be realized using any method. For this reason, detailed description of such functional units will be omitted.

Input ends of a clock line CLK, a write enable line WEN, a first match line p-ML, and a second match line n-ML included in each memory cell MS of the non-volatile associative memory device 1 are connected to the second control unit 102. In addition, (8×n) memory cells MS included in each first memory cell group 104 described above share one clock line CLK, one write enable line WEN, one first match line p-ML, and one second match line n-ML. In FIG. 16, in order to prevent complications of the drawing, illustration of the clock line CLK, the write enable line WEN, the first match line p-ML, and the second match line n-ML included in each memory cell MS included in each first memory cell group 104 using reference signs is omitted.

The second control unit 102 includes a row decoder of an address, a CLK control unit that performs pre-charging of the clock line CLK with the H voltage and input of a clock signal, a WEN control unit that performs pre-charging of the write enable line WEN with the L voltage and input of a write signal, a p-ML control unit that performs pre-charging of the first match line p-ML with the H voltage, and an n-ML control unit that performs pre-charging of the second match line n-ML with the L voltage. Such functional units included in the second control unit 102 may be realized using any method. For this reason, detailed description of such functional units will be omitted.

Output ends of the clock line CLK, the write enable line WEN, the first match line p-ML, and the second match line n-ML included in each memory cell MS of the non-volatile associative memory device 1 are connected to the third control unit 103.

The third control unit 103 includes a match line sensing control unit that detects an output voltage from the first match line p-ML and the second match line n-ML included in each memory cell MS (in other words, a combination of the first output voltage and the second output voltage) and an output driver. The output driver, for each memory cell MS included in the non-volatile associative memory device 1, outputs a signal indicating a detection result of coincidence/non-coincidence based on an output voltage from each of the first match line p-ML and the second match line n-ML included in the memory cell MS to other circuits, other devices, and the like. The signal indicating the detection result is a signal that indicates coincidence/non-coincidence between storage data and search data in the memory cell MS. Such functional units included in the third control unit 103 may be realized using any method.

Figure 17:
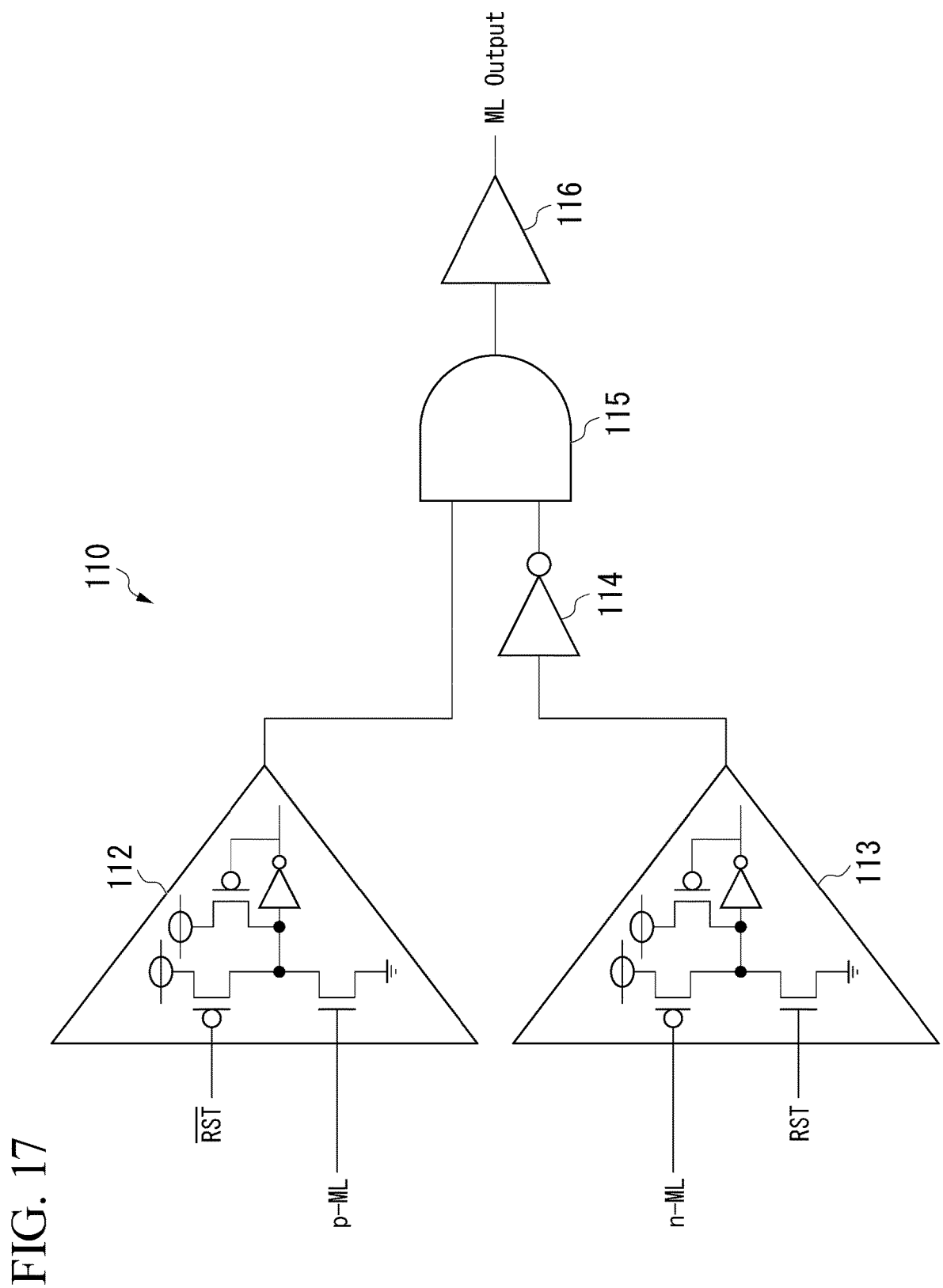
FIG. 17 is a diagram illustrating an example of the circuit configuration of a circuit 110.

For example, a circuit 110 including each of the match line sensing control unit and the output driver is realized using a circuit configuration illustrated in FIG. 17. FIG. 17 is a diagram illustrating an example of the circuit configuration of the circuit 110.

The circuit 110 includes a comparator 112, a comparator 113, an inverter circuit 114, an AND circuit 115, and an output driver 116. As illustrated in FIG. 17, the first output voltage output from the first match line p-ML shared by each group of a plurality of memory cells MS aligned in one row in the first extending direction in the non-volatile associative memory device 1 is input to a non-inverted input terminal of the comparator 112. As illustrated in FIG. 17, the second output voltage output from the second match line n-ML shared by each group is input to an inverted input terminal of the comparator 113. In accordance with this, the circuit 110 compares the first output voltage with the second output voltage and, in a case in which it is determined that such output voltages are the same voltages, outputs a signal indicating that the storage data and the search data do not coincide with each other from the output driver 116 as ML Output. On the other hand, in a case in which the first output voltage is compared with the second voltage, and it is determined that such output voltages are voltages different from each other, the circuit 110 outputs a signal indicating that the storage data and the search data coincide with each other from the output driver 116 as ML Output. Hereinafter, for the convenience of description, the signal will be referred to as a detection result signal in description. FIG. 18 is a diagram illustrating an example of a truth table for an operation of comparing a first output voltage with a second output voltage in the circuit 110 and outputting a detection result signal.

Each of "ML Output 1" to "ML Output m" illustrated in FIG. 16 represents a signal indicating a detection result based on output voltages output from the first match line p-ML and the second match line n-ML of each first memory cell group 104.

By employing such a configuration, the non-volatile associative memory device 1, for example, performs a completely parallel search. A method for performing the completely parallel search may be a known method or a method to be developed in the future. In addition, the non-volatile associative memory device 1 may employ a configuration for performing a search using another method instead of the configuration for performing the completely parallel search.

<Another Example 1 of Non-Volatile Associative Memory Device>

The memory cell MS described above may be configured to be included in a non-volatile associative memory device 1X to be described below instead of the non-volatile associative memory device 1.

The non-volatile associative memory device 1X is a three-value associative memory device, which is different from the non-volatile associative memory device 1 that is a binary associative memory device.

The non-volatile associative memory device 1X includes a second memory cell group 210 in place of the second memory cell group 200.

The second memory cell group 210 includes 8 memory cells MS and one valid bit memory cell as a second memory cell BS.

The second memory cell BS is a memory cell that stores a value indicating "Don't care", in other words, data indicating "X". For example, the non-volatile associative memory device 1X is, for example, a three-value associative memory device of a completely parallel type. The second memory cell BS may be any memory cell as long as it is a memory cell capable of storing the data. The configurations of a first control unit 101, a second control unit 102, and a third control unit 103 included in the non-volatile associative memory device 1X are almost the same as the configurations of the first control unit 101, the second control unit 102, and the third control unit 103 included in the non-volatile associative memory device 1, and thus description thereof will be omitted.

Figure 19:
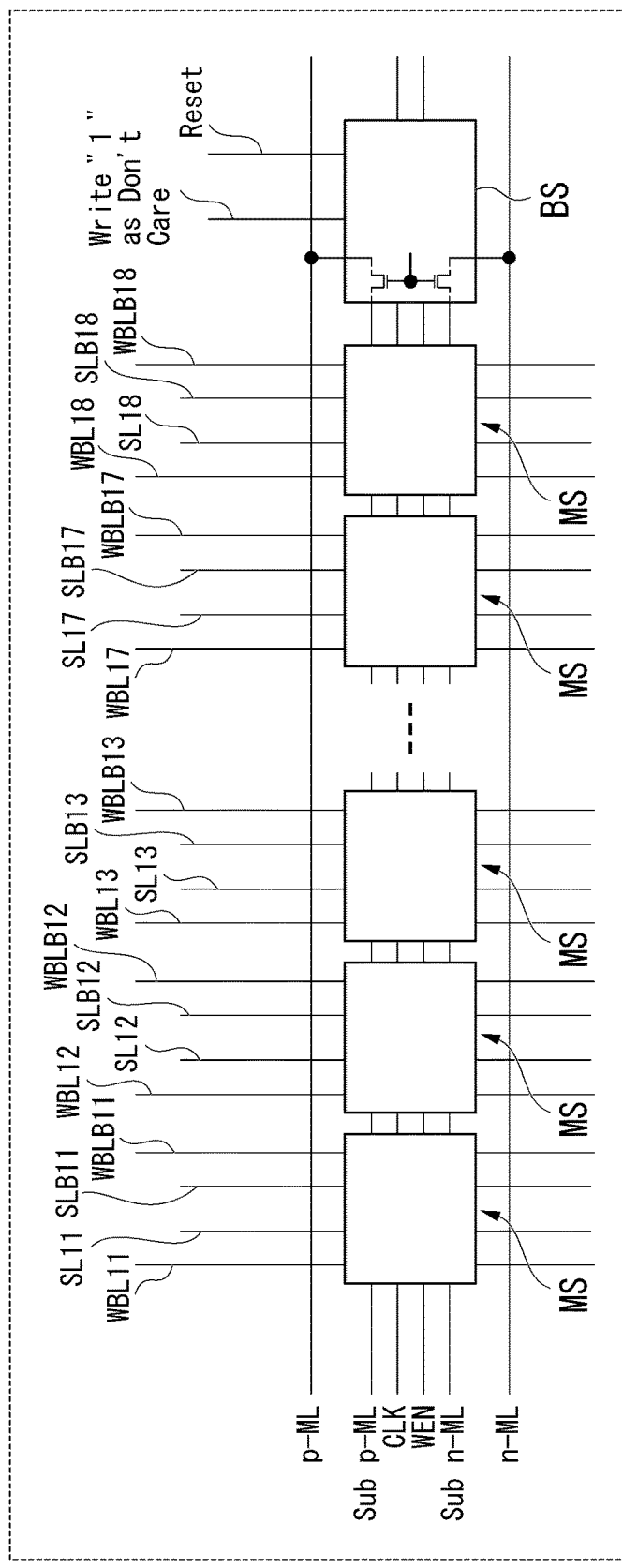
FIG. 19 is a diagram illustrating an example of the configuration of a second memory cell group 210 included in a non-volatile associative memory device 1X.

Here, FIG. 19 is a diagram illustrating an example of the configuration of the second memory cell group 210 included in the non-volatile associative memory device 1X.

In a certain second memory cell group 210, a second memory cell BS is aligned in the first extending direction together with eight memory cells MS included in the second memory cell group 210. In the example illustrated in FIG. 19, inside the second memory cell group 210, the second memory cell BS is arranged at a position farthest from the first control unit 101 on a side in the first extending direction.

As described above, each of 8 memory cells MS included in the second memory cell group 210 stores one-bit data and thus can store only one of "0" and "1". Thus, for example, the second memory cell BS has a function of regarding that storage data and search data coincide with each other for all the eight memory cells MS when a logical value "1" is input (for example, the H voltage described above is input). In this way, by including the second memory cell BS in the second memory cell group 210, the non-volatile associative memory device 1X can be configured to have the function of the three-value associative memory device as described above. The operation of the second memory cell group 210 including the second memory cell BS is a well-known operation, and thus description thereof will be omitted.

Figure 20:
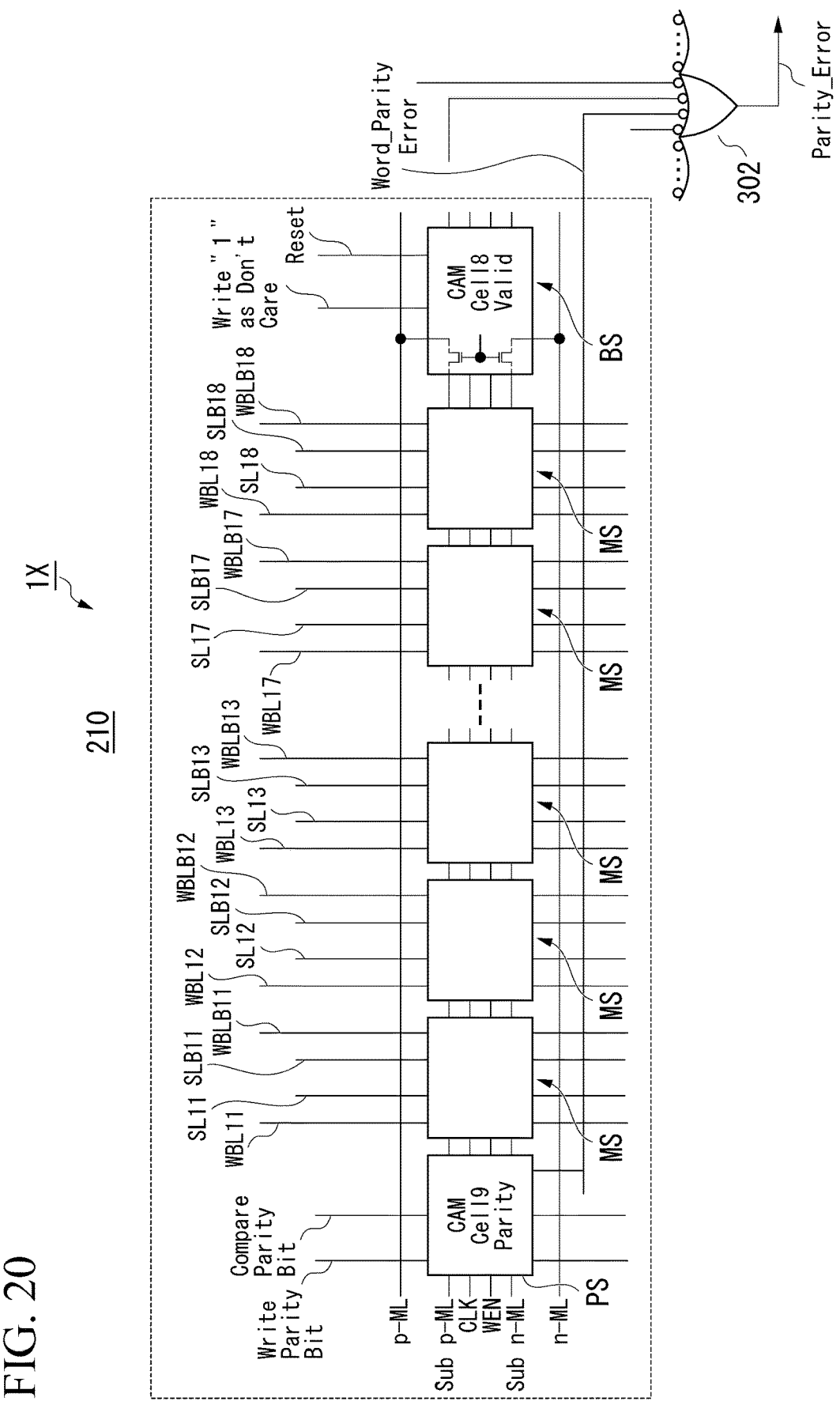
FIG. 20 is a diagram illustrating an example of the configuration of the second memory cell group 210 including a third memory cell PS.

In addition, as illustrated in FIG. 20, each second memory cell group 210 included in such a non-volatile associative memory device 1X, as described above, may be configured to further include a memory cell storing a parity bit as a third memory cell PS. In such a case, the non-volatile associative memory device 1X includes a multi-input exclusive logical sum logical circuit 302 that is an arithmetic operation circuit of parities together with the third memory cell PS. FIG. 20 is a diagram illustrating an example of the configuration of the second memory cell group 210 including the third memory cell PS.

The third memory cell PS may be any memory cell as long as it is a memory cell capable of storing a parity bit. In the second memory cell group 210 illustrated in FIG. 20, the third memory cell PS is aligned in the first extending direction together with 8 memory cells MS and the second memory cell BS included in the second memory cell group 210. In the example illustrated in FIG. 20, the third memory cell PS is arranged at a position closest to the first control unit 101 inside the second memory cell group 210. The third memory cell PS is connected to the multi-input exclusive logical sum logical circuit 302 included in the non-volatile associative memory device 1X through a transmission line. The operations of the second memory cell group 210 including the third memory cell PS and the multi-input exclusive logical sum logical circuit 302 are well known operations, and thus description thereof will be omitted.

<Modified Example of Magnetoresistance Effect Element Included in Memory Cell>

Figure 21:
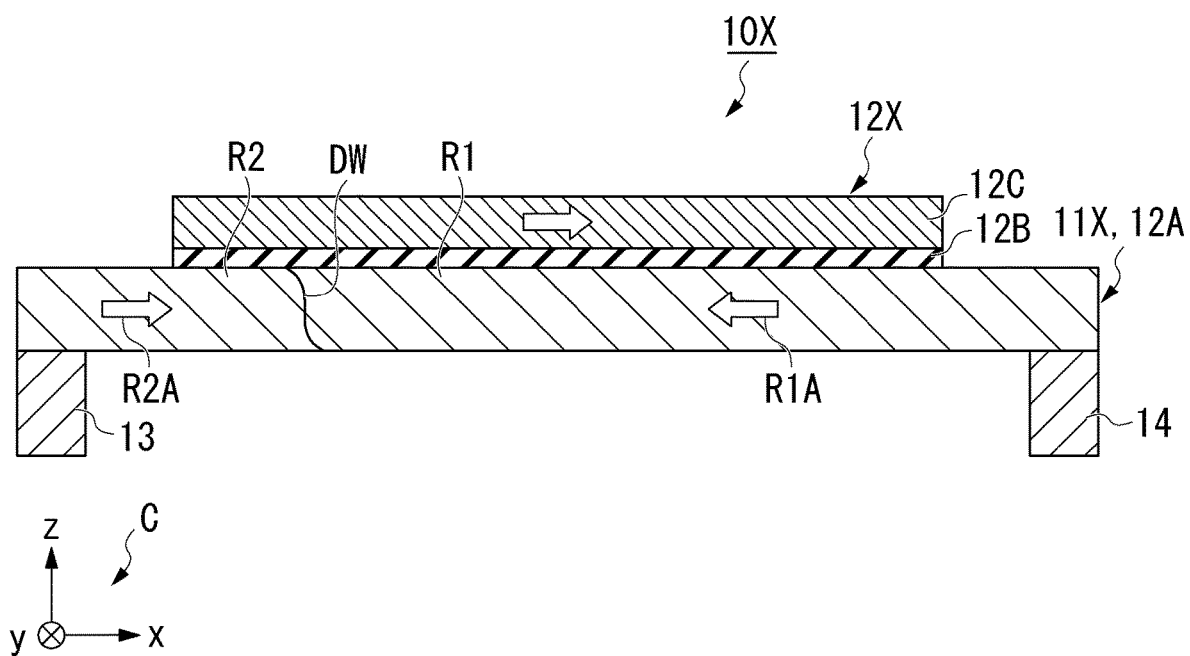
FIG. 21 is a diagram illustrating an example of the configuration of a magnetoresistance effect element 10A.

Hereinafter, a modified example of the magnetoresistance effect element included in the memory cell MS will be described with reference to FIG. 21. The memory cell MS may be configured to include a magnetoresistance effect element 10A to be described below in place of the magnetoresistance effect element 10 described above. FIG. 21 is a diagram illustrating an example of the configuration of the magnetoresistance effect element 10A.

The magnetoresistance effect element 10A is a magnetoresistance effect element of the domain wall movement type. The magnetoresistance effect element 10A includes a first member 11X and a second member 12X of which at least a part is stacked in a first direction with respect to the first member 11X.

A current flows through the first member 11X. The first member 11X extends in a second direction.

The first member 11X includes the first ferromagnetic layer 12A described above. The first ferromagnetic layer 12A has a domain wall DW inside thereof. Here, the first ferromagnetic layer 12A illustrated in FIG. 21 is included in the first member 11X and thus has a shape and a size that are different from those of the first ferromagnetic layer 12A illustrated in FIG. 4 and has a shape corresponding to the shape of the first member 11X. The domain wall DW is a boundary between a magnetic domain R1 and a magnetic domain R2 of which directions of magnetization are directions opposite to each other inside the first ferromagnetic layer 11A. In other words, the first member 11X has two magnetic domains including the magnetic domain R1 and the magnetic domain R2 inside thereof. A direction R1A of an arrow illustrated in FIG. 21 illustrates an example of a direction of magnetization in the magnetic domain R1. In the example illustrated in FIG. 21, the direction R1A coincides with a negative direction of the X axis. A direction R2A of an arrow illustrated in FIG. 21 illustrates an example of a direction of magnetization in the magnetic domain R2. In the example illustrated in FIG. 21, the direction R2A coincides with a positive direction of the X axis.

In addition, below an end on the magnetic domain R1 side among ends of the first member 11X, the first electrode 13 described above is disposed through the first magnetization fixing part B11 that is not illustrated.

The first magnetization fixing part B11 contains a ferromagnetic material. In the first magnetization fixing part B11, the direction of magnetization is fixed. The direction of magnetization of the first magnetization fixing part B11 coincides with the direction of magnetization in the magnetic domain R1 and, in the example illustrated in FIG. 21, coincides with the negative direction of the X axis.

A material composing the first magnetization fixing part B11 may be any material as long as it is a material that can be used for composing the first ferromagnetic layer 12A.

In order to fix the magnetization, the structure of the first magnetization fixing part B11 may be a synthetic structure formed using a ferromagnetic layer and a non-magnetic layer or may be a synthetic structure formed using an antiferromagnetic layer, a ferromagnetic layer, and a non-magnetic layer. In a case in which the structure of the first magnetization fixing part B11 is the synthetic structure formed using the antiferromagnetic layer, the ferromagnetic layer, and the non-magnetic layer, the direction of magnetization of the first magnetization fixing part B11 is maintained more strongly by the antiferromagnetic layer. For this reason, in this case, it is difficult for the magnetization of the first magnetization fixing part B11 to have influences from the outside.

Below an end on the magnetic domain R2 side among ends of the first member 11X, the second electrode 14 described above is disposed through a second magnetization fixing part B12 that is not illustrated.

The second magnetization fixing part B12 contains a ferromagnetic material. In the second magnetization fixing part B12, the direction of magnetization is fixed. The direction of magnetization of the second magnetization fixing part B12 coincides with the direction of magnetization in the magnetic domain R2 and, in the example illustrated in FIG. 21, coincides with the positive direction of the X axis.

A material composing the second magnetization fixing part B12 may be any material as long as it is a material that can be used for composing the first ferromagnetic layer 12A.

In order to fix the magnetization, the structure of the second magnetization fixing part B12 may be a synthetic structure formed using a ferromagnetic layer and a non-magnetic layer or may be a synthetic structure formed using an antiferromagnetic layer, a ferromagnetic layer, and a non-magnetic layer. In a case in which the structure of the second magnetization fixing part B12 is the synthetic structure formed using the antiferromagnetic layer, the ferromagnetic layer, and the non-magnetic layer, the direction of magnetization of the second magnetization fixing part B12 is maintained more strongly by the antiferromagnetic layer. For this reason, it is difficult for the magnetization of the second magnetization fixing part B12 to have influences from the outside.

In this way, the first magnetization fixing part B11 is disposed between the first member 11X and the first electrode 13, and thus, in a case in which a current is caused to flow from the first electrode 13 to the second electrode 14 sequentially through the first magnetization fixing part B11 and the first member 11X, spin-polarized electrons flow from the second electrode 14 to the first electrode 13 in the first member 11X in the same direction as the direction of magnetization of the first magnetization fixing part B11. More specifically, in a case in which a voltage is applied between the first electrode 13 and the second electrode 14 such that the electric potential of the second electrode 14 is lower than the ground electric potential to which the first electrode 13 is grounded, the electrons flow from the first electrode 13 to the second electrode 14 in the first member 11X.

In addition, the second magnetization fixing part B12 is disposed between the first member 11X and the first electrode 13, and thus, in a case in which a current is caused to flow from the second electrode 14 to the first electrode 13 sequentially through the second magnetization fixing part B12 and the first member 11X, spin-polarized electrons flow from the first electrode 13 to the second electrode 14 in the first member 11X in the same direction as the direction of magnetization of the second magnetization fixing part B12. More specifically, in a case in which a voltage is applied such that the electric potential of the second electrode 14 is higher than the ground electric potential to which the first electrode 13 is grounded, the electrons flow from the first electrode 13 to the second electrode 14 in the first member 11X.

The second member 12X includes a second ferromagnetic layer 12C and a non-magnetic layer 12B. For this reason, according to the magnetoresistance effect element 10A, the resistance value of the magnetoresistance effect element 10A changes in accordance with a relative angle between the direction of magnetization of the first ferromagnetic layer 12A included in the first member 11X and the direction of magnetization of the second ferromagnetic layer 12C included in the second member 12X. In this embodiment, the resistance value of the magnetoresistance effect element 10A is a magnitude of the electrical resistance between the second ferromagnetic layer 12C and the second electrode 14.

In the second member 12X, the first ferromagnetic layer 12A and the non-magnetic layer 12B, as illustrated in FIG. 21, are stacked in the first direction in order of the non-magnetic layer 12B and the first ferromagnetic layer 12A.

Here, in a case in which the position of the domain wall DW is moved inside the first member 11X, inside the first member 11X, a ratio between a volume occupied by the magnetic domain R1 and a volume occupied by the magnetic domain R2 changes. In the example illustrated in FIG. 21, the direction of magnetization of the second ferromagnetic layer 12C is a direction that is the same as the direction R2A of magnetization of the magnetic domain R2 and is a direction opposite to the direction R1A of magnetization of the magnetic domain R1.

When the second member 12X is seen in the negative direction of the Z axis, an area in which the first ferromagnetic layer 12A and the magnetic domain R2 overlap each other is widened when the domain wall DW is moved in the positive direction of the X axis. As a result, in this case, the resistance value of the magnetoresistance effect element 10A decreases in accordance with a magnetoresistance effect. On the other hand, when the domain wall DW is moved in the negative direction of the X axis, the area is narrowed. As a result, in this case, the resistance value of the magnetoresistance effect element 10A increases in accordance with the magnetoresistance effect.

Here, as described above, in the second member 12X, the domain wall DW is moved in accordance with a current flowing between the first electrode 13 and the second electrode 14.

In other words, in this example, in a case in which a current is caused to flow from the second electrode 14 to the first electrode 13, the magnetic domain R1 expands in the direction of the magnetic domain R2. As a result, the domain wall DW moves in the direction of the magnetic domain R2. On the other hand, in this example, in a case in which a current flows from the first electrode 13 to the second electrode 14, the magnetic domain R2 expands in the direction of the magnetic domain R1. As a result, the domain wall DW moves in the direction of the magnetic domain R1.

In this way, in the second member 12X, by setting the direction and the intensity of a current flowing between the first electrode 13 and the second electrode 14, the position of the domain wall DW is changed, and the resistance value of the magnetoresistance effect element 10A changes. As a result, the magnetoresistance effect element 10A illustrated in FIG. 21 can be configured to have a function similar to that of the magnetoresistance effect element 10 illustrated in FIG. 1.

<Method for Monitoring Change in Resistance Value of Magnetoresistance Effect Element>

In the memory cell MS included in the non-volatile associative memory device 1 described above, the state of the memory cell MS can be changed to a monitoring state.

Here, the monitoring state is a state in which all the writing state, the reading state, and the comparison calculation state described above are realized in parallel. In other words, in the monitoring state, the memory cell MS can perform three operations including the writing operation, the reading operation, and the comparison calculation operation in parallel. Here, in the memory cell MS that is in the monitoring state, in a case in which the H voltage is applied to the first write bit line WBL, a voltage applied to the second write bit line WBLB is not the voltage Vsink but the L voltage. As described above, a read current flowing from the magnetoresistance effect element 10 is led to the second write bit line WBLB. On the other hand, in the memory cell MS that is in the monitoring state, in a case in which the L voltage is applied to the first write bit line WBL, a voltage applied to the second write bit line WBLB is not the voltage Vsink but the H voltage. A read current flowing from the magnetoresistance effect element 10 is led to not the second write bit line WBLB but the first write bit line WBL.

It cannot be realized for the memory cell MS to be able to perform three operations including the wiring operation, the reading operation, and the comparison calculation operation in parallel in a conventional memory cell including a magnetoresistance effect element of a two-terminal type (for example, a magnetoresistance effect element of a spin transfer type or the like). The reason for this is that, in the memory cell, a path in which a current flows to the magnetoresistance effect element in a case in which storage data is written into the magnetoresistance effect element and a path in which a current flows to the magnetoresistance effect element in a case in which storage data is read from the magnetoresistance effect element are the same.

In a case in which the state of the memory cell MS is changed to the monitoring state, in the memory cell MS, writing of storage data into the magnetoresistance effect element 10, reading of the storage data, and comparison between search data input to the memory cell MS and the storage data can be performed in parallel. This means that a process in which the resistance value of the magnetoresistance effect element 10 changes can be monitored from the outside.

Figure 22:
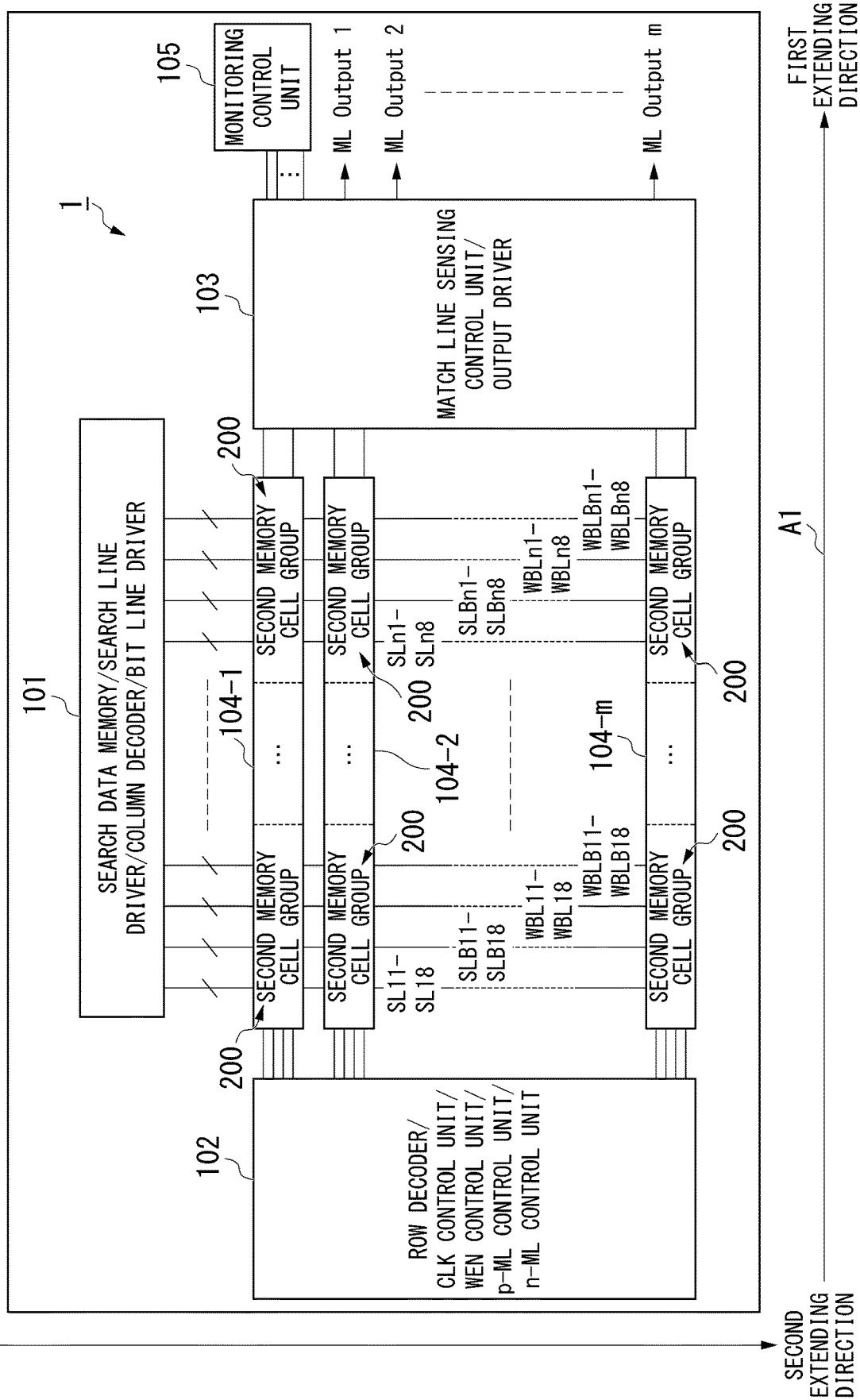
FIG. 22 is a diagram illustrating an example of the configuration of a non-volatile associative memory device 1 including a monitoring control unit 105.

In the non-volatile associative memory device 1, in a case in which the process of change of the magnetoresistance effect element 10 is monitored from the outside, for example, as illustrated in FIG. 22, the non-volatile associative memory device 1 further includes a monitoring control unit 105. FIG. 22 is a diagram illustrating an example of the configuration of the non-volatile associative memory device 1 including the monitoring control unit 105.

The monitoring control unit 105 acquires a read current led to the first write bit line WBL or the second write bit line WBLB in accordance with the resistance value of each magnetoresistance effect element 10 from the third control unit 103. Then, for each of a plurality of magnetoresistance effect elements 10 included in the non-volatile associative memory device 1, the monitoring control unit 105 outputs the read current acquired from the third control unit 103 to another device (for example, an information processing device such as a personal computer (PC)) and causes the device to display the read current. In this way, in the memory cell MS and the non-volatile associative memory device 1 illustrated in FIG. 22, in writing storage data into the magnetoresistance effect element 10 included in the non-volatile associative memory device 1, a aspect of destruction of the magnetoresistance effect element 10, a aspect of deterioration, a aspect of magnetization inversion for a current threshold, and a aspect of a defect in each of the first field effect transistor M1 to the fourth field effect transistor M4, and the like can be monitored. As a result, the memory cell MS and the non-volatile associative memory device 1 illustrated in FIG. 22 can improve the reliability of at least one of writing or reading for the magnetoresistance effect element 10 included in the non-volatile associative memory device 1.

Figure 23:
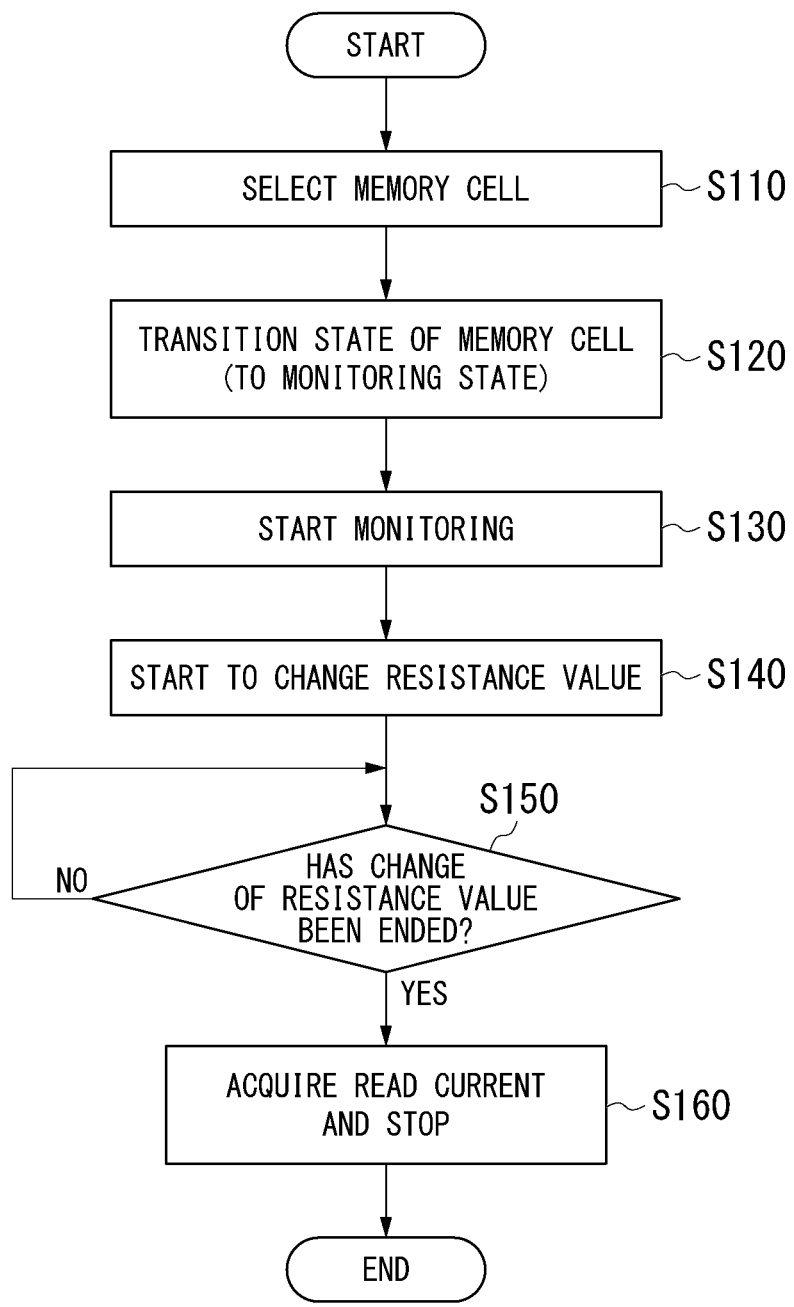
FIG. 23 is a diagram illustrating an example of the flow of a method of monitoring a process of changing a resistance value of each magnetoresistance effect element 10 included in the non-volatile associative memory device 1 illustrated in FIG. 22.

FIG. 23 is a diagram illustrating an example of the flow of a method of monitoring a process of changing a resistance value of each magnetoresistance effect element 10 included in the non-volatile associative memory device 1 illustrated in FIG. 22. The configuration of the monitoring control unit 105 may be any configuration as long as it can realize the flow of the method illustrated in FIG. 23.

A user performing a certain operation on the non-volatile associative memory device 1 performs an operation, for example, using an information processing device on the monitoring control unit 105 and selects a memory cell MS including the magnetoresistance effect element 10 that is a monitoring target among a plurality of memory cells MS included in the non-volatile associative memory device 1 as a target memory cell (Step S110). The information processing device is an information processing device that is connected to the first control unit 101, the second control unit 102, the third control unit 103, and the monitoring control unit 105. In other words, in Step S110, a user transitions the state of the monitoring control unit 105 to a state in which a read current led to the first write bit line WBL or the second write bit line WBLB included in the target memory cell can be acquired from the third control unit 103. Hereinafter, for the convenience of description, a user performing a certain operation on the non-volatile associative memory device 1 will be simply referred to as a user in description.

Next, the user performs an operation using the information processing device on the first control unit 101 and the second control unit 102 and transitions the state of the target memory cell to the monitoring state (Step S120).

Next, the user performs an operation using the information processing device on the monitoring control unit 105, and, for example, the monitoring control unit 105 causes a display unit of the information processing device to start to display a graph representing a change of the read current, which is acquired from the third control unit 103, with respect to time. In accordance with this, the user starts to monitor the process of change in the read current lead to the second write bit line WBLB included in the target memory cell, in other words, the process of change of the magnetoresistance effect element 10 included in the target memory cell (Step S130). In addition, almost simultaneously with Step S130, the resistance value of the target memory cell starts to change (Step S140). In FIG. 23, although Step S140 is drawn after Step S130, the steps may be represented as one step.

Next, the user checks the graph displayed in the display unit of the information processing device and waits until writing of the storage data into the magnetoresistance effect element 10 included in the target memory cell is completed, in other words, until change in the resistance value of the magnetoresistance effect element 10 ends (Step S150).

In a case in which it is determined that the change in the resistance value of the magnetoresistance effect element 10 has ended (Step S150: Yes), the user performs an operation using the information processing device on the monitoring control unit 105, for example, stops acquisition of the read current from the third control unit 103 using the monitoring control unit 105 (Step S160), and ends the monitoring of the process of change in the resistance value of the magnetoresistance effect element 10 included in the target memory cell.

In addition, a configuration in which the user performs the method of the flowchart illustrated in FIG. 23 for some or all of the plurality of memory cells MS, which are included in the non-volatile associative memory device 1 illustrated in FIG. 22, in parallel may be employed.

In this way, the user can perform monitoring of the process of change in the resistance value of the magnetoresistance effect element 10 included in each memory cell MS included in the non-volatile associative memory device 1 illustrated in FIG. 22. As a result, the memory cell MS and the non-volatile associative memory device 1 illustrated in FIG. 22 can improve the reliability of at least one of writing and reading for the magnetoresistance effect element 10 included in the non-volatile associative memory device 1.

Modified Example 6 of Circuit Configuration of Memory Cell

The memory cell MS may be configured as a non-volatile memory cell instead of the non-volatile associative memory cell. Hereinafter, for the convenience of description, a memory cell MS configured as a non-volatile memory cell will be referred to as a memory cell MS7 in description.

Figure 24:
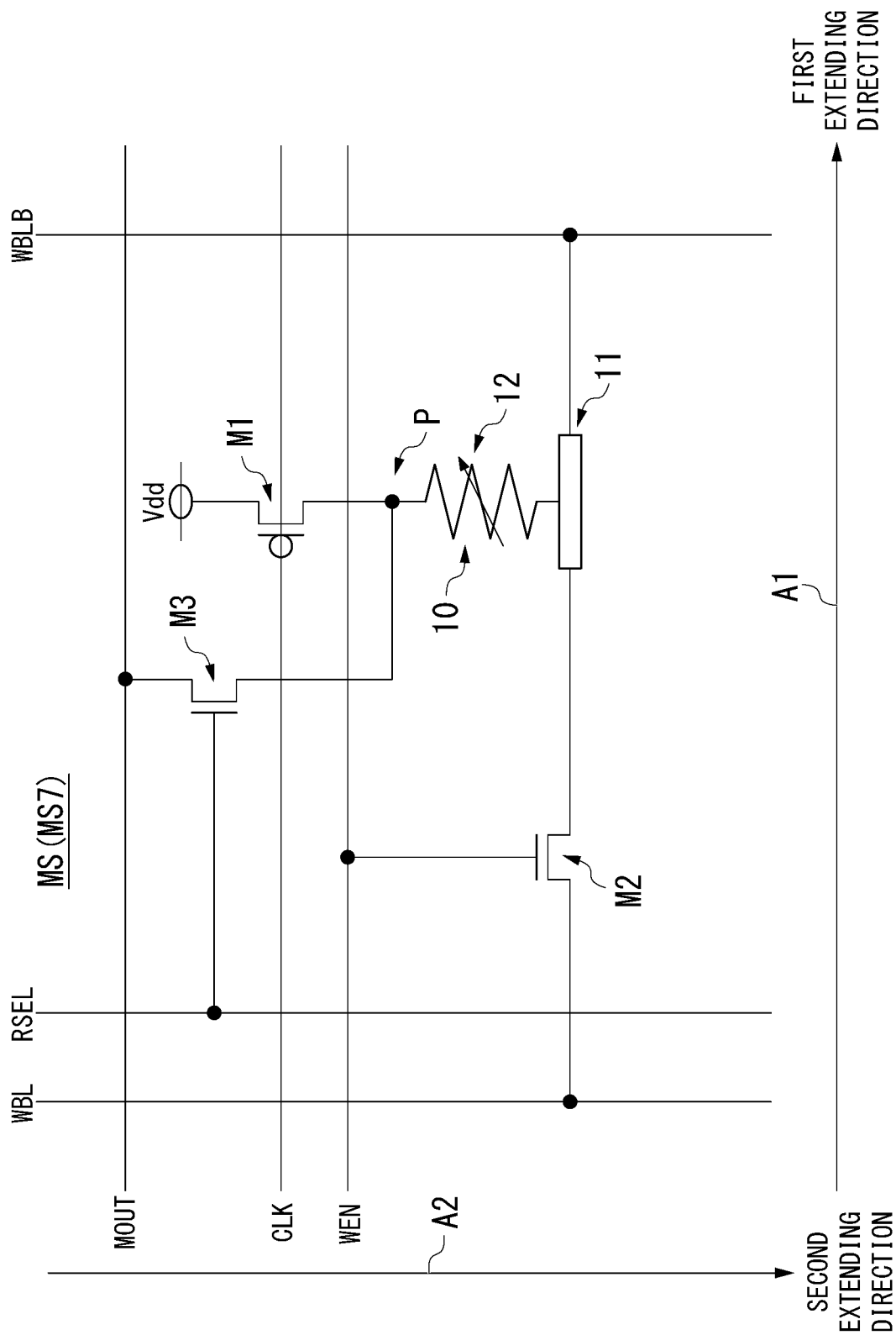
FIG. 24 is a diagram illustrating an example of the configuration of the memory cell MS7.

FIG. 24 is a diagram illustrating an example of the configuration of the memory cell MS7.

In the example illustrated in FIG. 24, the memory cell MS7 includes a selection line RSEL in place of the first search line SL. This may be understood that the first search line SL is used as the selection line RSEL in the memory cell MS7. For this reason, the gate terminal of the third field effect transistor M3 is connected to the selection line RSEL in place of the first search line SL. The selection line RSEL is a transmission line that extends in the second extending direction. The H voltage or the L voltage is applied to an input end of the selection line RSEL from the outside.

In addition, in the example illustrated in FIG. 24, the memory cell MS7 includes a monitoring output line MOUT in place of the first match line p-ML. This may be understood that the first match line p-ML is used as the monitoring output line MOUT in the memory cell MS7. For this reason, the drain terminal of the third field effect transistor M3 is connected to the monitoring output line MOUT in place of the first match line p-ML. The monitoring output line MOUT is a transmission line that extends in the first extending direction. Here, different from the input end of the first match line p-ML, the input end of the monitoring output line MOUT is open. In addition, the input end of the monitoring output line MOUT may be configured to be pulled up in accordance with the power supply voltage Vdd.

In the example illustrated in FIG. 24, the memory cell MS7 does not include the second search line SLB, the second match line n-ML, and the fourth field effect transistor M4. For this reason, the connection point P is connected to the source terminal of the third field effect transistor.

In a case in which the memory cell MS7 having the circuit configuration as described above performs a writing operation, in other words, in a case in which storage data is written into the magnetoresistance effect element 10 of the memory cell MS7, the state of the memory cell MS7 needs to be changed to the writing state. In the memory cell MS7 that is in the writing state, the H voltage is applied to the clock line CLK from the outside, and the state of the first field effect transistor M1 comes into the off state. In addition, in the memory cell MS7, a write signal is input to the write enable line WEN from the outside, and the state of the second field effect transistor M2 comes into the on state.

For this reason, in the memory cell MS7 that is in the writing state, a current corresponding to a voltage difference between the first write bit line WBL and the second write bit line WBLB flows between the first electrode 13 and the second electrode 14 of the first member 11 of the magnetoresistance effect element 10. For example, in the memory cell MS7, in a case in which the H voltage is applied to the first write bit line WBL, the L voltage is applied to the second write bit line WBLB, and a current flows from the first electrode 13 to the second electrode 14 in the first member 11. On the other hand, for example, in the memory cell MS7, in a case in which the L voltage is applied to the first write bit line WBL, the H voltage is applied to the second write bit line WBLB, and a current flows from the second electrode 14 to the first electrode 13 in the first member 11. In a case in which a current flows between the first electrode 13 and the second electrode 14, as described above, the resistance value of the second member 12 of the magnetoresistance effect element 10 changes in accordance with the flowing current. In other words, in the memory cell MS7, the resistance value of the magnetoresistance effect element 10 (in other words, storage data stored in the memory cell MS) is rewritten in accordance with voltages applied to the first write bit line WBL and the second write bit line WBLB.

In accordance with the operation described above, the memory cell MS7 rewrites the storage data stored in the memory cell MS7 that is in the writing state in response to a request from the outside.

In a case in which the memory cell MS7 performs a reading operation, in other words, in a case in which storage data is read from the magnetoresistance effect element 10 of the memory cell MS7, the state of the memory cell MS7 needs to be changed to the reading state. In the memory cell MS7 that is in the reading state, the voltage Vsink close to the ground voltage is applied to the second write bit line WBLB from the outside. Then, in the memory cell MS7, the second write bit line WBLB leads a current as a leading terminal (in other words, SINK) of a read current read from the read circuit RC. In the memory cell MS7, the L voltage is applied to the write enable line WEN from the outside, and the state of the second field effect transistor M2 comes into the off state.

In addition, in the memory cell MS7 that is in the reading state, a clock signal is input to the clock line CLK from the outside in accordance with a timing at which storage data stored in the magnetoresistance effect element 10 is read. In accordance with this, the state of the first field effect transistor M1 comes into the on state. As a result, in the memory cell MS7, a current flows from the second ferromagnetic layer 12C of the magnetoresistance effect element 10 to the second write bit line WBLB through the second electrode 14. In other words, in the memory cell MS, the current flowing from the second ferromagnetic layer 12C to the second electrode 14 in this way is led to the second write bit line WBLB as a read current. Thereafter, the read current led to the second write bit line WBLB is output to the outside.

In accordance with the operation as above, the non-volatile memory device 1A outputs storage data stored in the memory cell MS7 that is in the reading state in response to a request from the outside.

Here, as described above, the memory cell MS7 is a non-volatile memory cell.

For this reason, the memory cell MS7 does not perform the comparison calculation operation. Instead of that, similar to the memory cell MS, the memory cell MS7 can change the state to the monitoring state. The monitoring state in the memory cell MS7 is a state in which the writing state and the reading state are realized in parallel. In other words, in the monitoring state, the memory cell MS7 can perform two operations including a writing operation and a reading operation in parallel. In the memory cell MS7 that is in the monitoring state, in a case in which the H voltage is applied to the first write bit line WBL, the voltage applied to the second write bit line WBLB is not the voltage Vsink but the L voltage. Then, the read current flowing from the magnetoresistance effect element 10, as described above, is led to the second write bit line WBLB. On the other hand, in the memory cell MS7 that is in the monitoring state, in a case in which the L voltage is applied to the first write bit line WBL, the voltage applied to the second write bit line WBLB is not the voltage Vsink but the H voltage. Then, the read current flowing from the magnetoresistance effect element 10 is led to not the second write bit line WBLB but the first write bit line WBL.

In the memory cell MS7 that is in the monitoring state, the H voltage is applied to the selection line RSEL. For this reason, in the memory cell MS7, the state of the third field effect transistor M3 is the on state. In addition, in the memory cell MS7, the H voltage is applied to the write enable line WEN. For this reason, in the memory cell MS7, the state of the second field effect transistor M2 is the on state. As a result, in the memory cell MS7, the resistance value of the magnetoresistance effect element 10 changes. In addition, in the memory cell MS7, a clock signal is input to the clock line CLK from the outside. For this reason, in the memory cell MS7, a drain current of a magnitude determined in advance flows from the drain terminal of the first field effect transistor M1 to the magnetoresistance effect element 10. This magnitude is determined in accordance with a pulse width of the clock signal, a fall width of the amplitude of the clock signal, and the resistance value of the magnetoresistance effect element 10. In a case in which the drain current flows from the drain terminal to the magnetoresistance effect element 10, the voltage Vr is generated at the connection point P. As described above, the voltage Vr changes in accordance with the resistance value of the magnetoresistance effect element 10. In addition, the voltage Vr is output from the output end of the monitoring output line MOUT of the memory cell MS7. Thus, in the memory cell MS7, the voltage Vr changing in accordance with change in the resistance value of the magnetoresistance effect element 10 is output from the output end. This means that, also in the memory cell MS7, the process of change in the resistance value of the magnetoresistance effect element 10 can be monitored from the outside.

Similar to the case of the memory cell MS, it cannot be realized for the memory cell MS7 to be able to perform two operations including the wiring operation and the reading operation in parallel in a conventional memory cell including a magnetoresistance effect element of a two-terminal type (for example, a magnetoresistance effect element of a spin transfer type or the like). The reason for this is that, in the memory cell, a path in which a current flows to the magnetoresistance effect element in a case in which storage data is written into the magnetoresistance effect element and a path in which a current flows to the magnetoresistance effect element in a case in which storage data is read from the magnetoresistance effect element are the same.

In a case in which the magnetoresistance effect element 10 included in the memory cell MS7 is a magnetoresistance effect element of the spin orbital torque type (SOT type) as illustrated in FIG. 1, such a memory cell MS7 stores one-bit data indicating "0" or "1" as storage data in accordance with the resistance value of the magnetoresistance effect element 10. The reason for this is that the resistance value of the magnetoresistance effect element of the spin orbital torque type may easily change discretely. In this case, the voltage Vr output from the output end of the monitoring output line MOUT changes discretely (in a digital manner).

On the other hand, in a case in which the magnetoresistance effect element 10 included in the memory cell MS7 is the magnetoresistance effect element of the domain wall movement type as illustrated in FIG. 21, the memory cell MS7 can store analog data representing a value equal to or larger than 0 and equal to or smaller than 1 as storage data in accordance with the resistance value of the magnetoresistance effect element 10. The reason for this is that the resistance value of the magnetoresistance effect element of the domain wall movement type may be easily changed continuously. In this case, the voltage Vr output from the output end of the monitoring output line MOUT changes continuously (in an analog manner).

Such a memory cell MS7 may be included in a memory device like the memory cell MS included in the non-volatile associative memory device 1. In such a case, the memory device including the memory cell MS7 is not a non-volatile associative memory device but a non-volatile memory device. Hereinafter, for the convenience of description, a non-volatile memory device including the memory cell MS7 will be referred to as a non-volatile memory device 1A in description.

The non-volatile memory device 1A has a configuration that is almost the same as that of the non-volatile associative memory device 1. Thus, hereinafter, a case in which the non-volatile memory device 1A includes m first memory cell groups 104, a first control unit 101, a second control unit 102, and a third control unit 103 will be described as an example. In this case, each of the m first memory cell groups 104 includes n second memory cell groups 200. In this case, the n second memory cell groups 200 include a plurality of memory cells MS7. For this reason, in the non-volatile memory device 1A, a plurality of memory cells MS7 are aligned in a lattice pattern.

The number of memory cells MS7 included in each of the n second memory cell groups 200 of the non-volatile memory device 1A is, for example, 8. One memory cell MS7 can store storage data of one or more bits corresponding to the type of the magnetoresistance effect element 10 included in the memory cell MS7. In other words, in a case in which the number is 8, one second memory cell group 200 can store storage data corresponding to one or more bytes. A method for aligning a plurality of memory cells MS7 in the non-volatile memory device 1A may be the same as the method for aligning a plurality of memory cells MS in the non-volatile associative memory device 1 or may be a method different from the method for aligning a plurality of memory cells MS in the non-volatile associative memory device 1. Hereinafter, a case in which the method for aligning a plurality of memory cells MS7 in the non-volatile memory device 1A is the same as the method for aligning a plurality of memory cells MS in the non-volatile associative memory device 1 will be described as an example.

The memory cell MS7 includes the selection line RSEL without including the first search line SL and the second search line SLB, and thus the first control unit 101 included in the non-volatile memory device 1A is connected to the selection line RSEL of each memory cell MS7. In order to select some memory cells MS7 among the plurality of memory cells MS7, the first control unit 101 applies the H voltage to the selection lines RSEL of one or more memory cells MS7 that are selection targets. In this way, the first control unit 101 can validate operations of the one or more memory cells MS7 and invalidate operations of memory cells MS7 other than the one or more memory cells MS7 among the plurality of memory cells MS7. As a result, the non-volatile memory device 1A can cause each of the writing operation and the reading operation to be performed on the desired memory cells MS7.

The second control unit 102 included in the non-volatile memory device 1A includes a row decoder of an address, a CLK control unit that performs pre-charging of the clock line CLK with the H voltage and input of a clock signal, and a WEN control unit that performs pre-charging of the write enable line WEN with the L voltage and input of a write signal without including the p-ML control unit and the n-ML control unit. The CLK control unit and the WEN control unit included in the second control unit 102 may be realized using any method. For this reason, detailed description of such two control units will be omitted.

For example, output ends of the clock line CLK and the write enable line WEN included in each memory cell MS7 of the non-volatile memory device 1A are grounded.

An output end of the monitoring output line MOUT included in each memory cell MS7 of the non-volatile memory device 1A is connected to the third control unit 103.

The third control unit 103 includes a match line sensing control unit that detects an output voltage of the monitoring output line MOUT (in other words, the voltage Vr) included in each memory cell MS and an output driver. For each memory cell MS7 included in the non-volatile associative memory device 1, the output driver outputs a signal indicating a detection result of an output voltage from the monitoring output line MOUT included in the memory cell MS7 to another circuit, another device, and the like.

In addition, in a case in which monitoring of the process of change of the magnetoresistance effect element 10 from the outside is performed by the non-volatile memory device 1A, for example, similar to the non-volatile associative memory device 1 illustrated in FIG. 22, the non-volatile memory device 1A further includes a monitoring control unit 105.

The monitoring control unit 105 included in the non-volatile memory device 1A detects a voltage Vr output from an output end of the monitoring output line MOUT in accordance with the resistance value of each magnetoresistance effect element 10. In detection of the voltage Vr, it is preferable that the voltage Vr be amplified. This is for preventing change in the voltage Vr output from the output end from being buried in change according to noises.

Figure 25:
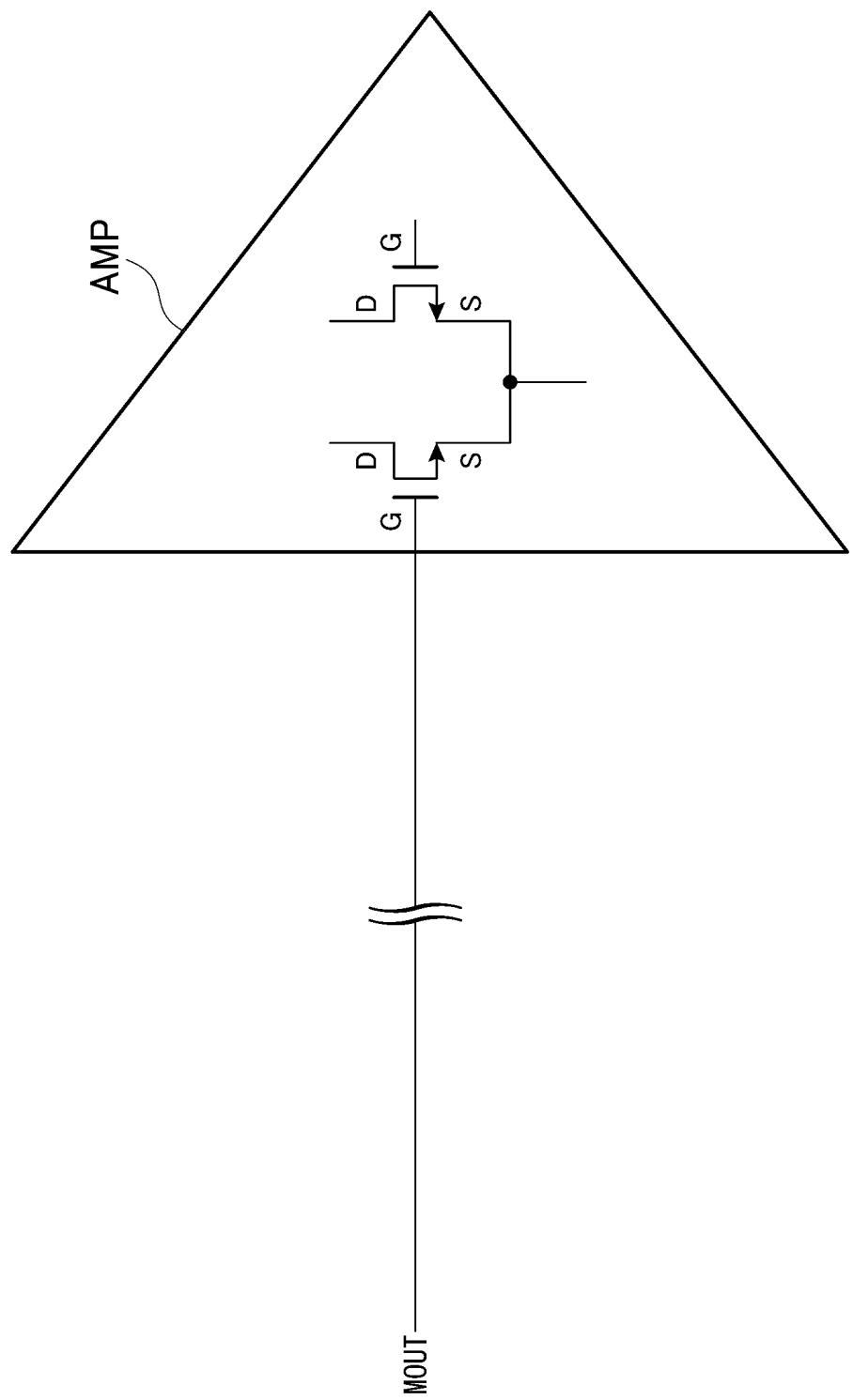
FIG. 25 is a diagram illustrating an example of an analog operational amplifier AMP connected to the output end of the monitoring output line MOUT.

It is preferable that such amplification be performed, for example, using an analog operational amplifier AMP illustrated in FIG. 25. FIG. 25 is a diagram illustrating an example of an analog operational amplifier AMP connected to the output end of the monitoring output line MOUT. The analog operational amplifier AMP illustrated in FIG. 25 is an analog operational amplifier using an N-MOS field effect transistor. In accordance with this, even in a case in which the voltage Vr output from the output end of the monitoring output line MOUT changes discretely or continuously, the change can be detected with high accuracy. In FIG. 25, for simplification of the drawing, illustration of a circuit, a device, and the like that acquire a signal output from the analog operational amplifier AMP is omitted. In addition, the monitoring control unit 105 included in the non-volatile memory device 1A may be configured to include another circuit and the like that can amplify the voltage Vr output from the output end of the monitoring output line MOUT in accordance with a resistance value of each magnetoresistance effect element 10 in place of the analog operational amplifier AMP.

Here, the flow of a method for monitoring the process of change in the resistance value of each magnetoresistance effect element 10 included in the non-volatile memory device 1A is slightly different from the flow of the flowchart illustrated in FIG. 23. Thus, hereinafter, the flow of the method for monitoring the process of change in the resistance value of each magnetoresistance effect element 10 included in the non-volatile memory device 1A will be described with reference to the flowchart illustrated in FIG. 23.

In Step S110, a user performing a certain operation on the non-volatile memory device 1A performs an operation, for example, using an information processing device on the monitoring control unit 105 included in the non-volatile memory device 1A and selects a memory cell MS7 including the magnetoresistance effect element 10 that is a monitoring target among a plurality of memory cells MS7 included in the non-volatile memory device 1A as a target memory cell. The information processing device is an information processing device that is connected to the first control unit 101, the second control unit 102, the third control unit 103, and the monitoring control unit 105 included in the non-volatile memory device 1A. In other words, in Step S110, a user transitions the state of the monitoring control unit 105 to a state in which the voltage Vr output from the output end of the monitoring output line MOUT included in the target memory cell can be acquired from the third control unit 103. Hereinafter, for the convenience of description, a user performing a certain operation on the non-volatile memory device 1A will be simply referred to as a user in description.

In Step S120, the user performs an operation using the information processing device on the first control unit 101 and the second control unit 102 and transitions the state of the target memory cell to the monitoring state.

In Step S130, the user performs an operation using the information processing device on the monitoring control unit 105 included in the non-volatile memory device 1A, and, for example, the monitoring control unit 105 causes a display unit of the information processing device to start to display a graph representing a change of the voltage Vr, which is acquired from the third control unit 103 included in the non-volatile memory device 1A, with respect to time. In accordance with this, the user starts to monitor the process of change in the voltage Vr output from the output end of the monitoring output line MOUT included in the target memory cell, in other words, the process of change in the resistance value of the magnetoresistance effect element 10 included in the target memory cell. In addition, almost simultaneously with Step S130, the resistance value of the target memory cell starts to change in Step S140.

In Step S150, the user checks the graph displayed in the display unit of the information processing device and waits until writing of the storage data into the magnetoresistance effect element 10 included in the target memory cell is completed, in other words, until change in the resistance value of the magnetoresistance effect element 10 ends.

In a case in which it is determined that the change in the resistance value of the magnetoresistance effect element 10 has ended (Step S150: Yes), in Step S160, the user performs an operation using the information processing device on the monitoring control unit 105 included in the non-volatile memory device 1A, for example, stops detection of the voltage Vr using the monitoring control unit 105, and ends the monitoring of the process of change in the resistance value of the magnetoresistance effect element 10 included in the target memory cell.

In addition, a configuration in which the user performs the method having the flow of Steps S110 to S160 for some or all of the plurality of memory cells MS7, which are included in the non-volatile memory device 1A, in parallel may be employed.

In this way, the user can perform monitoring of the process of change in the resistance value of the magnetoresistance effect element 10 included in each memory cell MS7 included in the non-volatile memory device 1A.

The voltage Vr output from the output end of the monitoring output line MOUT of the memory cell MS7 selected as a target memory cell among the memory cells MS7 is detected by the non-volatile memory device 1A, and thus, an analog signal can be easily added to this monitoring output line MOUT. The non-volatile associative memory device 1 does not have such features. Based on such situations, in the non-volatile memory device 1A, a magnetoresistance effect element of the domain wall movement type can be easily used as the magnetoresistance effect element 10 of each memory cell MS7. The reason for this is that there is one output place of the voltage applied to the monitoring output line MOUT, and thus it is difficult for change in the analog signal to be buried in changes according to noises.

Here, the voltage Vr output from the output end of the monitoring output line MOUT is determined by a product of the magnitude of a drain current flowing from the drain terminal of the first field effect transistor M1 to the magnetoresistance effect element 10 and the resistance value of the magnetoresistance effect element 10. Hereinafter, the reason the voltage Vr is determined by a product of the magnitude of the drain current flowing from the drain terminal of the first field effect transistor M1 to the magnetoresistance effect element 10 and the resistance value of the magnetoresistance effect element 10 will be described with reference to FIGS. 26 and 27.

Figure 26:
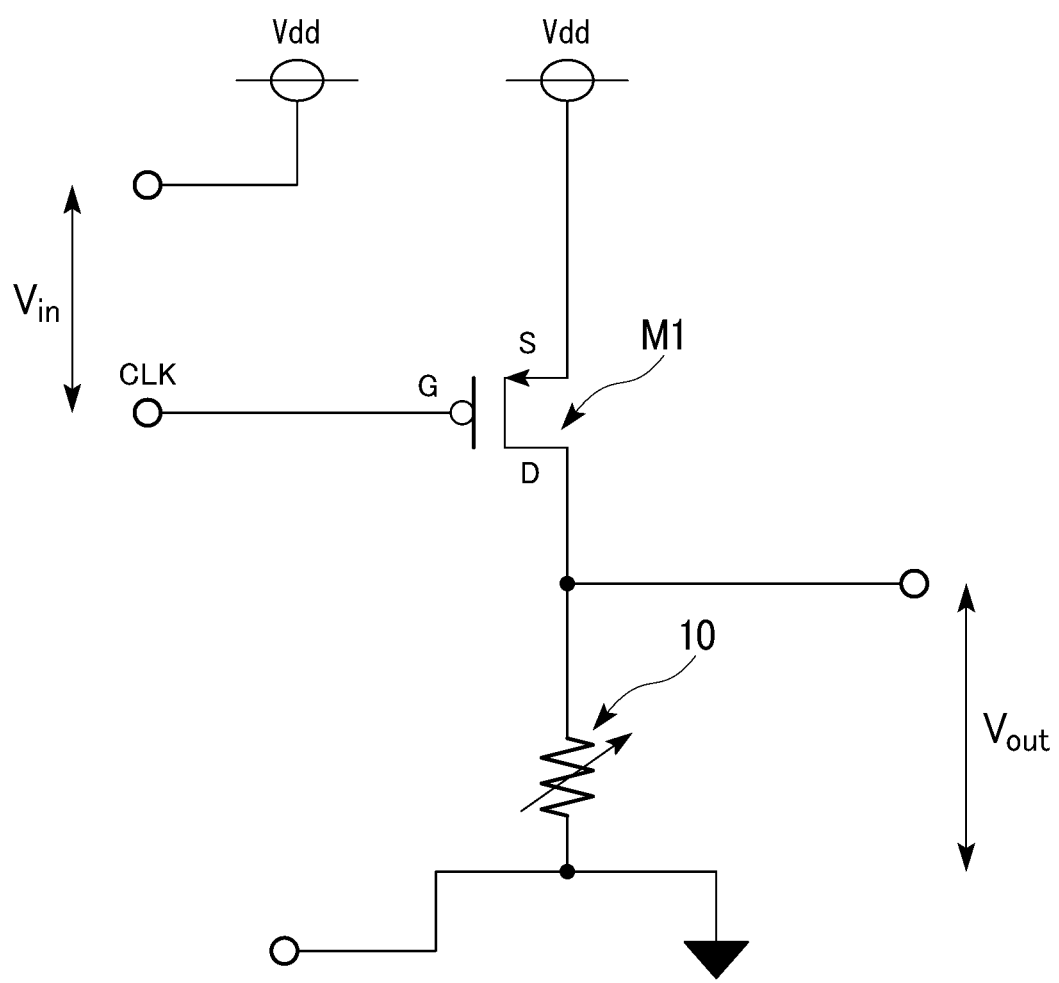
FIG. 26 is a diagram in which a circuit configuration of the vicinity of a magnetoresistance effect element 10 is extracted from the circuit configuration of a memory cell MS7 illustrated in FIG. 24.
Figure 27:
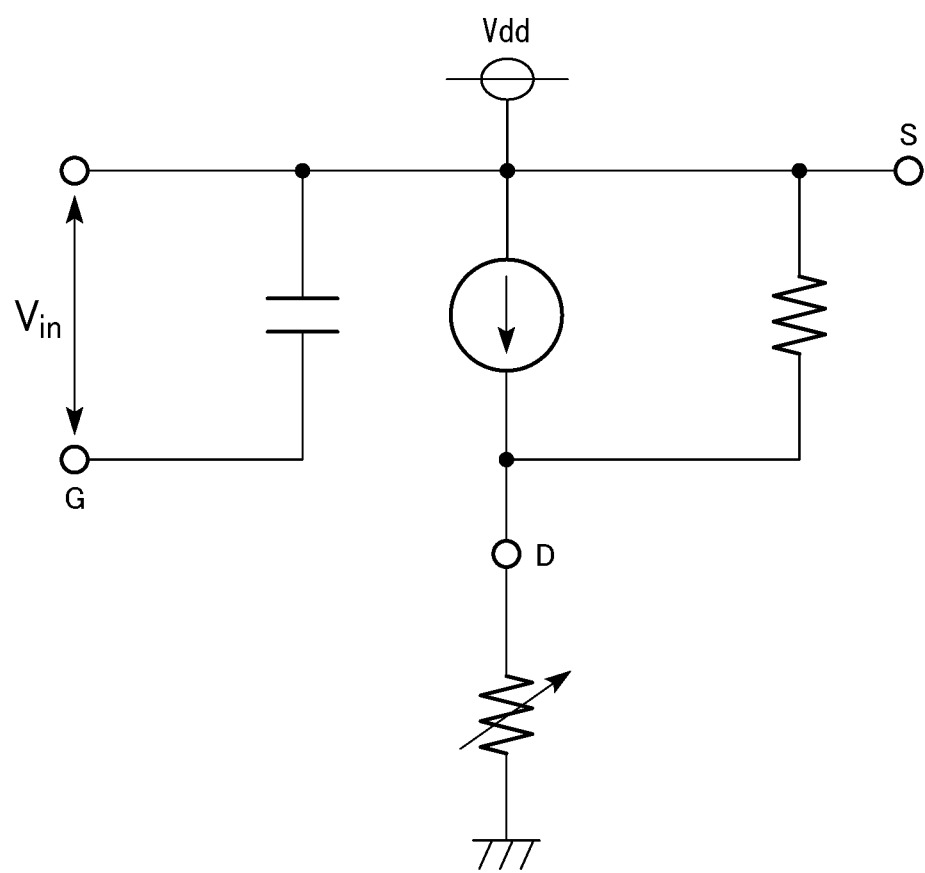
FIG. 27 is a diagram illustrating an example of an equivalent circuit of the circuit illustrated in FIG. 26.

FIG. 26 is a diagram in which a circuit configuration of the vicinity of a magnetoresistance effect element 10 is extracted from the circuit configuration of a memory cell MS7 illustrated in FIG. 24. FIG. 27 is a diagram illustrating an example of an equivalent circuit of the circuit illustrated in FIG. 26.

As illustrated in FIG. 26, in the memory cell MS7, a periodical voltage drop is input to a clock line CLK from a power supply voltage Vdd as a clock signal. In accordance with this, a drain current flows from a drain terminal of the first field effect transistor M1 to the magnetoresistance effect element 10. In a case in which the width of the periodical voltage drop of the clock signal is a maximum width that can be taken, that is, a width from the H voltage to the ground electric potential, the magnitude of this drain current is a magnitude of a degree reaching a saturation region. In FIGS. 26 and 27, a clock signal input to the clock line CLK is denoted by Vin. In a case in which the clock signal does not change, and the resistance value of the magnetoresistance effect element 10 does not change, the magnitude of the drain current does not change when changes according to noises are excluded. From such a reason, as illustrated in FIG. 27, the drain terminal can be regarded as a constant current source. In a case in which the magnitude of the drain current is constant, the voltage Vr generated at the connection point P is determined based on the magnitude of the on resistance of the first field effect transistor M1, the resistance value of the magnetoresistance effect element 10, and the magnitude of the drain current. However, the magnitude of the on resistance of the first field effect transistor M1 is small to the degree that can be ignored relative to the resistance value of the magnetoresistance effect element 10. For this reason, approximately, the voltage Vr is determined by a product of the resistance value of the magnetoresistance effect element 10 and the magnitude of the drain current. From such situations, the voltage Vr can be handled as a value that represents the resistance value of the magnetoresistance effect element 10 in the memory cell MS7.

In the memory cell MS7 described above, it is preferable that the H voltage applied to each of the first write bit line WBL and the second write bit line WBLB (hereinafter, referred to as a write H voltage in description) be lower than any of the H voltage applied to the selection line RSEL, the H voltage applied to the write enable line WEN, the H voltage generated at the connection point P, and the power supply voltage Vdd. The reason for this is that the first member 11 of the magnetoresistance effect element 10 may be burned and broken in a writing operation in the memory cell MS7. For example, in the memory cell MS7, each of the H voltage applied to the selection line RSEL, the H voltage applied to the write enable line WEN, the H voltage generated at the connection point P, and the power supply voltage Vdd is about 3.3 V. In this case, it is preferable that the write H voltage be equal to or lower than 1.5 V. However, in a case in which the first member 11 of the magnetoresistance effect element 10 can be inhibited from being burned and broken by including a resistance element at at least one of two ends of the first member 11 of the magnetoresistance effect element 10 or the like, the write H voltage may be about 3.3 V. Here, when implementation of the memory cell MS7 into an integrated circuit is considered, it is preferable that the resistance element is small. Also from such a reason, it is preferable that the resistance element be configured by a magnetoresistance effect element as well. In addition, the method for inhibiting the first member 11 from being burned and broken may be any other method instead of the method of including the resistance element in the memory cell MS7.

In the memory cell MS7, the influence according to a voltage applied between both ends of the first member 11 in a writing operation is inhibited from having influence on the voltage Vr at the connection point P. The reason for this is that the voltage applied to both ends of the first member 11 is lower than the voltage generated at the connection point P. One method for realizing this is a method in which the write H voltage is configured to be a voltage lower than the H voltage. In addition, the method for inhibiting an influence according to the voltage applied to both ends of the first member 11 in a writing operation from having influence on the voltage Vr at the connection point P, for example, may be any other method such as a method in which the resistance value of the first member 11 is configured to be smaller than the resistance value of the magnetoresistance effect element 10 by two digits or more.

As above, according to an embodiment, there is provided a non-volatile associative memory cell (in the example described above, each of the memory cell MS and the memory cell MS2 to the memory cell MS6) including: one magnetoresistance effect element (in the example described above, the magnetoresistance effect element 10, the magnetoresistance effect element 10-1, the magnetoresistance effect element 10-2, and the magnetoresistance effect element 10-A to the magnetoresistance effect element 10-C) including a first ferromagnetic layer (in the example described above, the first ferromagnetic layer 12A) configured for a direction of internal magnetization (in the example described above, the magnetization M12A) to change, a second ferromagnetic layer (in the example described above, the second ferromagnetic layer 12C) in which a direction of internal magnetization (in the example described above, the magnetization M12C) does not change, and a non-magnetic layer (in the example described above, the non-magnetic layer 12B); a first match line (in the example described above, the first match line p-ML) electrically connected to the magnetoresistance effect element in accordance with a predetermined first search line voltage (in the example described above, the sixth H voltage, that is, the H voltage); and a second match line (in the example described above, the second match line n-ML) electrically connected to the magnetoresistance effect element in accordance with a predetermined second search line voltage (in the example described above, the sixth L voltage, that is, the L voltage), in which the magnetoresistance effect element includes: a first member (in the example described above, the first member 11); and a second member (in the example described above, the second member 12) of which at least a part is stacked in a first direction (in the example described above, the positive direction of the Z axis) with respect to the first member, the first member includes a first electrode (in the example described above, the first electrode 13) disposed at one of two ends of the first member in a second direction (in the example described above, the positive direction of the X axis) that is orthogonal to the first direction and a second electrode (in the example described above, the second electrode 14) disposed at an other of the two ends of the first member in the second direction, the first ferromagnetic layer is provided in the first member or the second member, the non-magnetic layer is stacked in the first direction, and the direction of the internal magnetization of the first ferromagnetic layer changes in a case in which a current flows between the first electrode and the second electrode in the first member, the non-magnetic layer and the second ferromagnetic layer stacked in the first direction with respect to the non-magnetic layer are provided in the second member, a resistance value of the magnetoresistance effect element is a magnitude of the electrical resistance between the second ferromagnetic layer and the second electrode and changes in accordance with a change in a relative angle between the direction of the internal magnetization of the first ferromagnetic layer and the direction of the internal magnetization of the second ferromagnetic layer, and the first match line and the second match line are connected to the second ferromagnetic layer. In other words, according to an embodiment, there is provided a non-volatile associative memory cell (in the example described above, each of the memory cell MS and the memory cell MS2 to the memory cell MS6) including: one magnetoresistance effect element (in the example described above, the magnetoresistance effect element 10, the magnetoresistance effect element 10-1, the magnetoresistance effect element 10-2, and the magnetoresistance effect element 10-A to the magnetoresistance effect element 10-C) including a first ferromagnetic layer (in the example described above, the first ferromagnetic layer 12A) in which a direction of internal magnetization (in the example described above, the magnetization M12A) changes, a second ferromagnetic layer (in the example described above, the second ferromagnetic layer 12C) in which a direction of internal magnetization (in the example described above, the magnetization M12C) does not change, and a non-magnetic layer (in the example described above, the non-magnetic layer 12B); a first match line (in the example described above, the first match line p-ML) electrically connected to the magnetoresistance effect element in accordance with a predetermined first search line voltage (in the example described above, the sixth H voltage, that is, the H voltage); and a second match line (in the example described above, the second match line n-ML) electrically connected to the magnetoresistance effect element in accordance with a predetermined second search line voltage (in the example described above, the sixth L voltage, that is, the L voltage), in which the magnetoresistance effect element includes: a first member (in the example described above, the first member 11); and a second member (in the example described above, the second member 12) of which at least a part is stacked in a first direction (in the example described above, the positive direction of the Z axis) with respect to the first member, the first member includes a first electrode (in the example described above, the first electrode 13) disposed at one of two ends of the first member in a second direction (in the example described above, the positive direction of the X axis) that is orthogonal to the first direction and a second electrode (in the example described above, the second electrode 14) disposed at the other of the two ends of the first member in the second direction, the first ferromagnetic layer is included in the first member or the second member, the non-magnetic layer is stacked in the first direction, and the direction of the internal magnetization of the first ferromagnetic layer changes in a case in which a current flows between the first electrode and the second electrode in the first member, the second member includes a non-magnetic layer and a second ferromagnetic layer stacked in the first direction with respect to the non-magnetic layer, a resistance value of the magnetoresistance effect element changes in accordance with change in a relative angle between the direction of the internal magnetization of the first ferromagnetic layer and the direction of the internal magnetization of the second ferromagnetic layer, and an electric potential corresponding to the electric potential of the second ferromagnetic layer is applied to each of the first match line and the second match line. In accordance with this, the non-volatile associative memory cell can inhibit the life of the magnetoresistance effect element from being shortened.

In addition, in the non-volatile associative memory cell, a configuration in which the magnetoresistance effect element is an element of a spin orbital torque type, and the second member includes the first ferromagnetic layer may be used.

Furthermore, in the non-volatile associative memory cell, a configuration in which the first member includes a heavy metal layer (in the example described above, the heavy metal layer 11C), a first light metal layer (in the example described above, the first light metal layer 11A), and a second light metal layer (in the example described above, the second light metal layer 11B), at least a part of the heavy metal layer, the first light metal layer, and the second light metal layer are stacked in order of the first light metal layer, at least a part of the heavy metal layer, and the second light metal layer in the second direction, the first light metal layer is connected to the first electrode, the second light metal layer is connected to the second electrode and is made of a same material as material of the first light metal layer, the heavy metal layer contains a heavy metal and is disposed at an end on a side in a direction opposite to the first direction among ends of the first ferromagnetic layer, and a resistance value of the heavy metal layer is equal to or smaller than 200 ohms may be used.

In addition, in the non-volatile associative memory cell, a configuration in which a first write bit line (in the example described above, the first write bit line WBL) to which one of a third voltage (in the example described above, the L voltage) and a fourth voltage (in the example described above, the H voltage) higher than the third voltage is applied, a second write bit line (in the example described above, the second write bit line WBLB) to which the other voltage among the third voltage and the fourth voltage that is not applied to the first write bit line is applied, a first field effect transistor (in the example described above, the first field effect transistor M1) performing switching between the second ferromagnetic layer and a power supply applying a predetermined power supply voltage (in the example described above, the power supply voltage Vdd) to the second ferromagnetic layer, a second field effect transistor (in the example described above, the second field effect transistor M2) performing switching between the first electrode and the first write bit line, a third field effect transistor (in the example described above, the third field effect transistor M3) performing switching between the second ferromagnetic layer and the first match line, and a fourth transistor (the fourth field effect transistor M4) performing switching between the second ferromagnetic layer and the second match line are further included, in which the second electrode is connected to the second write bit line may be used.

Furthermore, according to an embodiment, there is provided a non-volatile associative memory device (in the example described above, the non-volatile associative memory device 1 and the non-volatile associative memory device 1X) including a plurality of memory cell groups, in which the memory cell group includes a first predetermined number of (in the example described above, eight) the memory cells described above and includes a second memory cell in which data indicating "X" is stored, and the memory cell stores one-bit data indicating "0" or "1" in accordance with the resistance value of the magnetoresistance effect element.

In addition, according to an embodiment, there is provided a non-volatile memory cell (in the example described above, the memory cell MS7) including: a magnetoresistance effect element of a three terminal type (in the example described above, the magnetoresistance effect element 10 included in the memory cell MS7) including a first electrode (in the example described above, the second ferromagnetic layer 12C of the magnetoresistance effect element 10 included in the memory cell MS7), a second electrode (in the example described above, the first electrode 13 of the magnetoresistance effect element 10 included in the memory cell MS7), and a third electrode (in the example described above, the second electrode 14 of the magnetoresistance effect element 10 included in the memory cell MS7); and a monitoring output line (in the example described above, the monitoring output line MOUT) electrically connected to the first electrode of the magnetoresistance effect element in accordance with a predetermined selection line voltage (in the example described above, a voltage applied to the selection line RSEL included in the memory cell MS7), in which a resistance value of the magnetoresistance effect element changes in a case in which a current flows between the second electrode and the third electrode, and a voltage of a magnitude determined in advance (in the example described above, the power supply voltage Vdd) in accordance with a clock line voltage (in the example described above, a voltage applied to the clock line CLK included in the memory cell MS7) is applied to the first electrode. In accordance with this, the non-volatile memory cell can perform monitoring of the process of change in the resistance value of the magnetoresistance effect element from the outside.

In addition, in the non-volatile memory cell, a configuration in which the magnetoresistance effect element is a magnetoresistance effect element of a domain wall movement type may be used.

Furthermore, in the non-volatile memory cell, a configuration in which an output end of the monitoring output line is connected to an amplification unit (in the example described above, the analog operational amplifier AMP) that amplifies a voltage applied to the monitoring output line may be used.

In addition, in the non-volatile memory cell, a configuration in which an output end of the monitoring output line is connected to an amplification unit (in the example described above, the analog operational amplifier AMP) that amplifies a voltage applied to the monitoring output line may be used.

REFERENCE SIGNS LIST 1, 1X Non-volatile associative memory device
1A First ferromagnetic layer
1C Second ferromagnetic layer
10, 10-1, 10-2, 10A, 10-A, 10-B, 10-C Magnetoresistance effect element
11, 11X First member
11A First light metal layer
11B Second light metal layer
11C Heavy metal layer
12, 12X Second member
12A First ferromagnetic layer
12B Non-magnetic layer
12C Second ferromagnetic layer
13 First electrode
14 Second electrode
31 Interchange control unit
32 Interchange control unit
41 Decoder
42 Memory
52 Interchange control unit
101 First control unit
102 Second control unit
103 Third control unit
104, 104-1, 104-2, 104-m First memory cell group
105 Monitoring control unit
110 Circuit
112, 113 Comparator
114 Inverter circuit
115 AND circuit
116 Output driver
200, 210 Second memory cell group
302 Multi-input exclusive logical sum logical circuit
B11 First magnetization fixing part
B12 Second magnetization fixing part
BS Second memory cell
CC Comparison calculation circuit
CLK Clock line
IV Inverter circuit
IV2 Inverter circuit
M1 First field effect transistor
M2 Second field effect transistor
M3 Third field effect transistor
M4 Fourth field effect transistor
M4R Fourth field effect transistor
M5 Fifth field effect transistor
M11, M12, M12R, M21, M22, M23 Field effect transistor
M12A, M12C Magnetization
MS, MS2, MS3, MS4, MS5, MS6 Memory cell
n-ML Second match line
p-ML First match line
PS Third memory cell
RC Reading circuit
WC Writing circuit
SA Single-end type sense amplifier
SL First search line
SLB Second search line
WBL First write bit line
WBLB Second write bit line
WEN Write enable line

The invention claimed is:
1. A non-volatile associative memory cell comprising:
one magnetoresistance effect element including a first ferromagnetic layer configured for a direction of internal magnetization to change, a second ferromagnetic layer configured for a direction of internal magnetization not to change, and a non-magnetic layer;
a first match line electrically connected to the magnetoresistance effect element in accordance with a predetermined first search line voltage; and
a second match line electrically connected to the magnetoresistance effect element in accordance with a predetermined second search line voltage,
wherein the magnetoresistance effect element includes:
a first member; and
a second member of which at least a part is stacked in a first direction with respect to the first member,
wherein the first member includes a first electrode disposed at one of two ends of the first member in a second direction that is orthogonal to the first direction and a second electrode disposed at an other of the two ends of the first member in the second direction,
wherein the first ferromagnetic layer is provided in the first member or the second member, the non-magnetic layer is stacked in the first direction, and the direction of internal magnetization of the first ferromagnetic layer changes in a case in which a current flows between the first electrode and the second electrode in the first member,
wherein the non-magnetic layer and the second ferromagnetic layer stacked in the first direction with respect to the non-magnetic layer are provided in the second member,
wherein a resistance value of the magnetoresistance effect element changes in accordance with a change in a relative angle between the direction of internal magnetization of the first ferromagnetic layer and the direction of internal magnetization of the second ferromagnetic layer, and
wherein an electric potential corresponding to an electric potential of the second ferromagnetic layer is applied to each of the first match line and the second match line.

2. The non-volatile associative memory cell according to claim 1,
wherein the magnetoresistance effect element is an element of a spin orbital torque type, and
wherein the second member includes the first ferromagnetic layer.

3. The non-volatile associative memory cell according to claim 2,
wherein the first member includes a heavy metal layer, a first light metal layer, and a second light metal layer,
wherein at least a part of the heavy metal layer, the first light metal layer, and the second light metal layer are stacked in order of the first light metal layer, at least a part of the heavy metal layer, and the second light metal layer in the second direction,
wherein the first light metal layer is connected to the first electrode,
wherein the second light metal layer is connected to the second electrode and is made of a same material as material of the first light metal layer,
wherein the heavy metal layer contains a heavy metal and is disposed at an end on a side in a direction opposite to the first direction among ends of the first ferromagnetic layer, and
wherein a resistance value of the heavy metal layer is equal to or smaller than 200 ohms.

4. The non-volatile associative memory cell according to claim 1, further comprising:
a first write bit line to which one of a third voltage and a fourth voltage higher than the third voltage is applied;
a second write bit line to which the other voltage among the third voltage and the fourth voltage, that is not applied to the first write bit line is applied;
a first field effect transistor performing switching between the second ferromagnetic layer and a power supply applying a predetermined power supply voltage to the second ferromagnetic layer;
a second field effect transistor performing switching between the first electrode and the first write bit line;
a third field effect transistor performing switching between the second ferromagnetic layer and the first match line; and
a fourth field effect transistor performing switching between the second ferromagnetic layer and the second match line,
wherein the second electrode is connected to the second write bit line.

5. A non-volatile associative memory device comprising a plurality of memory cell groups,
wherein the memory cell group includes a first predetermined number of memory cells according to claim 1 and includes a second memory cell in which data indicating "X" is stored, and
wherein the memory cell stores one-bit data indicating "0" or "1" in accordance with the resistance value of the magnetoresistance effect element.

6. A monitoring method comprising:
a first step of changing a resistance value of the magnetoresistance effect element by causing a current to flow between the first electrode and the second electrode in the first member included in the memory cell according to claim 1; and
a second step of detecting a voltage output from each of an output end of the first match line and an output end of the second match line in a first period including a period in which the resistance value of the magnetoresistance effect element changes in accordance with the first step and monitoring a process of change in the resistance value of the magnetoresistance effect element in the first period.

7. A non-volatile memory cell comprising:
a magnetoresistance effect element of a three terminal type including a first electrode, a second electrode, and a third electrode; and
a monitoring output line electrically connected to the first electrode of the magnetoresistance effect element in accordance with a predetermined selection line voltage,
wherein a resistance value of the magnetoresistance effect element changes in a case in which a current flows between the second electrode and the third electrode, and
wherein a voltage of a magnitude determined in advance in accordance with a clock line voltage is applied to the first electrode.

8. The non-volatile memory cell according to claim 7, wherein the magnetoresistance effect element is a magnetoresistance effect element of a domain wall movement type.

9. The non-volatile memory cell according to claim 7, wherein an output end of the monitoring output line is connected to an amplification unit that amplifies a voltage applied to the monitoring output line.

10. A monitoring method comprising:
a first step of changing a resistance value of the magnetoresistance effect element by causing a current to flow between the second electrode and the third electrode in the magnetoresistance effect element included in the non-volatile memory cell according to claim 7; and a second step of detecting a voltage output from an output end of the monitoring output line in a first period including a period in which the resistance value of the magnetoresistance effect element changes in accordance with the first step and monitoring a process of change in the resistance value of the magnetoresistance effect element in the first period.

\* \* \* \* \*